(12) United States Patent
Iwagami et al.

(10) Patent No.: US 9,234,941 B2
(45) Date of Patent: Jan. 12, 2016

(54) ELECTRONIC CONTROL UNIT HAVING INTEGRATED CIRCUIT ELEMENT AND STANDALONE TEST UNIT FOR INTEGRATED CIRCUIT ELEMENT

(71) Applicant: Mitsubishi Electric Corporation, Chiyoda-ku, Tokyo (JP)

(72) Inventors: Yuki Iwagami, Tokyo (JP); Susumu Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 107 days.

(21) Appl. No.: 14/242,314

(22) Filed: Apr. 1, 2014

(65) Prior Publication Data

US 2014/0365839 A1 Dec. 11, 2014

(30) Foreign Application Priority Data

Jun. 10, 2013 (JP) .................. 2013-121439

(51) Int. Cl.
*G01R 31/28* (2006.01)
*G01R 31/3185* (2006.01)
*G01R 31/317* (2006.01)

(52) U.S. Cl.
CPC .. *G01R 31/318544* (2013.01); *G01R 31/31724* (2013.01); *G01R 31/318555* (2013.01)

(58) Field of Classification Search
CPC ................. G01R 31/31724; G01R 31/318544; G01R 31/318555
USPC ....................................................... 714/733
See application file for complete search history.

(56) References Cited

U.S. PATENT DOCUMENTS

| 6,401,226 | B1 | 6/2002 | Maeno | |
|---|---|---|---|---|
| 8,549,368 | B1* | 10/2013 | Deogharia | ............... G06F 11/27 714/30 |
| 2003/0005379 | A1* | 1/2003 | Slawecki | ....... G01R 31/318566 714/726 |
| 2004/0246337 | A1* | 12/2004 | Hasegawa | ...... G01R 31/318536 348/189 |
| 2005/0193293 | A1* | 9/2005 | Shikata | ................ G11C 29/028 714/718 |
| 2009/0030587 | A1 | 1/2009 | Yonezawa et al. | |
| 2012/0226953 | A1 | 9/2012 | Nakazato et al. | |

FOREIGN PATENT DOCUMENTS

| JP | 2000-266815 A | 9/2000 |
|---|---|---|
| JP | 2009-30543 A | 2/2009 |
| JP | 2012-181138 A | 9/2012 |

OTHER PUBLICATIONS

"Scan Test" Electronic Design Automation (EDA) Technical Committee of Japan Electronics and Information Technology Industries Association, online EDA Glossary (revised edition), Nikkei Business Publications, Jan. 13, 2009, 8 pgs.

* cited by examiner

*Primary Examiner* — David Ton
(74) *Attorney, Agent, or Firm* — Sughrue Mion, PLLC; Richard C. Turner

(57) ABSTRACT

There is provided a low-cost electronic control unit that is capable of performing its hardware check every start and stop of the electronic control unit. A monitoring and control circuit section that is an integrated circuit element built in the electronic control unit includes a self-test circuit configured with a built-in self-test control block, scan chain circuits and mask circuitry, and performs a self-test using the built-in self-test control block and a partial combination of the scan chain circuits at start of the operation. In the shipment inspection of the integrated circuit element alone, an external test is performed by a checker microprocessor using an entire combination of the scan chain circuits. Thus, the electronic control unit of low-cost configuration is capable of performing a scan test by making use of part of the scan chain circuits designed for the component inspection.

10 Claims, 18 Drawing Sheets

ELECTRONIC CONTROL UNIT HAVING INTEGRATED CIRCUIT ELEMENT AND STANDALONE TEST UNIT FOR INTEGRATED CIRCUIT ELEMENT

BACKGROUND OF THE INVENTION

1. Technical Field

The present invention relates to an electronic control unit that has an integrated circuit element and is mounted in, for example, a vehicle, and relates to a component test unit that performs in the product shipment stage a rationalized anomaly check associating mutually an anomaly check for the electronic control unit in actual operation with a component anomaly check for the integrated circuit element built in the electronic control unit.

2. Description of the Related Art

In an electronic control unit mounted in, for example, a vehicle that includes an input interface circuit connected to input sensors; an output interface circuit connected to electric loads; and at least one integrated circuit element connected with the input interface circuit and the output interface circuit, the electronic control unit performs during operation a check on connection states of wirings to the input sensors and the electric loads connected externally, and performs an anomaly check whether there is an error in the control constants and the control program stored in the internal RAM memory and the program memory, whereby reliability of the control unit is enhanced. According to, for example, Japanese Patent Application Laid-Open No. 2009-030543A "IN-VEHICLE ENGINE CONTROL DEVICE", a microprocessor that constitutes a first integrated circuit element includes, as a start-up inspection means, an interruption check means for the major external wirings; a read/write check means for the RAM memory; and a code check means for the program memory, and includes, as an regular inspection means inspecting during operation, a code check means for a program-memory block whose number n is successively incremented; and an invert logic verification means for the RAM memory. Moreover, a monitoring and control circuit section that is a second integrated circuit element used concurrently with the first integrated circuit element monitors the operational state of the microprocessor by periodically sending questionnaire information to the microprocessor being in operation, to determine whether answer information obtained from the microprocessor agrees with corresponding correct information, and initializes and reboots the microprocessor when detecting an error. (See FIG. 1, paragraphs [0015] and [0017]; FIG. 2, paragraph [0021]; and FIG. 3, paragraphs [0030] and [0031].)

According to Japanese Patent Application Laid-Open No. 2012-181138A "SEMICONDUCTOR INTEGRATED CIRCUIT, DESIGN DEVICE AND DESIGN METHOD", on the other hand, a scan test method is applied to a test for the integrated semiconductor circuit, in which a scan chain circuit is configured by connecting serially a plurality of flip-flops in the integrated circuit, and an internal signal indicating a result obtained by inputting a test pattern to the integrated circuit and operating it is transferred through the scan chain circuit and is output externally. Scan test methods are categorized into an external scan test method (external test method) and a compressed scan test method (compressed test method, internal test method, or self-test method). In an external scan test method, a test data is scanned in from a test device provided externally of the integrated semiconductor circuit element, and a scan-out signal obtained is analyzed and evaluated by the test device. In a compressed scan test method, a scan-in data is generated by a pseudorandom number generator in the integrated semiconductor circuit, and a scan-out signal obtained is compressed to be analyzed and evaluated in the integrated semiconductor circuit. The patent application JP2012-181138A discloses a test method for a semiconductor integrated circuit of low-power consumption type that halts input of the clock signal to an unoperated register during operation. In the method, a design device, which is a test device, provided externally of the semiconductor integrated circuit element performs an external test using an external scan test method and the scan chain circuits are divided into a plurality of segments and a segment to which the clock signal to be fed is selected by a random number generator provided internally of the semiconductor integrated circuit element so that no overcurrent is generated during the test. (See FIG. 1, paragraph [0017]; and FIG. 3, paragraph [0028].)

In contrast to the above, Japanese Patent Application Laid-Open No. 2000-266815A "ELECTRONIC SYSTEM WITH SELF-DIAGNOSTIC FUNCTION AND SIMULATION APPARATUS FOR ELECTRONIC SYSTEM" employs a compressed scan test method that allows determination of normality or non-normality of a to-be-tested circuit without connecting it to an external test device. The patent application JP2000-266815A discloses a system that includes a random number generation means storing a pseudorandom number pattern shifted by one bit from a pseudorandom number pattern generated by a pseudorandom number generator provided in the integrated circuit element when the pseudorandom number generator serially outputs the pseudorandom number pattern, and outputting data constituting the one-bit-shifted pseudorandom number pattern to the scan pass circuit (the same meaning of "scan chain circuit") when a logic operation result of the tested circuit is parallelly input to the scan pass circuit. (See FIG. 1.)

In addition, the integrated circuit-element testing methods described in the patent applications JP2012-181138A and JP2000-266815A are explained in "SCAN TEST", Electronic Design Automation (EDA) Technical Committee of Japan Electronics and Information Technology Industries Association, online EDA Glossary (revised edition), Nikkei Business Publications, Jan. 13, 2009 (URL:http://techon.nikkeibp.co.jp/article/WORD/20090107/163744/). The scan test is performed by a series of operations of scan-in and scan-out. Turning a scan enabling signal to, for example, "H" logic level of the enabling state permits a scan-in mode, in which a diagnostic pulse-train signal is scanned-in in synchronism with the clock signal and then diagnostic information is input to each flip-flop circuit that constitutes a shift register. Then, turning the scan enabling signal to "L" logic level of the disabling state permits a capture mode, in which outputs of the combination circuits for the diagnostic information are captured into the flip-flop circuits on input of the internal clock signal in the capture mode. Turning again the scan enabling signal to "H" logic level of the enabling state permits a scan-out mode, in which the information in the shift registers is sent out as a measurement pulse-train signal in synchronism with the clock signal. The diagnostic section determines whether the combination circuit performs a normal logic operation by comparing correct pulse-train information with the measurement pulse-train signal for the diagnostic pulse-train signal input in the scan-in mode.

The vehicle-mounted engine control unit according to the patent application JP2009-030543A executes a complex functional check on various combination for the microprocessor and the monitoring and control circuit section in the integrated circuit element at start of operation or during operation, whereby reliability of the vehicle-mounted engine control unit is enhanced. However, no detail checks are made individually on the various combination circuits, with the microprocessor and the monitoring and control circuit section being halted. In particular, it is difficult to perform quickly the detail checks within a limited permissible time at start of operation; therefore such detail checks have been unachieved. The test method according to the patent application JP2012-181138A is no other than an external scan test method in actuality although the random number generator incorporated in the integrated circuit element is jointly used, and the patent application JP2000-266815A employs the compressed scan test method using the random number generator incorporated in the integrated circuit element. However, the scan pass circuit (scan chain circuit) disclosed in either application is used as a detail check means dedicated to the shipment inspection in the final process of manufacturing the integrated circuit element. Therefore, a detail check for various combination circuits cannot be performed by making use of these scan pass circuits (scan chain circuits), with the integrated circuit element assembled into the actual electronic control unit.

A first object of the present invention is to provide an electronic control unit that is composed of inexpensive integral circuit elements and is able to be checked in detail for various combinations of the integrated circuit element built in the electronic control unit within a limited time immediately after start or stop of operation. A second object of the present invention is to provide a component test unit for an integrated circuit element in which part of a scan pass circuit (hereinafter referred to as a scan chain circuit) used in a component test for the integrated circuit element can also be used as a detailed check means for the inside of the integrated circuit element when the integrated circuit element is mounted in the electronic control unit.

SUMMARY OF THE INVENTION

An electronic control unit having an integrated circuit element according to a first aspect of the present invention, comprises an input interface circuit connected to input sensors; an output interface circuit connected to electrical loads; and an integrated circuit element connected with the input interface circuit and the output interface circuit. The integrated circuit element includes a self-test circuit for performing a self-test on the integrated circuit element itself; and a selection command input terminal for selecting a combination of scan chain circuits that controls and monitors scan flip-flops. The self-test circuit configured with a built-in self-test control block for generating test pattern for the self-test; scan chain circuits each made up of a plurality of flip-flop circuits internally or additionally provided to be connected with a plurality of circuit components in the integrated circuit element and serially combined with each other; and mask circuitry arranged to connect between input circuit portions and output circuit portions of the plurality of circuit components, for disabling their input and output operations. The selection command input terminal receives a selection command signal selecting any one of a first combination of scan-chain circuits that excludes a scan chain circuit for the built-in self-test control block and a scan chain circuit outside the self-test, and a second combination of the scan chain circuits that includes all scan chain circuits.

The built-in self-test control block including a scan-pulse output circuit for feeding a first diagnostic pulse-train signal to the front stage of the first combination of scan-chain circuits; an expected-value comparison circuit for receiving a first measurement pulse-train signal response to the first diagnostic pulse-train signal and output from the last stage of the first combination of scan-chain circuits, to determine whether or not the received first measurement pulse-train signal agrees with correct pulse-train information corresponding to the first measurement pulse-train signal; and a comparison result storing memory for storing normality or non-normality of the determination result, wherein the built-in self-test control block generates an internal-scan enabling signal for enabling the first diagnostic pulse-train signal. The self-test circuit further including: a pulse input terminal for receiving a second diagnostic pulse-train signal to be input to the front stage of the second combination of scan chain circuits; a pulse output terminal for sending out a second measurement pulse-train signal response to the second diagnostic pulse-train signal; and a control input terminal for receiving an external scan enable signal enabling the second diagnostic pulse-train signal. The built-in self-test control block is enabled during a predetermined boot wait period between closure of a power switch feeding power to the integrated circuit element and start of control operation of the integrated circuit element or during a predetermined prolonged power-feed period after closure of a power switch and halt of control operation of the integrated circuit element, and executes the self-test using the first combination of scan-chain circuits. During the execution of the self-test, acquisition of some signals input from the input interface circuit and generation of some signals output to the output interface circuit are disabled by the mask circuitry, and execution of an external test for the second combination of scan chain circuits using the self-test circuit and sending out of the second diagnostic pulse-train signal are performed in a shipment inspection process for the integrated circuit element alone.

A component test unit for an integrated circuit element according to a second aspect of the present invention comprises a checker microprocessor; and an integrated circuit element detachably connectable with the a checker microprocessor and applied, as a to-be-tested integrated circuit element, to an electronic control unit that includes an input interface circuit connected to input sensors, an output interface circuit connected to electrical loads, and the integrated circuit element. The integrated circuit element includes a self-test circuit for performing a self-test on the integrated circuit element itself; and a selection command input terminal for selecting a combination of scan chain circuits that controls and monitors scan flip-flops. The self-test circuit configured with a built-in self-test control block for generating test pattern for the self-test; scan chain circuits each made up of a plurality of flip-flop circuits internally or additionally provided to be connected with a plurality of circuit components in the integrated circuit element and serially combined with each other; and mask circuitry arranged to connect between input circuit portions and output circuit portions of the plurality of circuit components, for disabling their input and output operation. The selection command input terminal receives a selection command signal selecting any one of a first combination of scan-chain circuits that excludes a scan chain circuit for the built-in self-test control block and a scan chain circuit outside the self-test, and a second combination of the scan chain circuits that includes all scan chain circuits.

Furthermore, the built-in self-test control block includes a scan-pulse output circuit for feeding a first diagnostic pulse-train signal to the front stage of the first combination of scan-chain circuits; an expected-value comparison circuit for receiving a first measurement pulse-train signal response to the first diagnostic pulse-train signal and output from the last stage of the first combination of scan-chain circuits, to determine whether or not the received first measurement pulse-train signal agrees with a correct pulse-train information corresponding to the first measurement pulse-train signal; and a comparison result storing memory for storing normality or non-normality of the determination result, wherein the built-in self-test control block generates an internal-scan enabling signal for enabling the first diagnostic pulse-train signal. The self-test circuit further including a pulse input terminal for receiving a second diagnostic pulse-train signal to be input to the front stage of the second combination of scan chain circuits; a pulse output terminal for sending out a second measurement pulse-train signal response to the second diagnostic pulse-train signal; and a control input terminal for receiving an external scan enable signal enabling the second diagnostic pulse-train signal. The selection command input terminal is set, fixedly in advance or by the selection command signal generated by the checker microprocessor, to select a mode in which all the scan chain circuits are put into the second combination of the scan chain circuits; the checker microprocessor generates the second diagnostic pulse-train signal to feed it to the integrated circuit element and then receives the second measurement pulse-train signal obtained from the integrated circuit element, to determine whether or not the received pulse-train signal agrees with corresponding second correct pulse-train information in accordance with an expected-value comparison means; and the self-test for the first combination of the scan chain circuits and feed of the first diagnostic pulse-train signal are performed in a state in which the integrated circuit element is built in the electronic control unit.

According to an electronic control unit having an integrated circuit element, of the first aspect of the present invention, the integrated circuit element includes a self-test circuit configured with a built-in self-test control block, scan chain circuits, and mask circuitry, and includes the selection command input terminal for switching to select a first combination of the scan chain circuits for, i.e., a partial combination thereof or a second combination of the scan chain circuits, i.e., the entire combination thereof. The built-in self-test control block is enabled during a boot wait period of the electronic control unit or a prolonged power-feed period after stop of operation when the integrated circuit element is mounted on the electronic control unit. A self-test is executed using the first combination of the scan chain circuits excepting at least a scan chain circuit provided in the built-in self-test control block and the mask circuitry for input and output signals. An external test for the second combination of the scan chain circuits including the entire scan chain circuits is executed in the shipment inspection process for the integrated circuit element alone. Therefore, even in the state of integrated circuit element being built in the electronic control unit, the self-test can be performed easily every start or stop of operation of the electronic control unit by making use of part of the scan chain circuits provided for the external test to be executed in the shipment inspection process for the integrated circuit element alone, thus bringing about the advantageous effect of improving reliability of the electronic control unit. Moreover, since some inputs and outputs for the input interface circuit and the output interface circuit are at least disabled during execution of the self-test, an error in the self-test can be prevented from occurring owing to state change in an input signal and an anomalous operation of some electrical loads due to an output of the self-test can also be prevented, thus bringing about the advantageous effect of performing a self-test with high accuracy and high reliability.

According to a component test unit for an integrated circuit element, of the second aspect of the present invention, the integrated circuit element includes a self-test circuit configured with a built-in self-test control block, scan chain circuits, and mask circuitry, and includes the selection command input terminal for switching to select a first combination of the scan chain circuits, i.e., a partial combination thereof or a second combination of the scan chain circuits, i.e., the entire combination thereof. When the integrated circuit is mounted on the component test unit, an external test is executed for the second combination of the scan chain circuits including the entire scan chain circuit using a second diagnostic pulse-train signal generated by a checker microprocessor, and a self-test for the first combination of the scan chain circuits is executed in the state of the integrated circuit being built in the electronic control unit, using a first diagnostic pulse-train signal generated by the built-in self-test control. Therefore, since in the external test, there is no need for the built-in self-test control block to generate a first diagnostic pulse-train signal and to compare a received first measurement pulse-train signal corresponding to the first diagnostic pulse-train signal with the correct pulse-train information corresponding thereto, an external test can be performed on the built-in self-test control block itself using the scan chain circuits for the built-in self-test control block, thus bringing about the advantageous effect of improving reliability of the integrated circuit element. Moreover, even in the state of integrated circuit element being built in the electronic control unit, the self-test can be performed easily every start or stop of operation of the electronic control unit by making use of part of the scan chain circuits provided for the external test to be executed in the shipment inspection process for the integrated circuit element alone, thus bringing about the advantageous effect of improving reliability of the electronic control unit.

The foregoing and other objects, features, aspects and advantages of the present invention will become more apparent from the following detailed description of the present invention when taken in conjunction with the accompanying drawings.

DETAILED DESCRIPTION OF EXEMPLARY EMBODIMENTS OF THE INVENTION

Embodiment 1

Figure 1:
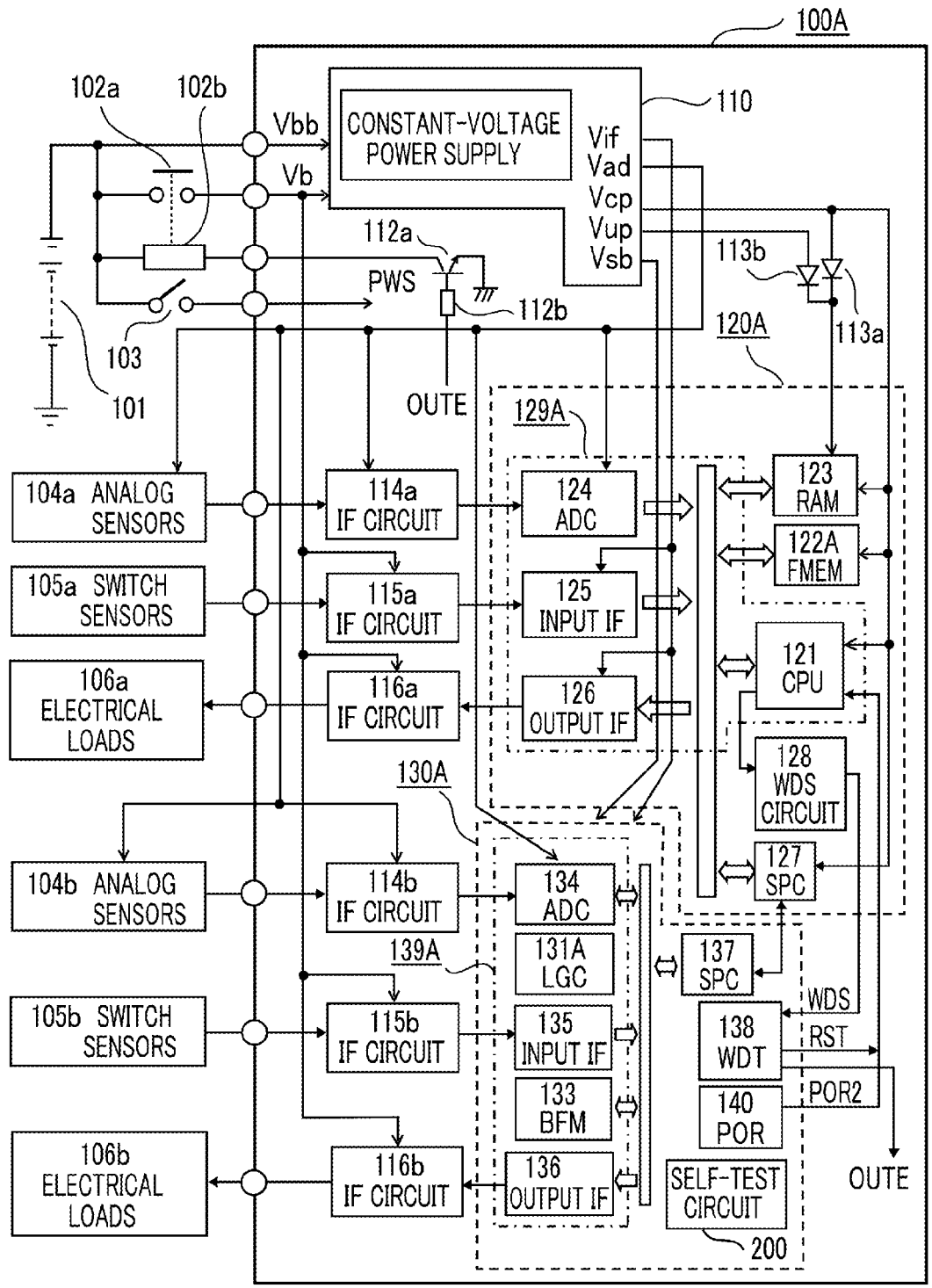
FIG. 1 is an overall configuration diagram of an electronic control unit having integrated circuit elements, according to an embodiment 1 of the present invention.

The configuration of an electronic control unit having integrated circuit elements, according to an embodiment 1 of the present invention will be described in detail below with reference to FIG. 1 showing an overall configuration diagram of the electronic control unit. Referring to FIG. 1, an electronic control unit 100A is mainly constituted with late-described components: a constant-voltage power supply circuit 110; a main control circuit section that is a first integrated circuit element 120A (hereinafter, may also be referred to as a main control circuit section 120A); and a monitoring and control circuit section that is a second integrated circuit element 130A (hereinafter, may also be referred to as a monitoring and control circuit section 130A). The electronic control unit 100A is applied with a main power supply voltage Vb from an external power supply 101, which is an vehicle-mounted battery for example, through an output contact 102a of a power supply relay, and also applied directly with a backup power-supply voltage Vbb, which is for small power, from the external power supply 101 even when the output contact 102a is opened. The power-supply relay exciting coil 102b is energized by closing a power switch 103 and controlled by the electronic control unit 100A so as to be de-energized after a predetermined delay time from closure of the power switch 103. A plurality of first analog sensors that constitute input sensors 104a (hereinafter, may also be referred to as first analog sensors 104a) to be connected to the electronic control unit 100A are connected with analog input ports of the main control circuit section 120A through a later-described input interface circuit 114a. A plurality of second analog sensors that constitute input sensors 104b (hereinafter, may also be referred to as second analog sensors 104b) to be connected to the electronic control unit 100A are connected with analog input ports of the monitoring and control circuit section 130A through a later-described input interface circuit 114b.

A plurality of first switch sensors that constitute input sensors 105a (hereinafter, may also be referred to as first switch sensors 105a) to be connected to the electronic control unit 100A are connected with digital input ports of the main control circuit section 120A through a later-described input interface circuit 115a. A plurality of second switch sensors that constitute input sensors 105b (hereinafter, may also be referred to as second switch sensors 105b) to be connected to the electronic control unit 100A are connected with digital input ports of the monitoring and control circuit section 130A through a later-described input interface circuit 115b. First electrical loads 106a to be connected to the electronic control unit 100A are driven and controlled through a later-described first output interface circuit 116a connected with digital output ports of the main control circuit section 120A. Second electrical loads 106b to be connected to the electronic control unit 100A is driven and controlled through a later-described second output interface circuit 116b connected with digital output ports of the monitoring and control circuit section 130A.

The constant-voltage power supply circuit 110 built in the electronic control unit 100A generates a first, a second, a third, and a fourth stabilized output voltages Vad, Vif, Vcp, Vsb that are stepped down from the main power supply voltage Vb, and also generates a fifth stabilized output voltage Vup that is stepped down from the backup power-supply voltage Vbb. Diodes 113a and 113b are connected to a circuit for feeding power to a RAM memory 123 from the third and the fifth output voltages Vcp, Vup. The first and the second input interface circuits 114a, 114b serve as noise filter circuits connected between the first and the second analog sensors 104a, 104b and later-described multi-channel AD converters 124, 134, respectively. The first and the second input interface circuits 116a, 115b are made up of signal voltage-level transforming circuits and noise filter circuits, and are connected between the first and the second switch sensors 105a, 105b and later-described internal input interface circuits 125, 135, respectively. The first and the second output interface circuits 116a, 116b are made up of power-transistor circuits that transform signal voltage levels, and are connected between the first and the second electrical loads 106a, 106b and later-described internal output interface circuits 126, 136, respectively. Note that power for the first and the second input interface circuits 115a, 115b and the first and the second output interface circuit 116a, 116b is fed from the main power supply voltage Vb.

The first integrated circuit element 120A includes a microprocessor 121, a nonvolatile program memory 122A, the RAM memory 123 for computational processing, the multi-channel AD converter 124, the internal input interface circuit 125, the internal output interface circuit 126, a serial-parallel converter 127, and a watchdog signal circuit 128. Note that the microprocessor 121, the multi-channel AD converter 124, the internal input interface circuit 125, and the internal output interface circuit 126 constitute a main computational control circuit subsection 129A. In addition, part of the region in the nonvolatile program memory 122A, which is a flash memory (FMEM), is used as a nonvolatile data memory. The second integrated circuit element 130A includes a main monitoring and control circuit subsection 139A that are configured with a logic-control circuit 131A made up of a hardware logic circuit, a buffer memory 133, the second multi-channel AD converters 134, the internal input interface circuit 135, and the internal output interface circuit 136. The second integrated circuit element 130A is serially connected with the serial-parallel converter 127 on the microprocessor 121 side through a serial-parallel converter 137. Through the serial connection, digital values converted from analog signals obtained from the second analog sensor 104b or on/off signals obtained from the second switch sensors 105b are transmitted to the microprocessor 121 as well as output control signals generated by the microprocessor 121 are transmitted to the second electrical loads 106b to drive them.

Figure 2:
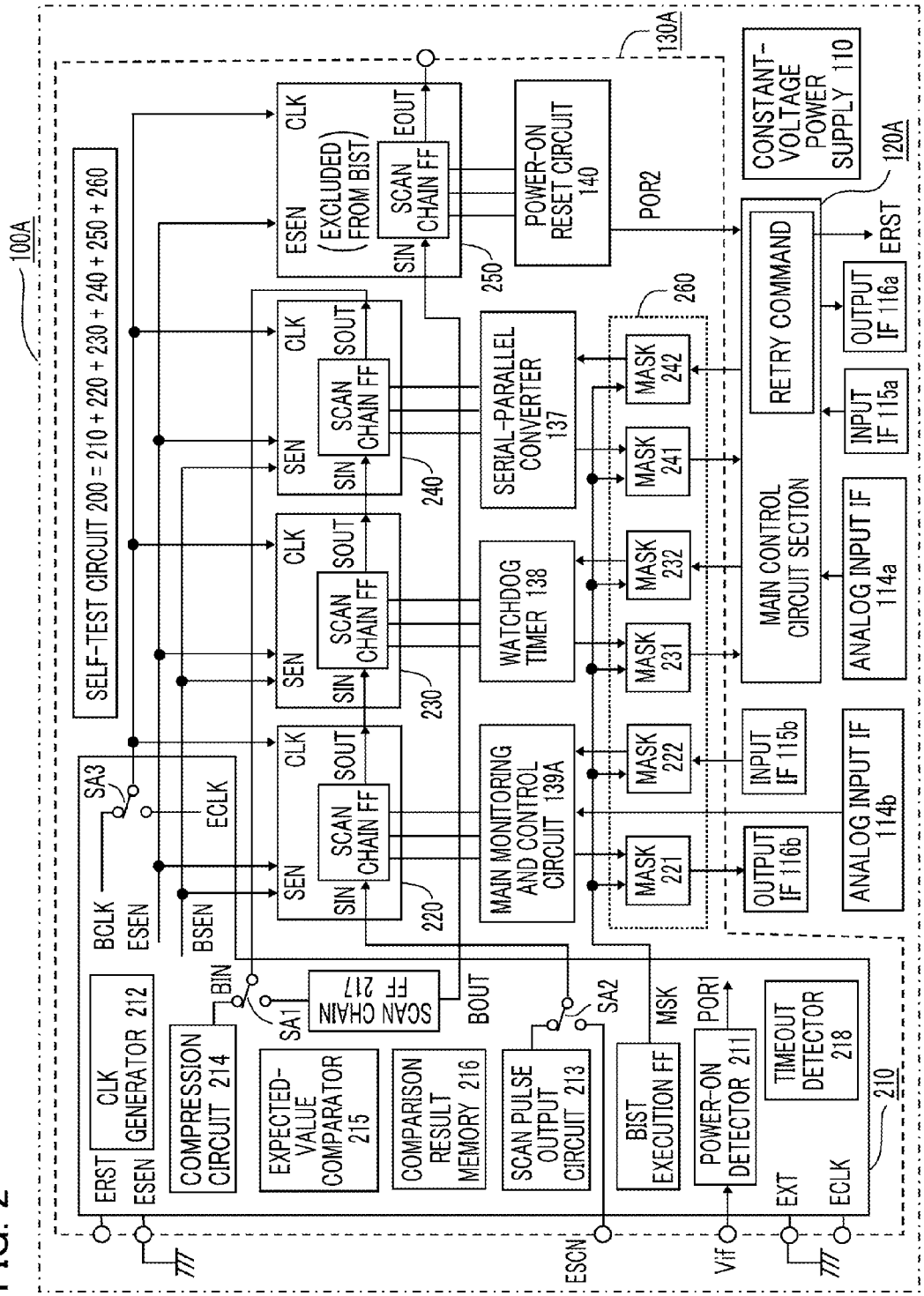
FIG. 2 is a detailed block diagram of a self-test circuit of the electronic control unit of FIG. 1.
Figure 3:
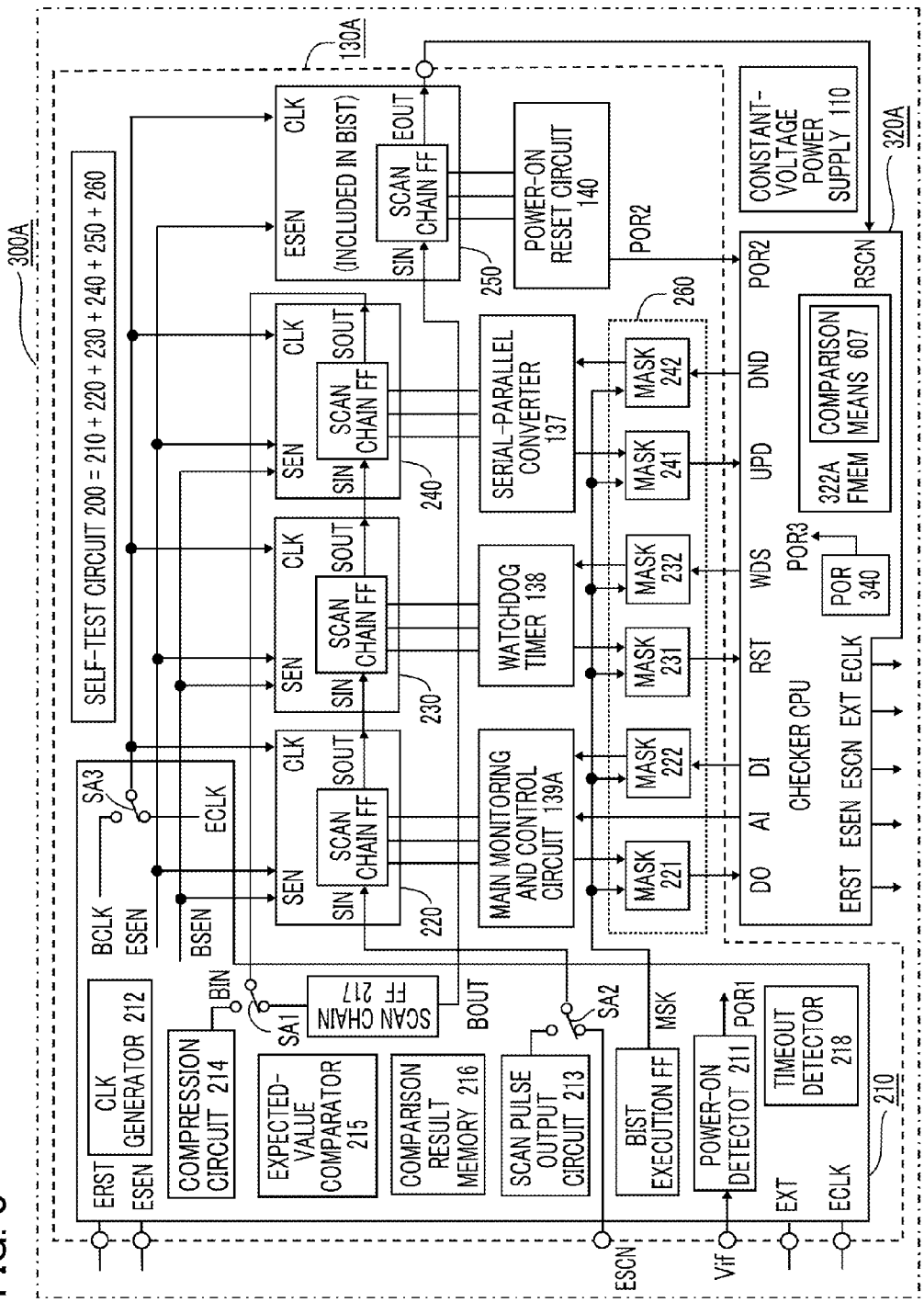
FIG. 3 is an overall configuration diagram of a component test unit for the electronic control unit of FIG. 1.

The second integrated circuit element 130A further includes a watchdog timer 138 that receives a watchdog signal WDS generated by the microprocessor 121, and generates a reset pulse signal RST to initialize and restart the microprocessor 121 when the pulse width of the watchdog signal WDS becomes a predetermined value or more a power-on reset circuit 140 that generates at the time of power-on a power-on reset signal POR2 to initialize and boot up the microprocessor 121 within a predetermined boot wait period Tst; and a self-test circuit 200, which is described later with reference to FIGS. 2 and 3. Note that the electronic control unit 100A is configured so that an output enabling signal OUTE is generated when the watchdog timer 138 operates normally, to allow the first and the second output interface circuits 116a, 116b to generate their outputs. Current for the power-supply relay exciting coil 102b is fed through an energizing transistor 112a in response to a power supply switch signal PWS indicating detection of closure of the power switch 103. However, when the watchdog timer 138 generates the output enabling signal OUTE, the energizing transistor 112a is energized continuously through a drive resistor 112b, even when the power switch 103 becomes opened, to keep closure of the output contact 102a until the microprocessor 121 is halted and the watchdog signal WDS is stopped.

The first output voltage Vad serves as a high-accuracy and small-capacity power source of DC 5V for example, and is fed to the first and the second multi-channel AD converters 124, 134, the first and the second input interface circuits 114a, 114b, and some of the first and the second analog sensors 104a and 104b. The second output voltage Vif serves as a low-accuracy and large-capacity power source of DC 5V for example, and is fed to the internal input interface circuits 125, 135 and the internal output interface circuits 126, 136, the serial-parallel converters 127, 137, the watchdog signal circuit 128, the watchdog timer 138, and the power-on reset circuit 140. The third output voltage Vcp serves as a low-accuracy and large-capacity power source of DC 3.3V for example, and is fed to the microprocessor 121, the nonvolatile program memory 122A, and the RAM memory 123.

The fourth output voltage Vsb serves as a low-accuracy and small-capacity power source of DC 2.5V for example, and is fed to the logic control circuit 131A, the buffer memory 133, and the self-test circuit 200. The fifth output voltage Vup serves as a low-accuracy and small-capacity power source of DC 3.3V for example, and is fed to the RAM memory 123 while the power-supply-relay output contact 102a is opened. The first and the second input interface circuits 115a, 115b primarily transform their input voltage from, for example, the DC 12V line of the main power supply voltage Vb to the DC 5V line, and further the internal input interface circuits 125, 135 secondarily transform their input voltage from the DC 5V line to the DC 3.3V or the DC 2.5V line. The internal output interface circuits 126, 136 primarily transform their output voltage of DC 3.3V or DC 2.5V line to the DC 5V line, and further the first and the second output interface circuits 116a, 116b secondarily transform their input voltage from DC 5V line to the main power supply voltage Vb. In addition, operating the microprocessor 121 and the various memories with the third output voltage Vcp of DC 3.3V allows high-density packaging and fast processing of the first integrated circuit element 120A.

Likewise, operating the logic control circuit 131A with the fourth output voltage Vsb of DC 2.5V allows high-density packaging and fast processing of the monitoring and control circuit section 130A. Note that designing the third output voltage Vcp and the fourth output voltage Vsb to be the same voltage and have the same precision eliminates the necessity of providing the third output voltage Vcp and the fourth output voltage Vsb separately. In addition, after the power switch 103 is closed, the power-on reset signal POR2 of the power-on reset circuit 140 is kept at "L" logic level until the boot wait period Tst of, for example, 50 msec elapses. During this period, the main control circuit section 120A is initialized, and the monitoring and control circuit section 130A is internally checked by the self-test circuit 200 and stores the presence or absence of an error. If the internal check is not completed within a predetermined period, the monitoring and control circuit section 130A stores the timeout error information and finishes or interrupts the internal check within the boot wait period Tst.

Next, the configuration of the self-test circuit 200 for the electronic control unit of FIG. 1 will be described in detail with reference to FIG. 2 showing its detailed block diagram. Referring to FIG. 2, the electronic control unit 100A includes the fore going constant-voltage power supply circuit 110; the main control circuit section 120A, i.e., the first integrated circuit element; the monitoring and control circuit section 130A, i.e., the second integrated circuit element; the input interface circuits 114a, 114b, 115a, 115b; and the output interface circuits 116a, 116b. These are mounted on a not-shown single circuit board contained in a gastight housing and connected with each other. The electronic control unit 100A is also connected, as shown in FIG. 1, to the power supply circuit, and the input sensors and the electrical loads through not-shown connectors provided to the circuit board. As shown also in FIG. 1, the monitoring and control circuit section 130A further includes the serial-parallel converter 137, the watchdog timer 138, the main monitoring and control circuit subsection 139A, the power-on reset circuit 140, and the self-test circuit 200. The self-test circuit 200 is configured with a built-in self-test control block (BIST control block) 210 including a scan chain circuit 217, scan chain circuits 220, 230, 240, 250, and mask circuitry 260. Their details are described below with reference to FIGS. 1 and 2.

First, the items of the mask circuitry 260 is described. A mask circuit 221 is connected between the internal output interface circuit 136 in the main monitoring and control circuit subsection 139A and the output interface circuit 116b on the circuit board, to put the electric loads 106b into the drive disabled states when the input/output disabling signal MSK is input. Also, a mask circuit 222 is connected between the internal output interface circuit 135 in the main monitoring and control circuit subsection 139A and the input interface circuit 115b on the circuit board, to disable inputs from the switch sensors 105b by fixing the signal level of the mask circuit to, for example, "L" logic level when the input/output disabling signal MSK is input. Note that the functions of the internal output interface circuit 136 and the internal input interface circuit 135 of FIG. 1 may be respectively added to the mask circuit 221 and the mask circuit 222. Likewise, a mask circuit 231 disables output of the reset pulse signal RST generated by the watchdog timer 138, a mask circuit 232 disables input of the watchdog signal WDS generated by the microprocessor 121 in the main control circuit section 120A, a mask circuit 241 disables output of an upstream signal generated by the serial-parallel converter 137 to be sent to the microprocessor 121, and a mask circuit 242 disables input of a downstream signal to be input to the serial-parallel converter 137 from the microprocessor 121.

The scan chain circuit 220 is configured with shift registers made up of a plurality of flip-flop circuits that are provided at the respective fore and aft sides of a plurality of to-be-checked combination of circuit components in the main monitoring and control circuit subsection 139A and serially combined with each other that. The scan chain circuit 230, the scan chain circuit 240, the scan chain circuit 250, and the scan chain circuit 217 are similarly configured and are for the watchdog timer 138, the serial-parallel converter 137, the power-on reset circuit 140, and for the later-described BIST control block 210, respectively. However, the scan chain circuits 220, 230, 240 do not need to be provided separately for each of functional blocks: the main monitoring and control circuit subsection 139A, the watchdog timer 138, the serial-parallel converter 137, but may be integrated as a first combination of the scan chain circuits. Likewise, the scan chain circuits 217, 250 may be integrated as scan chain circuits outside the self-test.

Next, the internal configuration of the BIST control block 210 is described, in which a power-on detection circuit 211 generates a power-on detection signal POR1 that becomes "H" logic level when the second output voltage Vif, which is generated by the constant-voltage power supply circuit 110 when the power switch 103 is closed, becomes equal to or higher than a predetermined threshold voltage of DC 3.5V, for example, to put a BIST execution indicating flip-flop circuit into the set state from the reset state. Then, the detection circuit 211 generates a BIST execution indicating signal to turn an internal-scan enabling signal BSEN to "H" logic level. Note that the BIST execution indicating flip-flop circuit is a flip-flop circuit that is set by the power-on detection signal POR1 or a later-described retry command signal ERST and is reset by completion of expected-value comparison or timeout determination, which are later described, and control operation of the main monitoring and control circuit subsection 139A is stopped during execution of BIST. A clock signal generation circuit 212 generates an internal clock signal BCLK having a predetermined frequency when the power-on detection signal POR1 become "H" logic level. A scan-pulse output circuit 213 becomes active when the internal-scan enabling signal BSEN is in "H" logic level of the enabling state, and generates a first diagnostic pulse-train signal BOUT in synchronism with the internal clock signal BCLK to provide a scan-in signal SIN to the scan chain circuit 220. In addition, the scan-pulse output circuit 213 uses a pseudorandom number generator employing, for example, a deterministic algorithm having reproducibility. A scan-out signal SOUT generated by the scan chain circuit 220 is a scan-in signal SIN for the subsequent scan chain circuit 230, a scan-out signal SOUT generated by the scan chain circuit 230 is a scan-in signal SIN for the subsequent scan chain circuit 240, and a scan-out signal SOUT generated by the scan chain circuit 240 is input as a first measurement pulse-train signal BIN to the BIST control block 210.

A compression circuit 214 calculates the remainder of division of the received first measurement pulse-train signal BIN by, for example, a predetermined value, to generate a compressed value of the measurement result. An expected-value comparison circuit 215 compares the compressed measurement-result value obtained from the compression circuit 214 with an expected-value obtained by compressing correct information corresponding to the sent first diagnostic pulse-train signal BOUT, to determine the comparison to be normal when both compressed values agree with each other or to be in error when they do not agree with each other, and then stores the comparison result in a comparison result storing memory 216. A timeout detection circuit 218 stores timeout error information when no comparison and determination result of the expected-value comparison circuit 215 is obtained until a predetermined determination time elapses. Note that the BIST execution indicating flip-flop circuit that has stored the BIST execution indicating signal by generation of the power-on detection signal POR1, is reset by the fact that the comparison result storing memory 216 stores a comparison result or by the fact that the timeout detection circuit 218 stores a timeout error information, whereby the BIST execution indicating signal is released.

The BIST control block 210 is provided with a not-shown pulse counter, and turns temporarily the internal-scan enabling signal BSEN to "L" logic level when the number of pulses in the first diagnostic pulse-train signal BOUT generated by the scan-pulse output circuit 213 becomes equal to the total number of flip-flop circuits in the first combination of the scan chain circuits 220, 230, 240. In this way, turning the internal-scan enabling signal BSEN to "H" logic level of the enabling state permits a scan-in mode, in which the first diagnostic pulse-train signal BOUT is scanned-in in synchronism with the internal clock signal BCLK and then diagnostic information is input to each flip-flop circuit constituting the shift register. Then, turning the internal-scan enabling signal BSEN to "L" logic level of the disabling state permits a capture mode, in which outputs of the combination circuits for the diagnostic information are captured into the flip-flop circuits on input of the internal clock signal BCLK. Turning again the internal-scan enabling signal BSEN to "H" logic level of the enabling state permits a scan-out mode, in which the information in the shift registers is sent out as a first measurement pulse-train signal BIN in synchronism with the internal clock signal BCLK.

Current value of the pulse counter, which has been incremented during the scan-in mode, is then decremented in the scan-out mode. When the current value becomes zero, the expected-value comparison circuit 215 performs the comparison and determination. Note that at the time of completion of the comparison, the BIST control block 210 generates a not-shown reset signal to reset all flip-flop circuits in the scan chain circuits 220, 230, 240. During the period of the internal check on the monitoring and control circuit section 130A performed in this way by the self-test circuit 200, the power-on reset circuit 140 is outside the internal check and performs a timer operation. After the predetermined boot wait period Tst elapses in clue course of time, the power-on reset signal POR2 becomes "H" logic level, whereby the microprocessor 121 starts the control operation. The microprocessor 121, when reading out through the serial-parallel converter 127, 137 the state stored in the comparison result storing memory 216 and the state of the timeout detection circuit 218 in the BIST control block 210 results in no confirmation of the normal determination, repeats generation of the retry command signal ERST within predetermined limit times to restore again the BIST control block 210 to the state immediately after the power switch 103 is closed. Note that the retry command signal ERST can also be transmitted through the serial-parallel converter 127, 137.

The BIST control block 210 is further provided with a selection command input terminal for receiving a selection command signal EXT and selection circuits SA1, SA2, SA3. When the selection command signal EXT is, for example, "L" logic level, the BIST control block 210 goes into a self-test mode, in which the selection circuits SA1, SA2, SA3 form a scan signal loop shown in FIG. 2 and the BIST control block 210 performs a self-test for the first combination of the scan chain circuits 220, 230, 240. Note that while the BIST execution indicating flip-flop circuit generates the BIST execution indicating signal, the input/output disabling signal MSK is kept at "H" logic level so that the mask circuitry 260 puts all input/output into the disabled state. This prevents the electrical loads 106b from being driven during the self-test and the self-test from being determined to be in error due to change in the operational state of the switch sensors 105b. When the selection command signal EXT input to the selection command input terminal turns to, for example, "H" logic level, the BIST control block 210 goes into an external-test mode later described with reference to FIG. 3, in which a second diagnostic pulse-train signal ESCN is input to a pulse input terminal and an external scan enabling signal ESEN is input to a control input terminal. Moreover, an external clock signal ECLK is selected instead of the internal clock signal BCLK by the selection circuit SA3. Note that in the self-test mode, the selection command input terminal for receiving the selection command signal EXT and the control input terminal for receiving the external scan enabling signal ESEN are fixed at "L" logic level, and the pulse input terminal for receiving the second diagnostic pulse-train signal ESCN is fixed at "L" logic level or in the open state.

Next, the configuration of a component test unit 300A for the electronic control unit shown in FIG. 1 will be described in detail with reference to FIG. 3 showing an overall configuration diagram of the component test unit. Referring to FIG. 3, the component test unit 300A includes the foregoing constant-voltage power supply circuit 110a; the monitoring and control circuit section 130A, the second integrated circuit element to be checked; and a checker microprocessor 320A. These are mounted on a not-shown circuit board. The monitoring and control circuit section 130A is detachable through a not shown connector. The component test unit 300A is connected to a not-shown external power supply through a power supply switch, but not connected to the input sensors and the electric loads shown in FIG. 1. The checker microprocessor 320A serves as substitution for these input sensors and electric loads. The checker microprocessor 320A is initialized by a built-in power-on reset circuit 340, and then sends the retry command signal ERST, the external scan enabling signal ESEN, the second diagnostic pulse-train signal ESCN the selection command signal EXT, and the external clock signal ECLK to the respective terminals provided to the BIST control block 210 of the to-be-tested integrated circuit element.

When performing an external test, the selection command signal EXT of "H" logic level is sent to the selection command input terminal, whereby the selection circuits SA1, SA2, SA3 in the BIST control block 210 are switched to the connection positions shown in FIG. 3. Thus, the second diagnostic pulse-train signal ESCN sent to the pulse input terminal from the checker microprocessor 320A is input as a second measurement pulse-train signal EOUT to a measurement pulse input terminal RSCN of the checker microprocessor 320A by way of the scan chain circuits 220, 230, 240, 217, 250 from a pulse output terminal. Moreover, the external clock signal ECLK is selected instead of the internal clock signal BCLK by the selection circuit SA3. Note that when the selection command signal EXT is at "H" logic level, the clock signal generation circuit 212, the scan-pulse output circuit 213, the compression circuit 214, the expected-value comparison circuit 215, the comparison result storing memory 216, and the timeout detection circuit 218 are initialized and are in the disabled states, thus allowing a condition ready to perform the scan test using the scan chain circuit 217. Likewise, the power-on reset circuit 140 is also initialized and is in the disabled state, thus allowing a condition ready to perform the scan test using the scan chain circuit 250 for the power-on reset circuit 140.

The second diagnostic pulse-train signal ESCN sent to the pulse input terminal from the checker microprocessor 320A is input to the scan chain circuit 220 in synchronism with the external clock signal ECLK by the fact that the external scan enabling signal ESEN is turned to "H" logic level. A scan out signal SOUT generated by the scan chain circuit 220 is a scan-in signal SIN for the subsequent scan chain circuit 230, a scan-out signal SOUT generated by the scan chain circuit 230 is a scan-in signal SIN for the subsequent scan chain circuit 240, a scan-out signal SOUT generated by the scan chain circuit 240 is a scan-in signal SIN for the scan chain circuit 217 in the BIST control block 210, a scan-out signal SOUT generated by the scan chain circuit 217 is a scan-in signal SIN for the subsequent scan chain circuit 260, and a scan-out signal generated by the scan chain circuit 250 is input as the second measurement pulse-train signal EOUT to measurement pulse input terminal RSCN of checker microprocessor 320A.

The checker microprocessor 320A is provided with a pulse counter that is configured with a control program in a cooperative program memory 322A, and turns temporarily the external-scan enabling signal ESEN to "L" logic level when the number of pulses in the second diagnostic pulse-train signal ESCN having been sent becomes equal to the total number of flip-flop circuits in a second combination of the scan chain circuits 220, 230, 240, 217, 260. In this way, turning the external-scan enabling signal ESEN to "H" logic level of the enabling state permits the scan-in mode, in which the second diagnostic pulse-train signal ESCN is scanned-in in synchronism with the external clock signal ECLK and then diagnostic information is input to each flip-flop circuit constituting the shift register. Then, turning the external-scan enabling signal ESEN to "L" logic level of the disabling state permits the capture mode, in which outputs of the combination circuits for the diagnostic information are captured into the flip-flop circuits on input of the internal clock signal BCLK. Turning again the external-scan enabling signal ESEN to "H" logic level of the enabling state permits the scan-out mode, in which the information in the shift registers is sent out as the second measurement pulse-train signal EOUT in synchronism with the external clock signal ECLK.

Current value of the pulse counter, which has been incremented during the scan-in mode, is then decremented in the scan-out mode. When the current value becomes zero, the comparison and determination is made in accordance with an expected-value comparison means 607. The expected-value comparison means 607 is a control program included in the program memory 322A. The checker microprocessor 320A cooperates with the program memory 322A and compares, in accordance with the expected-value comparison means 607, the received second measurement pulse-train signal EOUT with correct information corresponding to the second diagnostic pulse-train signal ESCN having been sent, to determine the comparison to be normal when both agree with each other or to be in error when they disagree with each other. The second diagnostic pulse-train signal ESCN generated by the checker microprocessor 320A, which is composed of a train of binary data stored in a numerical data setting area of the cooperative program memory 322A, bitwise sent out sequentially from the least significant bit or the most significant bit in synchronism with the external clock signal ECLK. In addition, the second correct pulse-train information is composed of binary data having the same number of bits as the second diagnostic pulse-train signal ESCN and the second measurement pulse-train signal EOUT, and stored in the numerical data setting area of the program memory 322A. Note that when no comparison and determination result in accordance with the expected-value comparison means 607 is obtained until a predetermined determination time elapses, the checker microprocessor 320A determines it as a timeout error, and repeats a plurality of retry operations by generating the retry command signal ERST, to detects the presence or absence of an error.

The component test unit 300A can also perform a check on functions of the BIST control block 210 by putting the to-be-tested integrated circuit element into the self-test mode by turning the selection command signal EXT to "L" logic level. In addition, by adding a function check program into the program memory 322A, various function checks can also be performed for the monitoring and control circuit section 130A after a self-test for the monitoring and control circuit section 130A has been completed, with the selection command signal EXT being in "L" logic level. For example, sending a load drive command through the serial-parallel converter 137 to the monitoring and control circuit section 130A to acquire a load drive signal generated by the internal output interface circuit 136 into the checker microprocessor 320A allows determination as to whether or not an expected output signal is obtained. At this time, if enabling or disabling of the mask circuitry 260 is put to be controllable, output disable operation of the mask circuitry 260 can also be checked. Likewise, sending a sensor emulation signal from the checker microprocessor 320A to the internal input interface circuit 135 through the multi-channel AD converter 134 to acquire a signal generated by the interface circuit into the checker microprocessor 320A through the serial-parallel converter 137 allows determination as to whether or not an expected input signal is obtained. At this time, if enabling or disabling of the mask circuitry 260 is put to be controllable, input disable operation of the mask circuitry 260 can also be checked.

Next, the overall operation of the electronic control unit 100A configured as shown in FIG. 1 will be described with reference to FIGS. 4A, 4B and FIGS. 5A, 5B showing flowcharts for explaining the operation. First, the outline of the overall operation is described with reference to FIG. 1. When the power switch 103 is closed, the power-supply relay exciting coil 102b is energized to close the output contact 102a, whereby the main power supply voltage Vb is applied to electronic control unit 100A and then the constant-voltage power supply circuit 110 generates the predetermined stabilized voltages of the first to the fourth output voltages Vad, Vif, Vcp, Vsb. Note that the fifth output voltage Vup, which is stepped down from the backup power-supply voltage Vbb directly supplied from the external power supply 101 and kept always at the predetermined stabilized voltage even while the power-supply-relay output contact 102a is opened, is fed, to the entire area of the RAM memory 123 or part of its area that needs a battery backup.

The power-on reset circuit 140 in the monitoring and control circuit section 130A keeps the power-on reset signal POR2 at "L" logic level until the predetermined boot wait period Tst elapses after the second output voltage Vif is generated, to disable output generation of the microprocessor 121 in the main control circuit section 120A. Within this period, the self-test is performed for the first combination of the scan chain circuits. When the power-on reset signal POR2 turns to "H" logic level in due course of time, started are the input/output control operation by the main control circuit section 120A and the monitoring and control operation by the monitoring and control circuit section 130A. That is, the microprocessor 121 generates the watchdog signal WDS and the watchdog timer 138 generates the output enabling signal OUTE when the pulse width of the watchdog signal WDS is smaller than the predetermined, value, whereby the internal output interface circuits 126, 136 are enabled to generate control outputs and at the same time the energizing transistor 112a is driven to energize and self-hold the power-supply relay exciting coil 102b. The main control circuit section 120A being in operation drives and controls, in accordance with the contents of the control program in the program memory 122A, the electrical loads 106a, 106b in response to operational states of the first and the second analog sensors 104a, 104b and the first and the second switch sensors 105a, 105b. Communication of input/output signals with the analog sensors 104b, the switch sensors 105b and the electrical loads 106b is performed through the serial-parallel converters 127, 137. Note that it is possible to eliminate the communication of input/output signals with the analog sensors 104b, the switch sensors 105b and the electrical loads 106b connected to the monitoring and control circuit section 130A side and instead to perform the communication by connecting all their inputs/outputs directly to the main control circuit section 120A.

During operation, the monitoring and control circuit section 130A monitors the watchdog signal WDS of the watchdog timer 138 and periodically sends questionnaire information to the main control circuit section 120A to check whether or not the main control circuit section 120A normally operates by comparing answer information replied from the main control circuit section 120A with correct information. Note that when the power switch 103 is opened at that time, the microprocessor 121 transfers learned information and error occurrence information having been written in the RAM memory 123 to a data storage area of the program memory 122A to save them, and then stops generation of the watchdog signal WDS. Consequently, the self-holding energization of the power supply relay sustained by the output enabling signal OUTE is released and the power-supply-relay output contact 102a is opened thereby.

Figure 4A:
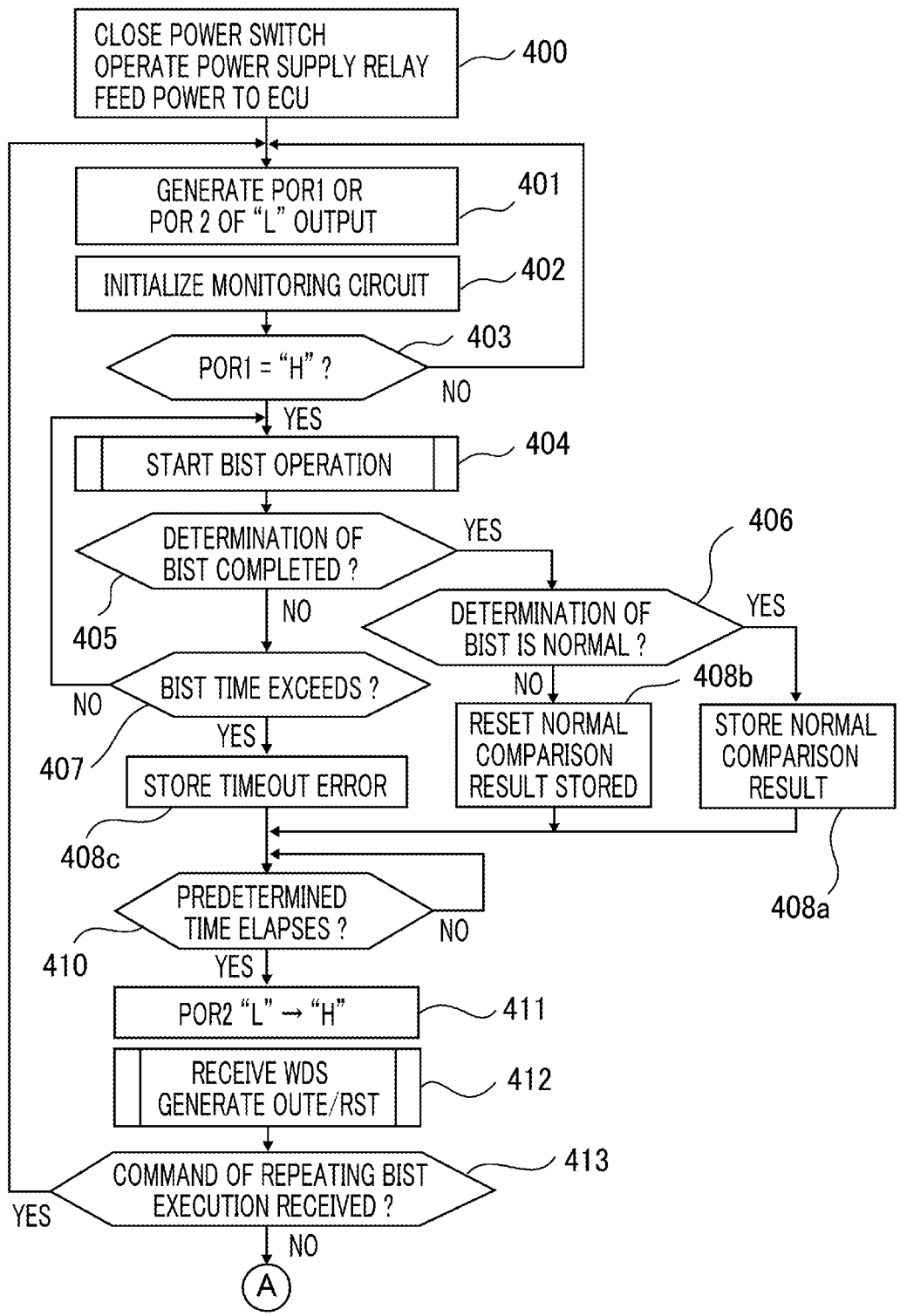
FIG. 4A is a flowchart for explaining the first half operation of a monitoring and control circuit unit of the electronic control unit of FIG. 1.
Figure 4B:
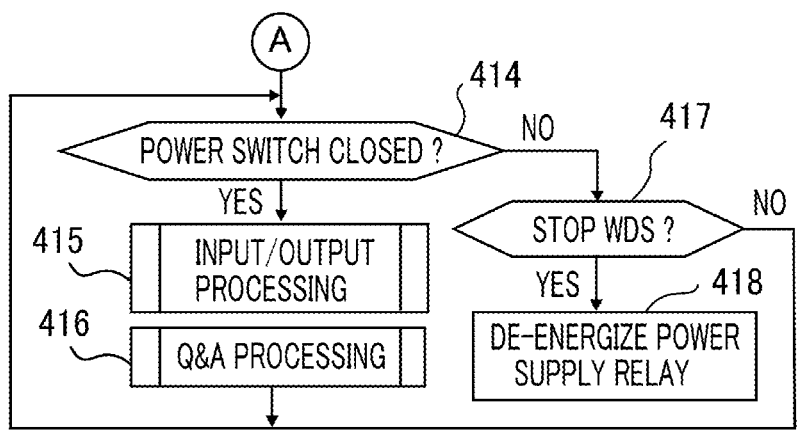
FIG. 4B is a flowchart for explaining the latter half operation of the monitoring and control circuit unit of the electronic control unit of FIG. 1.

Next, a control operation of the monitoring and control circuit section 130A configured with hardware logic will be described in detail with reference to FIGS. 4A and 4B showing equivalent flowchart of the operation and to FIGS. 1 and 2 showing the configuration. Referring to FIG. 4A, in a step 400, the power switch 103 and the power-supply-relay output contact 102a shown in FIG. 1 are closed sequentially, whereby the main power-supply voltage Vb is supplied to the electronic control unit 100A. In a subsequent step 401, the power-on detection circuit 211 and the power-on reset circuit 140 shown in FIG. 2 generate the power-on detection signal POR1 and the power-on reset signal POR2 of "L" logic level, respectively. It should be noted that the power-on detection signal POR1 generated by power-on detection circuit 211 becomes "H" logic level after a lapse of, for example, 5 milliseconds and the power-on reset signal POR2 generated by the power-on reset circuit 140 becomes "H" logic level after a lapse of, for example, 50 milliseconds. In a subsequent step 402, the entire monitoring and control circuit section 130A is initialized and the power-on reset circuit 140 stars its timer operation on completion of the initialization. A subsequent step 403 is a determination step, in which it is determined whether or not the power-on detection signal POR1 becomes "H" logic level. If the power-on detection signal POR1 does not become "H" level, i.e., "NO" determination is made, the process returns to the step 401. If the power-on detection signal POR1 becomes "H" level, i.e., "YES" determination is made, the process proceeds to a block step 404.

In the block step 404, the BIST control block 210 in FIG. 2 starts its operation: the scan-pulse output circuit 213 feeds the first diagnostic pulse-train signal BOUT to the first combination of the scan chain circuits 220, 230, 240, and the scan out signal SOUT sent out from the last-stage scan chain circuit 240 is input as the first measurement pulse-train signal BIN to the expected-value comparison circuit 215 via the compression circuit 214. A subsequent step 405 is a determination step, in which it is determined whether or not the expected-value comparison circuit 215 completes the comparison and determination. If completed, i.e., "YES" determination is made, the process proceeds to a step 406. If not completed, i.e., "NO" determination is made, the process proceeds to a step 407. The step 406 is a determination step, in which it is determined whether or not the comparison and determination result of the expected-value comparison circuit 215 is normal. If determined to be normal, i.e., "YES" determination is made, the process proceeds to a step 408a. If determined to be in error, i.e., "NO" determination is made, the process proceeds to a step 408b. The step 407 is a determination step, in which it is determined whether or not the time required for the self-test performed in the block step 404 exceeds a predetermined threshold time for determining timeout error. If determined to be not overtime, i.e., "NO" determination is made, the process returns to the block step 404. If determined to be overtime, i.e., "YES" determination is made, the process proceeds to a step 408c. Note that the threshold time for determining timeout error is set shorter than the boot wait period Tst, the power-on reset time set by the power-on reset circuit 140.

Figure 5A:
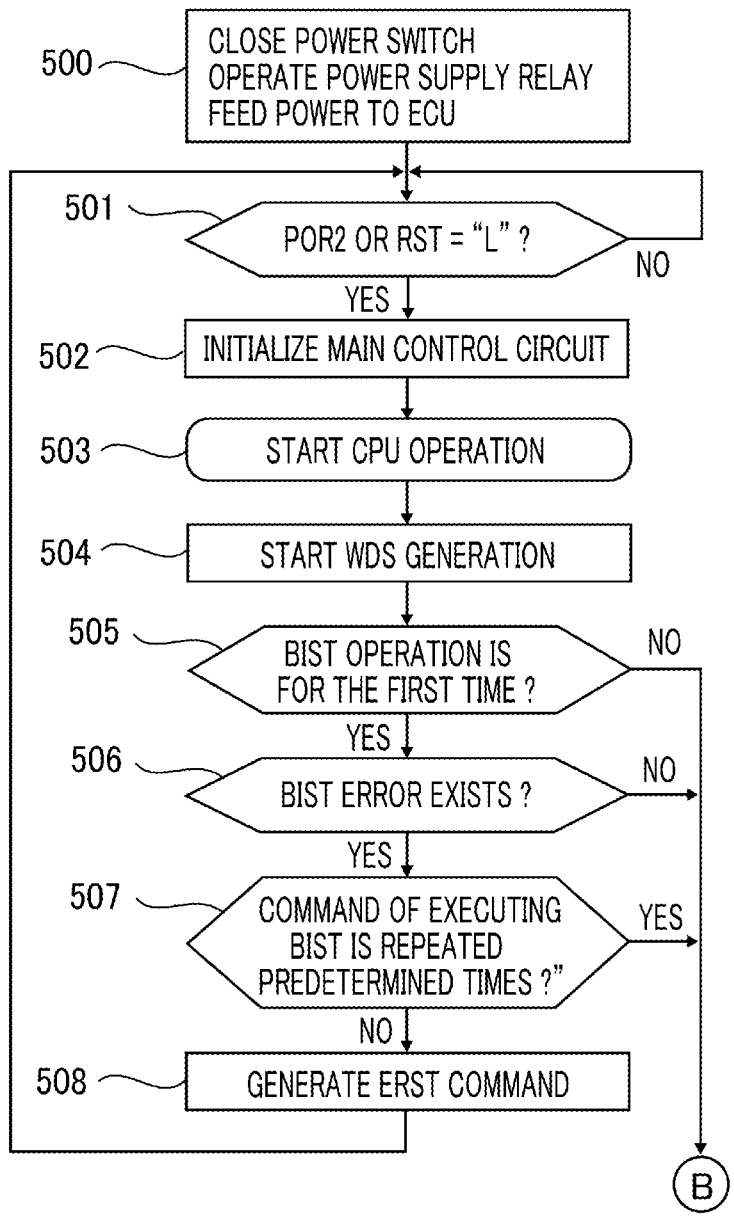
FIG. 5A is a flowchart for explaining the first half operation of a main control circuit section of the electronic control unit of FIG. 1.

In the step 408a, normality of the comparison and determination result of the expected-value comparison circuit 215 is stored in the comparison result storing memory 216. In the step 408b, the fact that the result of the comparison and determination of the expected-value comparison circuit 215 is in error is stored by resetting a normal record stored in the comparison result storing memory 216. In the step 408c, timeout error information is stored by the timeout detection circuit 218 when no comparison and determination result of the expected-value comparison circuit 216 is obtained until the predetermined threshold time for determining timeout error is elapsed. A step 410 subsequent to the steps 408a, 408b, 408c is a waiting step, in which it is determined whether or not the predetermined boot wait period Tst elapses after the "YES" determination is made in the step 403. If the boot wait period Tst elapses, i.e., "YES" determination is made, the process proceeds to a step 411. If the boot wait period Tst does not elapse, i.e., "NO" determination is made, the process repeats the step 410. In the step 411, the power-on reset signal POR2 of the power-on reset circuit 140 is inverted to "H" logic level to release the power-on reset state. In a subsequent block step 412, the watchdog signal WDS generated by the microprocessor 121 in a step 504, which is described later in detail with reference to FIG. 5A, is monitored by the watchdog timer 138. If a pulse width of the watchdog signal WDS is smaller than the predetermined value, i.e., in the normal state, the output enabling signal OUTE is generated. If the pulse width becomes the predetermined value or more, i.e., indicating an erroneous state, the reset pulse signal RST is generated. Note that while the output enabling signal OUTE is generated, the energizing transistor 112a maintains the self-holding energization of the power-supply relay exciting coil 102b shown in FIG. 1 to keep the energized state even when the power switch 103 is opened. And on generating the power-on reset signal POR2 or the reset pulse signal RST, the main control circuit section 120A is initialized in a step 502, which is described later with reference to FIG. 5A.

A subsequent step 413 is a determination step, in which it is determined whether or not the retry command signal ERST is generated in a later-described step 508 in FIG. 5A. If generated, i.e., "YES" determination is made, the process returns to the step 401. If the retry command signal ERST is not generated, the process proceeds to a step 414 in FIG. 4B through a junction mark A. In FIG. 4B, the step 414 is a determination step, in which it is determined whether or not the power switch 103 is still closed. If closed, i.e., "YES" determination is made, the process proceeds to a block step 415. If opened, i.e., "NO" determination is made, the process proceeds to a step 417.

In the block step 415, the microprocessor 121 receives input signal from the analog sensors 104b and the switch sensors 105b shown in FIG. 1 through the serial-parallel converters 137, 127 or sends control signals through the serial-parallel converters 127, 137 to drive and control the electrical loads 106b. In a subsequent block step 416, questionnaire information is periodically sent to the microprocessor 121 through the serial-parallel converters 137, 127; and answer information received from the microprocessor 121 through the serial-parallel converters 127, 137 is compared with correct information pre-stored in the monitoring and control circuit section 130A, whereby the operational state of the main control circuit section 120A is monitored. During the process of repeating execution the block steps 415 and 416, when the power switch 103 is opened, the process proceeds from the step 414 to the step 417. The step 417 is a determination step, in which it is determined by the watchdog timer 138 whether or not the watchdog signal WDS is stopped. If not stopped, i.e., "NO" determination is made, the process returns to the step 414. If stopped, i.e., "YES" determination is made, the process proceeds to a step 418. In the step 418, by the fact that the output enabling signal OUTE from the watchdog timer 138 becomes "L" logic level, the power-supply relay exciting coil 102b is de-energized to open the output contact 102a and feeding of the main power-supply voltage Vb to the electronic control unit 100A is stopped.

Figure 5B:
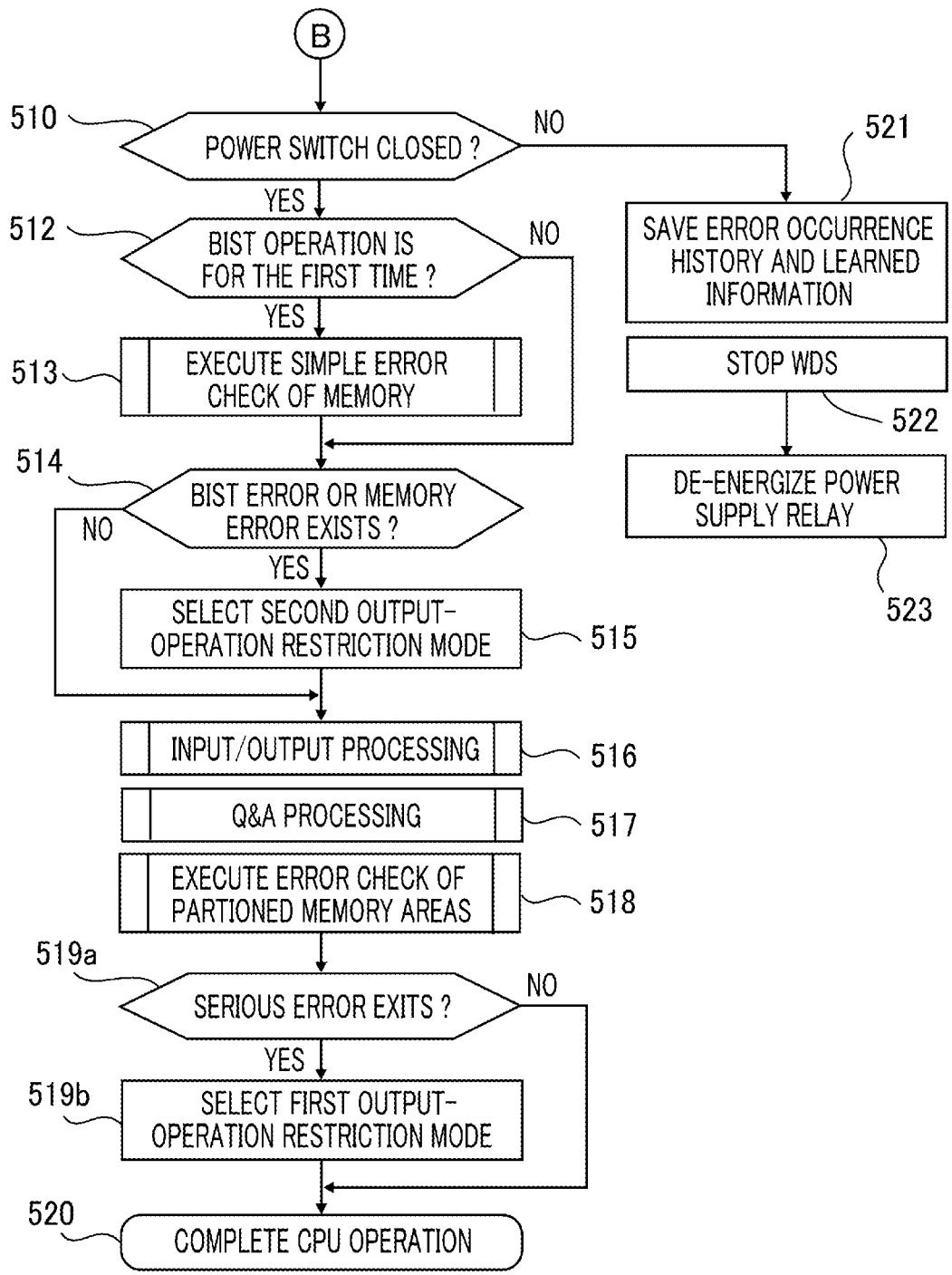
FIG. 5B is a flowchart for explaining the latter half operation of the main control circuit section of the electronic control unit of FIG. 1.

Next, the control operation of the main control circuit section 120A including the microprocessor 121 as a main component will be described in detail with reference to FIGS. 5A and 5B showing a flowchart of the operation and to FIGS. 1, 2 showing the configuration of the unit. Referring to FIG. 5A, in a step 500, the power switch 103 and the power-supply-relay output contact 102a shown in FIG. 1 are closed sequentially, whereby the main power-supply voltage Vb is supplied to the electronic control unit 100A. A subsequent step 501 is a waiting step, in which it is determined whether or not the power-on reset circuit 140 in FIG. 1 generates the power-on reset signal POR2 of "L" logic level, or whether or not the watchdog timer 138 generates the reset pulse signal RST. If either of the reset signals is generated, i.e., "YES" determination is made, the process proceeds to the step 502. If no reset signals are generated, i.e., "NO" determination is made, the process returns to the step 501. In the step 502, the main control circuit section 120A is initialized and then the process proceeds to a step 503 of starting the microprocessor 121. In the subsequent step 504, periodic generation of the watchdog signal WDS is started. A subsequent step 505 is a determination step, in which it is determined whether or not the operation start step 503 is for the first time. If it is for the first time, i.e., "YES" determination is made, the process proceeds to a step 506. If it is not for the first time, i.e., "NO" determination is made, the process proceeds to a step 510 through a junction mark B.

A step 506 is a determination step, in which the presence or absence of a comparison error stored in the comparison result storing memory 216 shown in FIG. 2 and the presence or absence of a timeout error stored by the timeout detection circuit 218 are read out, to determine the presence or absence of a self-test error. If no normal determination result is obtained, i.e., "YES" determination is made, the process proceeds to a step 507. If a normal determination result is obtained, i.e., "NO" determination is made, the process proceeds to the step 510 through the junction mark B. The step 507 is a determination step, in which it is determined whether or not generations of the retry command signal ERST in the step 508 exceed, for example, 3 times. If they are 3 times or less, i.e., "NO" determination is made, the process proceeds to the step 508. If they exceed 3 times, i.e., "YES" determination is made, the process proceeds to the step 510 through the junction mark B. In the step 508, the retry command signal ERST is generated, and then the process returns to the step 501. As a result, "YES" determination is made in the step 413, the power-on reset signal POR2 is generated in the step 401 and then the subsequent steps are executed again as shown in FIG. 4A, and "YES" determination is made in the step 501 and then executions of the subsequent steps are repeated as shown in FIG. 5A.

If a normal determination result is obtained by retry of the self-test in the block step 404 in FIG. 4A, "NO" determination is made in the step 506 in FIG. 5A and then the process branches to the step 510 in FIG. 5B. If no normal determination is obtained even when the retry exceeds 3 times, "YES" determination is made in the step 507 in FIG. 5A and then and then the process branches to the step 510. In FIG. 5B, the step 510 is a determination step, in which it is determined whether or not the power switch 103 is still closed. If closed, i.e., "YES" determination is made, the process proceeds to a step 512. If opened, i.e., "NO" determination is made, the process branches to a step 521. The step 512 is a determination step, in which it is determined whether or not the "YES" determination made in the step 510 is for the first time. If it is for the first time, i.e., "YES" determination is made, the process proceeds to a block step 513. If it is not for the first time, i.e., "NO" determination is made, the process skips to a step 514. In the block step 513, it is determined whether or not predetermined numerical check data for example, which has been stored in a constants setting area of the program memory 122A and beforehand transferred to and written in the RAM memory 123, is correctly stored, whereby it is checked whether or not the backup power-supply voltage Vbb is continuously fed. Then, the process proceeds to the step 514.

The step 514 is a determination step. When the self-test determination result is in error, i.e., "YES" determination is made in the step 506, when no normal determination is obtained within the predetermined repetition of the retries, i.e., "YES" determination is made in the step 507, or when a memory error is detected in the simple memory-error check in the block step 513, "YES" determination is made in the determination step and then the process proceeds to a step 515. If there are no errors, i.e., "NO" determination is made in the determination step, the process skips to a step 516. In the step 515, a second output-operation restriction mode is selected, in which, for example, drive of some electrical loads of the electrical loads 106a, 106b are stopped or a mode of restricting control outputs is selected. Then the process proceeds to a step 616. In the block step 516, the electrical loads 106a, 106b are driven and controlled in response to operational states of the input sensors 104a, 105a, 104b, 105b. In a subsequent block step 517, Q & A processing is performed. i.e., answer information is generated for questionnaire information sent from the monitoring and control circuit section 130A and the answer information is replied to the monitoring and control circuit section 130A.

In a subsequent block step 518, partitioned address areas in the program memory 122A and the RAM memory 123 are checked sequentially for the contents therein. For example, for the program memory 122A, intrusion or dropout of bit information is sequentially checked using a code check means typified by "cyclic redundancy check (CRC)", and for the RAM memory 123, positive logic information and negative logic information, which has been stored beforehand, are checked for agreement with each other using an invert logic verification. A subsequent step 519a is a determination step. When an erroneous determination is made in the block step 517 or when an erroneous determination for the program memory 122A is made in the block step 518, "YES" determination is made in the determination step and then the process proceeds to a step 519b. When there are no these errors, "NO" determination is made in the determination step and then the process skips to a step 520. In the step 519b, a first output-operation restriction mode is selected, in which drive of more electrical loads out of the electrical loads 106a, 106b than those in the second output-operation restriction mode in the step 515 or drive of electrical loads important for reliability are stopped, or a mode of severely restricting control outputs is selected. Then, the process proceeds to an operation complete step 520.

In the operation complete step 520, other control program is executed. Then, the process returns to the operation start step 503 within a predetermined time, and the subsequent control flow is repeatedly executed. It should be noted that when an error is detected in the RAM memory 123 in the block step 518, "YES" determination is made in the step 514 and the second output-operation restriction mode is selected in the step 515. The step 521 is executed when "NO" determination is made in the step 510 after the power switch 103 is closed. In the step, error occurrence information and learned information, which have been written in the RAM memory 123 during the operation, are transferred to and saved in the data storage area of the program memory 122A. In a subsequent step 522, generation of the watchdog signal WDS is stopped. In a subsequent step 523, the output enabling signal OUTE of the watchdog timer 138 becomes "L" logic level and the power-supply relay exciting coil. 102b is de-energized to open the output contact 102a, as with in the step executed after the "YES" determination of the step 417 in FIG. 4B, whereby feeding of the main power-supply voltage Vb to the electronic control unit 100A is stopped.

Figure 6:
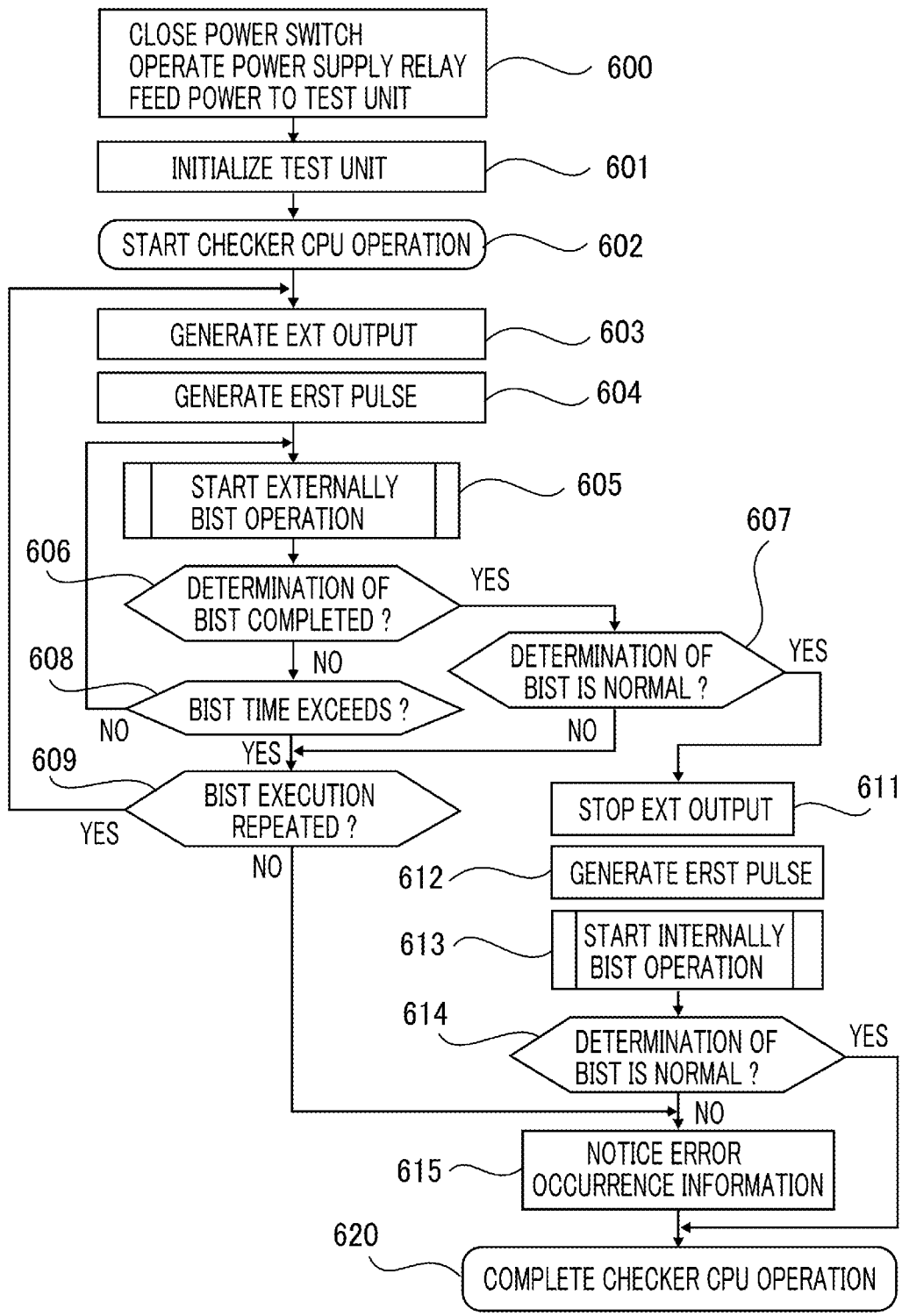
FIG. 6 is a flowchart for explaining the operation of the component test unit for the electronic control unit of FIG. 1.

Next, the operation of the component test unit 300A for the electronic control unit shown in FIG. 1 will be described in detail with reference to FIG. 6 showing an operational flowchart of the test unit and to FIG. 3. Referring to FIG. 6, in a step 600, a power switch, which is not shown in FIG. 3, is closed, and the main power-supply voltage Vb is thereby supplied to the component test unit 300A. In a subsequent step 601, the checker microprocessor 320A is initialized by the fact that the power-on reset circuit 340 shown in FIG. 3 temporarily generates a power-on reset signal POR3 of "L" logic level. In a subsequent step 602, the checker microprocessor 320A starts its operation. In a subsequent step 603, the selection circuits SA1, SA2, SA3 are changed to the positions shown in FIG. 3 by turning the selection command signal EXT to "H" logic level, whereby the second combination of the scan chain circuits 220, 230, 240, 217, 250 is set up. In a subsequent step 604, the retry command signal ERST is generated. Then, the process proceeds to a block step 605. In the subsequent block step 605, the external clock signal ECLK, the second diagnostic pulse-train signal ESCN for the second combination of the scan chain circuits, and the external scan enabling signal ESEN, which are shown in FIG. 3, are generated and supplied to the monitoring and control circuit section 130A to execute the external test. And the scan out signal sent out from the last-stage scan chain circuit 250 is input as the second measurement pulse-train signal EOUT to the measurement pulse input terminal RSCN of the checker microprocessor 320A.

A subsequent step 606 is a determination step, in which it is determined whether or not comparison and determination is completed in accordance with the expected-value comparison means, the control program stored in the program memory 322A. If completed, i.e., "YES" determination is made, the process proceeds to a step 607. If not completed, i.e., "NO" determination is made, the process proceeds to a step 608. The step 607 is a determination step corresponding to the expected-value comparison means, in which it is determined whether or not the comparison and determination result is normal. If determined to be normal, i.e., "YES" determination is made, the process proceeds to a step 611. If determined to be in error, i.e., "NO" determination is made, the process proceeds to a step 609. The step 608 is a determination step, in which it is determined whether or not the external test executed in the block step 605 takes a time exceeding the predetermined threshold time for determining timeout error. If not exceeds the threshold time, i.e., "NO" determination is made, the process returns to a step 605. If exceeds the threshold time, i.e., "YES" determination is made, the process proceeds to a step 609. Note that the threshold time for determining timeout error is set shorter than the boot wait period Tst, the power-on reset time set by the power-on reset circuit 140.

The step 609 is a determination step, in which it is determined whether or not generation of the retry command signal ERST in the step 604 exceeds, for example, 3 times. If not exceed 3 times, i.e., "YES" determination is made, the process returns to the step 603. If exceeds 3 times, i.e., "NO" determination is made, the process proceeds to a step 615. In the step 611 executed when the result of the external test is determined to be normal in the step 607, the selection command signal EXT is turned to "L" logic level to select the self-test mode performed by the BIST control block 210 shown in FIG. 2. In a subsequent step 612, the monitoring and control circuit section 130A is initialized by the generation of the retry command signal ERST, and a self-test equivalent to that executed in the block step 404 shown in FIG. 4A is executed in a subsequent block step 613. A subsequent step 614 is a determination step, in which it is determined whether or not the result of the self-test executed in the block step 613 is normal. If normal, i.e., "YES" determination is made, the process skips to an operation complete step 620. If not normal, i.e., "NO" determination is made, the process proceeds to the step 615. In the step 615, error occurrence information is noticed by a not-shown notice means. Then, the process proceeds to the operation complete step 620.

In the above, the description is made as to the monitoring and control circuit section 130A that is configured with hardware logic circuits having no microprocessor. However, an auxiliary microprocessor that cooperates with a program memory composed of a mask ROM memory, whose program contents therein are not altered, can be substituted for the logic control circuit 131A shown in FIG. 1. In this case, the auxiliary microprocessor and the program memory are equivalent to the main monitoring and control circuit subsection 139A shown in FIGS. 1 and 2, and a self-test or an external test is performed using the first combination of the scan chain circuits 220, 230, 240.

As is apparent from the above description, an electronic control unit having an integrated circuit element, according to the embodiment 1 of the present invention is the electronic control unit 100A that includes the input interface circuits 114b, 115b connected to the input sensors 104b, 105b; the output interface circuit 116b connected to the electrical loads 106b; and at least one integrated circuit element 130A connected with the input interface circuits and the output interface circuit. Further, the integrated circuit element 130A includes the self-test circuit 200 configured with the build-in self-test control block (BIST control block) 210; the scan chain circuits 217, 220, 230, 240, 250, each are made up of a plurality of flip-flop circuits internally or additionally provided to be connected with a plurality of to-be-checked combination of circuit components at the respective fore and aft sides thereof in the integrated circuit element and serially combined with each other; the mask circuitry 260 arranged to connect between the input circuit portions and the output circuit portions of the plurality of circuit components, to disable their input/output operations, and includes the selection command input terminal for receiving the selection command signal EXT for selecting a scan mode. The selection command input terminal receives the selection command signal EXT electing, as a serial combination of the scan chain circuits, the first combination of the scan chain circuits excepting at least the scan chain circuit 217 for the BIST control block 210 and the scan chain circuit 250 for other circuits outside the self-test, or the second combination of the scan chain circuits including all scan chain circuits 217, 220, 230, 240, 250.

The BIST control block 210 includes the scan-pulse output circuit 213 feeding the first diagnostic pulse-train signal BOUT to the front stage of the first combination of the scan chain circuits; the expected-value comparison circuit 215 receiving the first measurement pulse-train signal BIN output from the last stage of the first combination of the scan chain circuits, to determine whether or not the received pulse-train signal agrees with corresponding correct pulse-train information; and the comparison result storing memory 216 storing normality or non-normality of the determination result. And the BIST control block 210 generates the internal-scan enabling signal BSEN enabling the first diagnostic pulse-train signal BOUT. Further, the self-test circuit 200 includes the pulse input terminal for receiving the second diagnostic pulse-train, signal ESCN to be input to the front stage of the second combination of the scan chain circuits; the pulse output terminal for sending out the second measurement pulse-train signal BOUT response to the second diagnostic pulse-train signal ESCN; and the control input terminal for receiving the external scan enabling signal ESEN enabling the second diagnostic pulse-train signal ESCN. The BIST control block 210 is active during the predetermined boot wait period Tst between close of the power switch 103 for feeding power to the integrated circuit element 130A and start of the control operation of the integrated circuit element, and executes the self-test using the first combination of the scan chain circuits 220, 230, 240. During execution of the self-test, acquisition of some input signals from the input interface circuit 115b and generation of some output signals to the output interface circuit 116b are disabled by the mask circuitry 260. Note that the external test for the second combination of the scan chain circuits 217, 220, 230, 240, 250 using the self-test circuit 200 and feed of the second diagnostic pulse-train signal ESCN are executed in the shipment inspection process for the integrated circuit element 130A alone.

The scan-pulse output circuit 213 generates the first diagnostic pulse-train signal BOUT using a pseudorandom number generator employing a deterministic algorithm having reproducibility. The expected-value comparison circuit 215 receives the first measurement pulse-train signal BIN through the compression circuit 214 employing an algorithm typified by "cyclic redundancy check (CRC)", and compares the compressed pulse-train signal BIN with the expected value converted as a comparison reference value from the correct pulse-train information compressed beforehand using the same compression algorithm. As described above, in the BIST control block, the expected-value comparison circuit compares the first measurement pulse-train signal, which is response to the first diagnostic pulse-train signal generated by the scan-pulse output circuit using the pseudorandom number generator, with the compressed value of the correct pulse-train information. Accordingly, this eliminates the need for a storage means for the first diagnostic pulse-train signal and allows the correct information to be fixedly stored as bit pattern information with less number of bits, thus providing an advantageous feature of configuring the BIST control block with small size and low cost.

The BIST control block 210 includes the timeout detection circuit 218. When no comparison and determination result of the expected-value comparison circuit 215 is obtained until the predetermined threshold time for determining timeout error elapses from when scan-pulse output circuit 213 starts generating the first diagnostic pulse-train signal BOUT, the timeout detection circuit 218 stores the timeout error information and the BIST control block 210 finishes the self-test operation within the predetermined repetition of the retry operations. As described above, the BIST control block 210 includes the timeout detection circuit, and stops the self-test operation when the check operation has not been completed within the predetermined period, thus providing an advantageous feature of alternatively detecting an erroneous state by using the timeout error information even when an error happens in the BIST control block itself that is outside the self-test.

The integrated circuit element is separated as the first and the second integrated circuit elements 120A and 130A. The first integrated circuit element 120A constitutes the main control circuit section including the microprocessor 121 driving and controlling, in accordance with the control program in the program memory 122A, the electrical loads 106a, 106b in response to operational states of the input sensors 104a, 105a, 104b, 105b. The second integrated circuit element 130A cooperates with the microprocessor 121, and constitutes the monitoring and control circuit section, including the main monitoring and control circuit subsection 139A detecting the presence or absence of an error in the control of the microprocessor 121, and the plurality of circuit components: the watchdog timer 138 monitoring the pulse width of the watchdog signal WDS generated by the microprocessor 121; the serial-parallel converter 137 serially communicating with the microprocessor 121; and the power-on reset circuit 140 generating the power-on reset signal POR2 for the microprocessor 121. The second integrated circuit element 130A, which is at least one of the separated integrated circuit elements, further includes the self-test circuit 200 configured with the BIST control block 210; the scan chain circuits 220, 230, 240, 250, and 217, which is included in the BIST control block; and the mask circuitry 260, and includes the selection command input terminal for receiving the selection command signal EXT for selecting one of the scan modes.

The BIST control block 210 includes the scan-pulse output circuit 213 feeding the first diagnostic pulse-train signal BOUT to the front stage of the first combination of the scan chain circuits 220, 230, 240 excepting the scan chain circuit 217 for the BIST control block 210 and the scan chain circuit 250 for the power-on reset circuit 140; the expected-value comparison circuit 215 receiving the first measurement pulse-train signal BIN output from the last stage of the first combination of the scan chain circuits 220, 230, 240, to determine whether or not the received pulse-train signal agrees with the corresponding correct pulse-train information; and the comparison result storing memory 216 storing normality or non-normality of the determination result. The BIST control block 210 completes the internal check on the second integrated circuit element 130A using the self-test circuit 200 within the period during which the power-on reset circuit 140 continues generating the power-on reset signal POR2 for the microprocessor 121, and then when the power-on reset signal POR2 is released for the microprocessor 121 to start its control operation, the second integrated circuit element 130A, the monitoring and control circuit section performs monitoring the operation of the first integrated circuit element 120A, the main control circuit section.

As described above, the electronic control unit includes the first integrated circuit element constituting the main control circuit section and the second integrated circuit element constituting the monitoring and control circuit section, and performs the hardware check on the monitoring and control circuit section by the self-test circuit 200 during the period of initializing the microprocessor in the main control circuit section at start of operation, and performs the operation check on the main control circuit section by the checked-out monitoring and control circuit section during operation. Accordingly, by making effective use of the initialization period before the main control circuit section generates control outputs, the hardware check is performed on the monitoring and control circuit section, thus bringing about the advantageous effect of not prolonging the time required for boot up. Furthermore, the hardware check is performed every time the power switch is powered-on, bringing about the advantageous effect of enhancing reliability. In addition, the power-on reset circuit included in the second integrated circuit element is outside the self-test. This provides an advantageous feature of measuring a boot-up elapsed time during the self-test.

The BIST control block 210 includes the timeout detection circuit 218. The timeout detection circuit 218 stores the timeout error information when no comparison and determination result of the expected-value comparison circuit 215 obtained until the predetermined threshold time for determining timeout error elapses from when the scan-pulse output circuit 213 starts generating the first diagnostic pulse-train signal BOUT. The predetermined threshold time for determining timeout error is set shorter than the boot wait period Tst for the power-on reset signal POR2 generated by the power-on reset circuit 140. Hence, when a timeout error occurs within the threshold time, the self-test operation executed by the BIST control block 210 is stopped. The microprocessor 121 starts the control operation by the fact that the power-on reset signal POR2 is released, and reads out the presence or absence of the timeout error and the presence or absence of an error in the comparison and determination result. When a normal reply is not obtained, i.e., a timeout error information or a comparison and determination error is stored, generation of the retry command signal ERST is repeated within the predetermined limit times. The BIST control block 210, on receiving the retry command signal ERST, initializes and reboots the power-on reset circuit 140, and generates the first diagnostic pulse-train signal BOUT to execute again the self-test. When the comparison result storing memory 216 does not yet change to normal comparison and determination although generation of the retry command signal ERST is repeated the predetermined times or when a timeout error occurs, the microprocessor 121 sends error notice, and then aborts the control operation or shifts to the second output-operation restriction mode to start the control operation.

As described above, when the BIST control block detects an error in a comparison result or a timeout error or when no normal reply is obtained, the microprocessor generates the retry command signal, and when an error is still continued for the predetermined repetition of the retry commands, the microprocessor aborts the operation or shifts to a predetermined output-operation restriction mode to start the operation. Thus, the main control circuit section can recognize the normal state or an erroneous state of the monitoring and control circuit section at the beginning of the operation and can perform a relevant control operation. In addition, the number of generations of the retry command signal can be easily adjusted as a control constant in the nonvolatile program memory. This provides an advantageous feature of alleviating loads on the hardware of the BIST control block.

As is apparent from the above description, a component test unit for an integrated circuit element, according to the embodiment 1 of the present invention is the component test unit 300A that includes the checker microprocessor 320A and the integrated circuit element 130A detachably connected with the checker microprocessor and applied, as a to-be-tested integrated circuit element, to the electronic control unit 100A including the input interface circuits 114*b*, 115*b* connected to the input sensors 104*b*, 105*b*, the output interface circuit 116*b* connected to the electrical loads 106*b*, and at least one integrated circuit element 130A connected with the input interface circuits and the output interface circuit. Further, the integrated circuit element 130A includes the self-test circuit 200 configured with the build-in self-test control block (BIST control block) 210; the scan chain circuits 217, 220, 230, 240, 250, each are made up of the plurality of flip-flop circuits internally or additionally provided to be connected with a plurality of to-be-checked combination of circuit components at the respective fore and aft sides thereof in the integrated circuit element and serially combined with each other; the mask circuitry 260 arranged to connect between the input circuit portions and the output circuit portions of the plurality of circuit components, to disable their input/output operation, and includes the selection command input terminal for receiving the selection command signal EXT for selecting a scan mode.

The selection command input terminal receives the selection command signal EXT selecting, as a serial combination of the scan chain circuits, the first combination of the scan chain circuits excepting at least the scan chain circuit 217 for the BIST control block 210 and the scan chain circuit 250 for other circuits outside the self-test, or the second combination of the scan chain circuits including all scan chain circuits 217, 220, 230, 240, 250. The BIST control block 210 includes the scan-pulse output circuit 213 feeding the first diagnostic pulse-train signal BOUT to the front stage of the first combination of the scan chain circuits; the expected-value comparison circuit 215 receiving the first measurement pulse-train signal BIN output from the last stage of the first combination of the scan chain circuits, to determine whether or not the received pulse-train signal agrees with the corresponding correct pulse-train information; the comparison result storing memory 216 storing normality or non-normality of the determination result. And the BIST control block 210 generates the internal-scan enabling signal BSEN enabling the first diagnostic pulse-train signal BOUT.

Further, the self-test circuit 200 includes the pulse input terminal for receiving the second diagnostic pulse-train signal ESCN to be input to the front stage of the second combination of the scan chain circuits; the pulse output terminal for sending out the second measurement pulse-train signal EOUT response to the second diagnostic pulse-train signal ESCN and the control input terminal for receiving the external scan enabling signal ESEN enabling the second diagnostic pulse-train signal ESCN. The selection command input terminal is set, fixedly in advance or by the selection command signal EXT generated by the checker microprocessor 320A, to select the mode in which all scan chain circuits 217, 220, 230, 240, 250 are put into the second combination of the scan chain circuits. In this mode, the checker microprocessor 320A generates the second diagnostic pulse-train signal ESCN to feed it to the integrated circuit element 130A, and then receives the second measurement pulse-train signal EOUT obtained from the integrated circuit element 130A to determine, in accordance with the expected-value comparison means 607, whether or not the received pulse-train signal agrees with the corresponding second correct pulse-train information. The self-test for the first combination of the scan chain circuits 220, 230, 240 and feed of the first diagnostic pulse-train signal BOUT are performed in the state in which the integrated circuit element 130A is built in the electronic control unit 100A.

The checker microprocessor 320A cooperates with the program memory 322A. The second diagnostic pulse-train signal ESCN, which is composed of a train of binary data generated by the checker microprocessor 320A and stored in the numerical data setting area of the program memory 322A, is bitwise sent out sequentially from the most significant bit or the least significant bit in synchronism with the external clock signal ECLK. The second correct pulse-train information is composed of a train of binary data having the same number of bits as the second diagnostic pulse-train signal ESCN and the second measurement pulse-train signal EOUT, and stored in the numerical data setting area of the program memory 322A. Further, the checker microprocessor 320A compares, in accordance with the expected-value comparison means 607, i.e., the control program stored in the program memory 322A, the second measurement pulse-train signal EOUT with the second correct pulse-train information, to detect the presence or absence of disagreement in the comparison and to locate the position where the disagreement occurs. As described above, the second diagnostic pulse-train signal generated by the checker microprocessor and the corresponding correct pulse-train information for the second measurement pulse-train signal are binary data having the same number of bits stored in the program memory cooperating with the checker microprocessor. Thus, the second diagnostic pulse-train signal can be created on the basis of a preferred test pattern generated not using a random generator but using an automatic test-pattern generation (ATPG) technique, as well as without using a compression circuit. This provides an advantageous feature of pinpointing the location of occurrence of an error.

The checker microprocessor 320A changes the selection command signal EXT to be input to the BIST control block 210 to configure the scan chain circuits into the first combination, and performs the self-test using the first diagnostic pulse-train signal BOUT generated by the BIST control block 210 to determine the self-test circuit 200 to be normal or in error by monitoring normality or non-normality of the determination result of the expected-value comparison circuit 215. As described above, the checker microprocessor performs the external test using the second diagnostic pulse-train signal and subsequently performs the self-test using the first diagnostic pulse-train signal generated by the BIST control block. Thus, in the external test, the hardware of the BIST control block can be checked using the scan chain circuits relevant thereto, with the BIST control block not being in operation; and in the self-test, the BIST control block can be checked whether or not it normally operates. This provides an advantageous feature of performing the functional check of the BIST control block.

Embodiment 2

Figure 7:
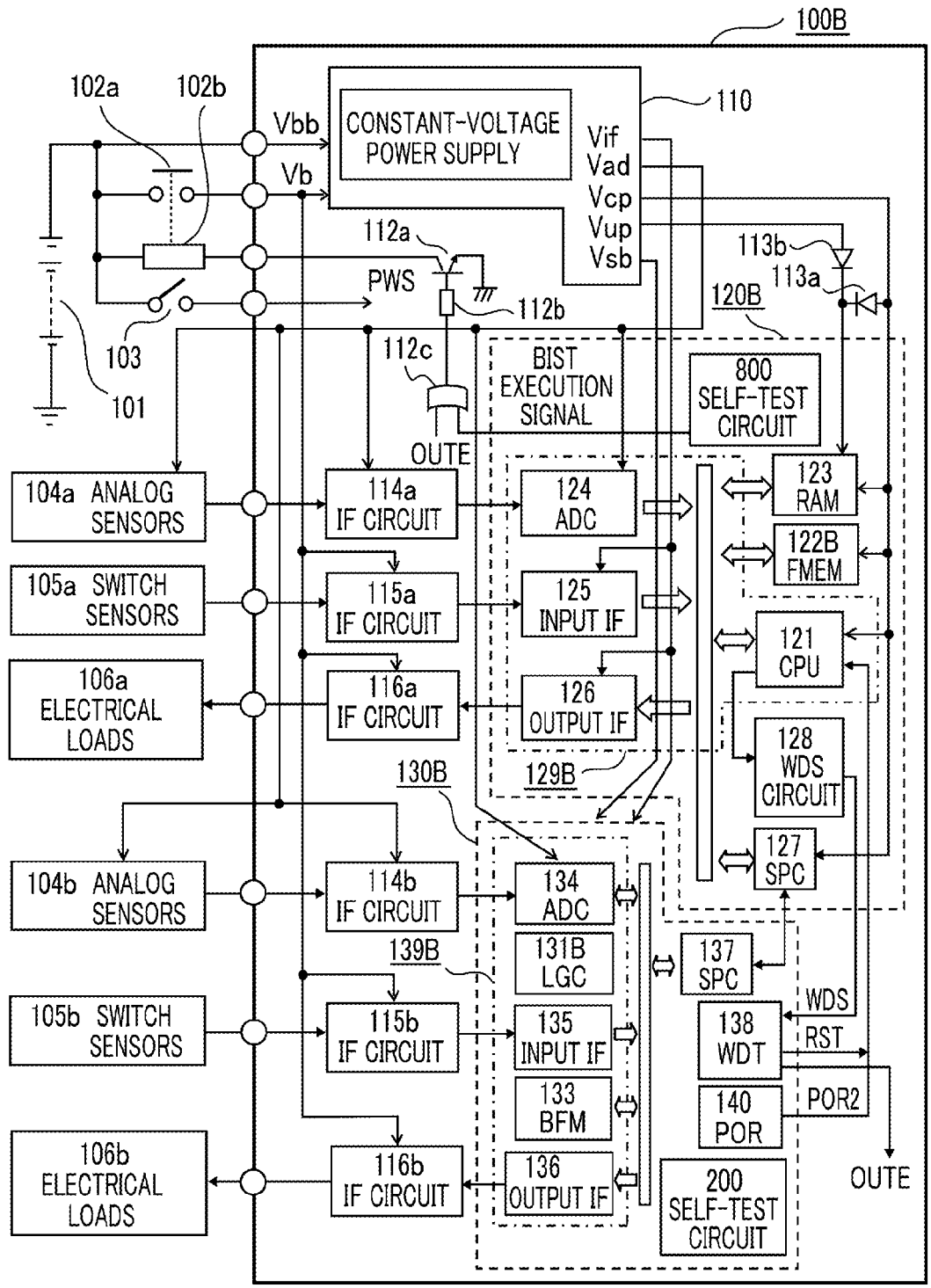
FIG. 7 is an overall configuration diagram of an electronic control unit having integrated circuit elements, according to an embodiment 2 of the present invention.

The configuration of an electronic control unit 100B according to an embodiment 2 of the present invention will be described in detail below focusing an differences from that in FIG. 1, with reference to FIG. 7 showing an overall configuration diagram of the electronic control unit. Major differences between FIG. 1 and FIG. 7 are that an integrated circuit element subject to a self-test is a main control circuit section 120B and scan chain circuits outside the self-test are therefore changed; furthermore, the self-test is performed immediately after completion of the operation and a retry operation is therefore executed by a build-in self-test control block (BIST control block). Referring to FIG. 7, the electronic control unit 100B is mainly constituted with the above-described constant-voltage power supply circuit 110; the main control circuit section 120B that is the first integrated circuit element; and a monitoring and control circuit section 130B that is the second integrated circuit element. As with FIG. 1, the external power supply 101, the power supply relay, the input sensors 104a, 105a, 104b, 105b, and the electrical loads 106a, 106b are externally connected to the electronic control unit 100B; and the input interface circuits 114a, 115a, 114b, 115b and the output interface circuits 116a, 116b are internally connected with the electronic control unit 100B.

The first integrated circuit element 120B includes the microprocessor 121, a nonvolatile program memory 122B, the RAM memory 123 for computational processing, the multi-channel AD converter 124, the internal input interface circuit 125, the internal output interface circuit 126, the serial-parallel converter 127, the watchdog signal circuit 128, and a self-test circuit 800 that is later described with reference to FIGS. 8 and 9. Note that the microprocessor 121, the multi-channel AD converter 124, the internal input interface circuit 125, and the internal output interface circuit 126 constitute a main computational control circuit subsection 129B. In addition, part of the region in the nonvolatile program memory 122B, which is a flash memory (FMEM), is used as a nonvolatile data memory. The second integrated circuit element 130B includes a main monitoring and control circuit subsection 139B that are configured with a logic-control circuit 131B made up of a hardware-logic circuit or the auxiliary microprocessor, the buffer memory 133, the second multi-channel AD converters 134, the internal input interface circuit 136, and the internal output interface circuit 136. The second integrated circuit element 130B is serially connected with the microprocessor 121 through the serial-parallel converters 127, 137. Through the serial connection, digital values converted from analog signals obtained from the second analog sensor 104b and on/off signals obtained from the second switch sensors 105b are transmitted to the microprocessor 121 as well as output control signals generated by the microprocessor 121 are transmitted to the second electrical loads 106b to drive them.

The second integrated circuit element 130B further includes the watchdog timer 138 receiving the watchdog signal WDS generated by the microprocessor 121 and generating the reset pulse signal RST when the pulse width of the watchdog signal WDS becomes the predetermined value or more, to initialize and reboot the microprocessor 121; and the power-on reset circuit 140 generating the power-on reset signal POR2 at the time of power-on, to initialize and boot up the microprocessor 121 within a predetermined boot wait period Tst. In addition, the second integrated circuit element 130B preferably includes the self-test circuit 200 described above with reference to FIGS. 2 and 3, but may not include the self-test circuit 200. While current for the power-supply relay exciting coil 102b is fed through an energizing transistor 112a in response to the power supply switch signal PWS indicating detection of closure of the power switch 103, when the watchdog timer 138 generates the output enabling signal OUTE, the exciting coil 102b is continuously energized by the energizing transistor 112a through the drive resistor 112b, even when the power switch 103 becomes opened, to keep closure of the output contact 102a until the microprocessor 121 is halted and the watchdog signal WDS is stopped. It should be noted here that the self-test circuit 800 provided in main control circuit section 120B generates the BIST-execution indicating signal after the watchdog signal WDS is stopped, to drive the energizing transistor 112a for the power-supply relay exciting coil 102b to self-hold it through a logical OR circuit 112c.

Figure 8:
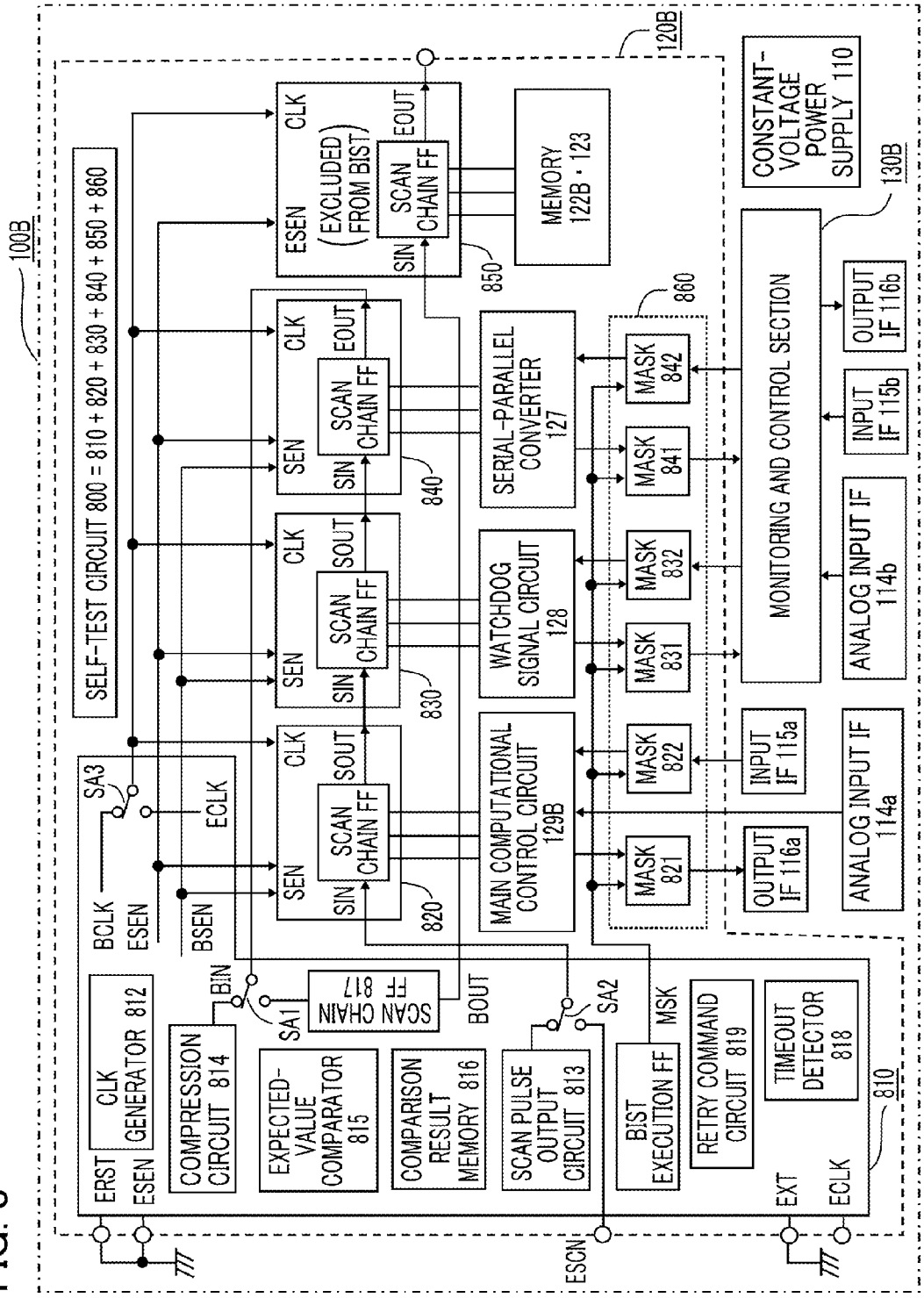
FIG. 8 is a detailed block diagram of a self-test circuit of the electronic control unit of FIG. 7.

Next, the self-test circuit 800 for the electronic control unit shown in FIG. 7 will be described in detail focusing on differences from that in FIG. 2, with reference to FIG. 8 showing a detailed block diagram of the self-test circuit. A major difference between FIG. 2 and FIG. 8 is that the self-test circuit 800 is provided in the main control circuit section 120B as shown in FIG. 8 instead of the self-test circuit 200 provided in the monitoring and control circuit section 130A as shown in FIG. 2. The reference numerals of the eight hundreds affixed to the self-test circuit 800 are substituted for those of the two hundreds affixed to the self-test circuit 200. The same corresponding reference numerals refer to the same or equivalent components. Referring to FIG. 8, the electronic control unit 100B includes the foregoing constant-voltage power supply circuit 110; the main control circuit section 120B, i.e., the first integrated circuit element; the monitoring and control circuit section 130B, i.e., the second integrated circuit element; the input interface circuits 114a, 114b, 115a, 115b; and the output interface circuits 116a, 116b. These are mounted on a not-shown single circuit board contained in a gastight housing and connected with each other. The electronic control unit 100B is also connected, as shown in FIG. 7, to the power supply circuit, and the input sensors and the electrical loads through not-shown connectors provided to the circuit board. As shown also in FIG. 7, the main control circuit section 120B includes a memory part made up of a program memory 122B and the RAM memory 123 for computational processing, the serial-parallel converter 127, the watchdog signal circuit 128, the main computational control circuit subsection 129B, and the self-test circuit 800. The self-test circuit 800 is configured with a built-in self-test control block (BIST control block) 810 including a scan chain circuit 817, scan chain circuits 820, 830, 840, 850, and mask circuitry 860. Their details are described below with reference to FIGS. 7 and 8.

First, the items of the mask circuitry 860 is described. A mask circuit 821 is connected between the internal output interface circuit 126 in the main computational control circuit subsection 129B and the output interface circuit 116a on the circuit board, and puts the electric loads 106a into the drive disabled states when the input/output disabling signal MSK is input. Also, a mask circuit 822 is connected between the internal output interface circuit 125 in the main computational control circuit subsection 129B and the input interface circuit 115a on the circuit hoard, and disables input from the switch sensors 105a by fixing the signal level of the mask circuit to, for example, "L" logic level when the input/output disabling signal MSK is input. Note that the functions of the internal output interface circuit 126 and the internal input interface circuit 125 of FIG. 7 may be respectively added to the mask circuit 821 and the mask circuit 822. Likewise, a mask circuit 831 disables output of the watchdog signal WDS, a mask circuit 832 disables input of the reset pulse signal RST and input of the power-on reset signal POR2 generated by the monitoring and control circuit section 130B, a mask circuit 841 disables output of a downstream signal generated by the serial-parallel converter 127 to be sent to the monitoring and control circuit section 130B, and a mask circuit 842 disables input of an upstream signal to be input to the serial-parallel converter 127 from the monitoring and control circuit section 130B.

The scan chain circuit 820 is configured with shift registers made up of a plurality of flip-flop circuits that are provided at the respective fore and aft sides of a plurality of to-be-checked combination of circuit components in the main computational control circuit subsection 129B and serially combined with each other. The scan chain circuit 830, the scan chain circuit 840, the scan chain circuit 850, and the scan chain circuit 817 are similarly configured and are for the watchdog signal circuit 128, the serial-parallel converter 127, the memory part made up of the program memory 122B and the RAM memory 123 for computational processing, and for the later-described BIST control block 810, respectively. However, the scan chain circuits 820, 880, 840 do not need to be provided separately for each of functional blocks: the main computational control circuit subsection 129B, the watchdog signal circuit 128, and the serial-parallel converter 127, but may be combined as a first combination of the scan chain circuits. Likewise, the scan chain circuits 817, 850 may be combined as scan chain circuits outside the self-test.

Next, the internal configuration of the BIST control block 810 is described, in which the internal-scan enabling signal BSEN becomes enable at the time when the microprocessor 121 turns off the watchdog signal WDS after finishes the saving process in the step 521 shown in FIG. 5B by the fact that the power switch 103 is opened, and the BIST execution indicating flip-flop circuit, which is a flip-flop circuit provided in the BIST control block 810, stores the BIST execution indicating signal. Note that the BIST execution indicating flip-flop circuit is a flip-flop circuit that is set by stop of generation of the watchdog signal WDS or the later-described retry command signal ERST and is reset by completion of expected-value comparison or timeout determination, which are later described, and control operation of the main computational control circuit subsection 129B is stopped during execution of BIST. When the BIST execution indicating signal is stored, a clock signal generation circuit 812 generates the internal clock signal BCLK having the predetermined frequency. A scan-pulse output circuit 813 becomes active when the internal-scan enabling signal BSEN is in "H" logic level of the enabling state, and generates the first diagnostic pulse-train signal BOUT in synchronism with the internal clock signal BCLK to provide a scan-in signal SIN to the scan chain circuit 820. In addition, the scan-pulse output circuit 813 uses a pseudorandom number generator employing, for example, a deterministic algorithm having reproducibility. A scan-out signal SOUT generated by the scan chain circuit 820 is a scan-in signal SIN for the subsequent scan chain circuit 830, a scan-out signal. SOUT generated by the scan chain circuit 830 is a scan-in signal SIN for the subsequent scan chain circuit 840, and a scan-out signal SOUT generated by the scan chain circuit 840 is input as a first measurement pulse-train signal BIN to the BIST control block 810.

A compression circuit 814 calculates the remainder of division of the received first measurement pulse-train signal BIN by, for example, a predetermined value to generate a compressed value of the measurement result. An expected-value comparison circuit 815 compares the compressed measurement-result value obtained from the compression circuit 814 with an expected value obtained by compressing correct information corresponding to the sent first diagnostic pulse-train signal BOUT, to determine the comparison result to be normal when both compressed values agree with each other or to be in error when they disagree with each other, and then stores the comparison result in a comparison result storing memory 816. A timeout detection circuit 818 stores timeout error information when no comparison and determination result of the expected-value comparison circuit 815 is obtained until the predetermined determination time elapses. A retry command circuit 819 repeats generation of the retry command signal ERST within the predetermined limit times to execute the self-test again, when the expected-value comparison circuit 815 determines the comparison result to be in error or the timeout detection circuit 818 detects a timeout error. When no normal determination is obtained within the predetermined repetition of the retries, the self-test is finished and the state of the error occurrence is stored in the comparison result storing memory 816. Note that the BIST execution indicating flip-flop circuit that has stored the BIST execution indicating signal by the fact that the watchdog signal WDS is stopped, is reset when the normal comparison result is stored in the comparison result storing memory 816 or when no normal determination result is still obtained by execution of the self-test repeated by the retry command circuit 819 within the predetermined times, and then the BIST execution indicating signal is released.

The BIST control block 810 is provided with a not-shown pulse counter, whereby the control block turns temporarily the internal-scan enabling signal BSEN to "L" logic level when the number of pulses in the first diagnostic pulse-train signal BOUT generated by the scan-pulse output circuit 813 becomes equal to the total number of flip-flop circuits in the first combination of the scan chain circuits 820, 830, 840. In this way, turning the internal-scan enabling signal BSEN to "H" logic level of the enabling state permits the scan-in mode, in which the first diagnostic pulse-train signal BOUT is scanned-in in synchronism with the internal clock signal BCLK and then diagnostic information is input to each flip-flop circuit constituting the shift register. Then, turning the internal-scan enabling signal BSEN to "L" logic level of the disabling state permits the capture mode, in which outputs of the combination circuits for the diagnostic information are captured into the flip-flop circuits on input of the internal clock signal BCLK in the capture mode. Turning again the internal-scan enabling signal BSEN to "H" logic level of the enabling state permits the scan-out mode, in which the information in the shift registers is sent out as the first measurement pulse-train signal BIN in synchronism with the internal clock signal BCLK.

Current value of the pulse counter, which has been incremented during the scan-in mode, is then decremented in the scan-out mode. When the current value becomes zero, the expected-value comparison circuit 815 performs the comparison and determination. During the period of the internal check performed on the main control circuit section 120B in this way by the self-test circuit 800, the memory part made up of the program memory 122B and the RAM memory 123 for computational processing is outside the internal check, whereby a self-test result is prevented from being in error due to a memory content erroneously rewritten or having been rewritten by the self-test.

The BIST control block 810 is further provided with the selection command input terminal for receiving a selection command signal EXT and the selection circuits SA1, SA2, SA3. When the selection command signal EXT input to the selection command input terminal is, for example, "L" logic level, the BIST control block 810 goes into a self-test mode, in which the selection circuits SA1, SA2, SA3 form a scan signal loop shown in FIG. 8 and the BIST control block 810 performs a self-test for the first combination of the scan chain circuits 820, 830, 840. Note that while the BIST execution indicating signal is active, the input/output disabling signal MSK is kept at "H" logic level to put all mask circuitry 860 into the input/output disabled state. This prevents the electrical loads 106a from being driven and the self-test from being determined to be in error due to operational state change of the switch sensors 105*a*. When the selection command signal EXT input to the selection command input terminal is turns to, for example, "H" logic level, the BIST control block 810 goes into an external-test mode later described with reference to FIG. 13, in which a second diagnostic pulse-train signal ESCN is input to the pulse input terminal and the external scan enabling signal ESEN is input to the control input terminal. Moreover, the external clock signal ECLK is selected instead of the internal clock signal BCLK by the selection circuit SA3. Note that in the self-test mode, the selection command input terminal for receiving the selection command signal EXT and the control input terminal for receiving the external scan enabling signal ESEN are fixed at "L" logic level, and the pulse input terminal for receiving the second diagnostic pulse-train signal ESCN is fixed at the open state or "L" logic level.

Figure 9:
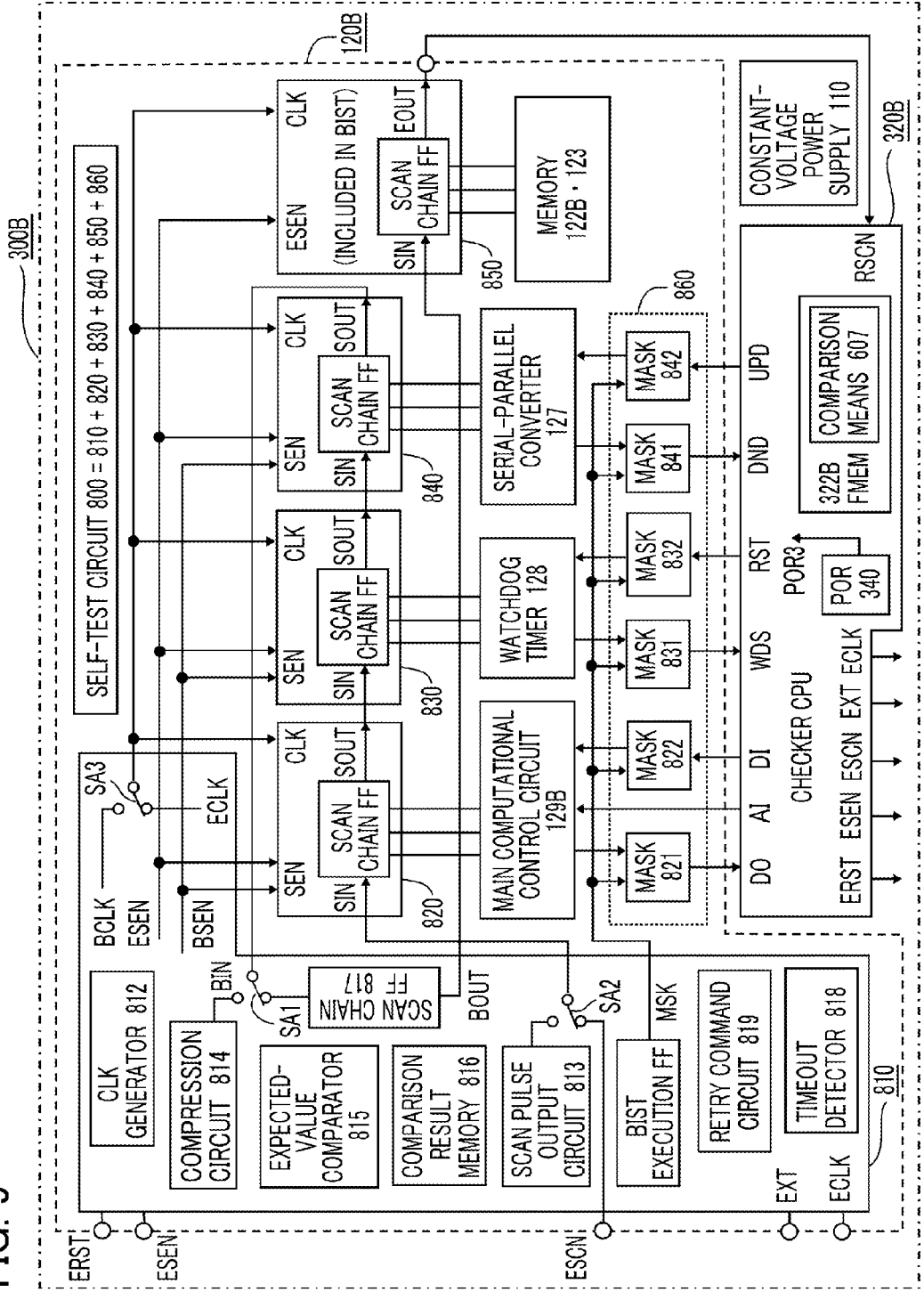
FIG. 9 is an overall configuration diagram of a component test unit for the electronic control unit of FIG. 7.

Next, the configuration of a component test unit 300B for the electronic control unit shown in FIG. 7 will be described in detail focusing on differences from that of FIG. 3, with reference to FIG. 9 showing an overall configuration diagram of the component test unit. Referring to FIG. 9, the component test unit 300B includes the foregoing constant-voltage power supply circuit 110; the main control circuit section 120B, the first integrated circuit element to be checked; and a checker microprocessor 320B. These are mounted on a not-shown circuit board. The main control circuit section 120B is detachable through a not shown connector. The component test unit 300B is externally connected to the not-shown external power supply through the power supply switch, but is not connected to the input sensors and the electric loads shown in FIG. 7. The checker microprocessor 320B serves as substitution for these input sensors and electric loads. The checker microprocessor 320B is initialized by the built-in power-on reset circuit 340, and then sends the external scan enabling signal ESEN, the second diagnostic pulse-train signal ESCN, the selection command signal EXT, and the external clock signal ECLK to the respective terminals provided to the BIST control block 810 of the to-be-tested integrated circuit element. In starting the external test, the checker microprocessor 320B also sends the retry command, signal ERST. It should be noted that when no self-test is performed for the main control circuit section 120B by the component test unit 300B, the selection command signal EXT may be fixed at "H" logic level.

When performing the external test, the selection command signal EXT of "H" logic level is sent to the selection command input terminal, whereby the selection circuits SA1, SA2, SA3 in the BIST control block 810 are switched to the connection positions shown in FIG. 9. Thus, the second diagnostic pulse-train signal ESCN sent to the pulse input terminal from the checker microprocessor 320B is input as the second measurement pulse-train signal EOUT to the measurement pulse input terminal RSCN of the checker microprocessor 320B by way of the scan chain circuits 820, 830, 840, 817, 850 from the pulse output terminal. Moreover, the external clock signal ECLK is selected instead of the internal clock signal BCLK by the selection circuit SA3. Note that when the selection command signal EXT is at "H" logic level, the clock signal generation circuit 812, the scan-pulse output circuit 813, the compression circuit 814, the expected-value comparison circuit 815, the comparison result storing memory 816, the timeout detection circuit 818, and the retry command circuit 819 are initialized and are in the disabled states; thus allowing a condition ready to perform the scan test using the scan chain circuit 817. Likewise, the memory part made up of the program memory 122B and the RAM memory 123 for computational processing is also initialized and is in the disabled state; thus allowing a condition ready to perform the scan test using the scan chain circuit 850 for the memory part.

The second diagnostic pulse-train signal ESCN sent to the pulse input terminal from the checker microprocessor 320B is input to the scan chain circuit 820 in synchronism with the external clock signal ECLK by the fact that the external scan enabling signal ESEN is turned to "H" logic level. A scan out signal SOUT generated by the scan chain circuit 820 is a scan-in signal SIN for the subsequent scan chain circuit 830, a scan-out signal SOUT generated by the scan chain circuit 830 is a scan-in signal SIN for the subsequent scan chain circuit 840, a scan-out signal SOUT generated by the scan chain circuit 840 is a scan-in signal SIN far the scan chain circuit 817 in the BIST control block 810, a scan-out signal SOUT generated by the scan chain circuit 817 is a scan-in signal SIN for the subsequent scan chain circuit 850, and a scan-out signal SOUT generated by the scan chain circuit 850 is input as the second measurement pulse-train signal EOUT to measurement pulse input terminal RSCN of the checker microprocessor 320B.

The checker microprocessor 320B is provided with the pulse counter that is configured with a control program in a cooperative program memory 322B, and turns temporarily the external-scan enabling signal BSEN to "L" logic level when the number of pulses in the second diagnostic pulse-train signal ESCN having been sent becomes equal to the total number of flip-flop circuits in a second combination of the scan chain circuits 820, 830, 840, 817, 850. In this way, turning the external-scan enabling signal ESEN to "H" logic level of the enabling state permits the scan-in mode, in which the second diagnostic pulse-train signal ESCN is scanned-in in synchronism with the external clock signal ECLK and then diagnostic information is input to each flip-flop circuit constituting the shift register. Then, turning the external-scan enabling signal ESEN to "L" logic level of the disabling state permits the capture mode, in which outputs of the combination circuits for the diagnostic information are captured into the flip-flop circuits on input of the internal clock signal BCLK. Turning again the external-scan enabling signal ESEN to "H" logic level of the enabling state permits the scan-out mode, in which the information in the shift registers is sent out as the second measurement pulse-train signal EOUT in synchronism with the external clock signal ECLK.

Current value of the pulse counter, which has been incremented during the scan-in mode, is then decremented in the scan-out mode. When the current value becomes zero, the comparison and determination is made in accordance with the expected.value comparison means 607. The expected-value comparison means 607 is a control program included in the program memory 322B. The checker microprocessor 320B cooperates with the program memory 322B and compares, in accordance with the expected-value comparison means 607, the received second measurement pulse-train signal EOUT with correct information corresponding to the second diagnostic pulse-train signal ESCN having been sent, to determine the comparison to be normal when both agree with each other or to be in error when they disagree with each other. The second diagnostic pulse-train signal ESCN generated by the checker microprocessor 320B, which is composed of a train of binary data stored in a numerical data setting area of the cooperative program memory 322B, is bitwise sent out sequentially from the least significant bit or the most significant bit in synchronism with the external clock signal ECLK. In addition, the second correct pulse-train information is composed of binary data having the same number of bits as the second diagnostic pulse-train signal ESCN and the second measurement pulse-train signal EOUT, and stored in the numerical data setting area of the program memory 322B. Note that when no comparison and determination result in accordance with the expected-value comparison means 607 is obtained until a predetermined determination time elapses, the checker microprocessor 320B determines it as a timeout error, and repeats a plurality of retry operations by generating the retry command signal ERST, and then detects the presence or absence of an error.

The component test unit 300B can also perform a check on functions of the BIST control block 810 by putting the to-be-tested integrated circuit element into the self-test mode by turning the selection command signal EXT to "L" logic level. In addition, by adding a function check program into the program memory 322B of the component test unit 300B and into the program memory 122B of the main control circuit section 120B, various function checks can be performed for the main control circuit section 120B with the selection command signal EXT being in "L" logic level after a self-test for the main control circuit section 120B is completed. For example, sending a load drive command from the checker microprocessor 320B through the serial-parallel converter 137 to the main control circuit section 120B to acquire a load drive signal generated by the internal output interface circuit 126 into the checker microprocessor 320B allows determination as to whether or not an expected output signal is obtained. At this time if enabling or disabling of the mask circuitry 860 is put to be controllable, output disabling operation of the mask circuitry 860 can be checked. Likewise, sending a sensor emulation signal from the checker microprocessor 320B to the internal input interface circuit 125 through the multi-channel AD converter 124 to acquire a signal generated by the interface circuit into the checker microprocessor 320B through the serial-parallel converter 127 allows determination as to whether or not an expected input signal is obtained. At this time, if enabling or disabling of the mask circuitry 860 is put to be controllable, input disabling operation of the mask circuitry 860 can be checked.

Figure 10A:
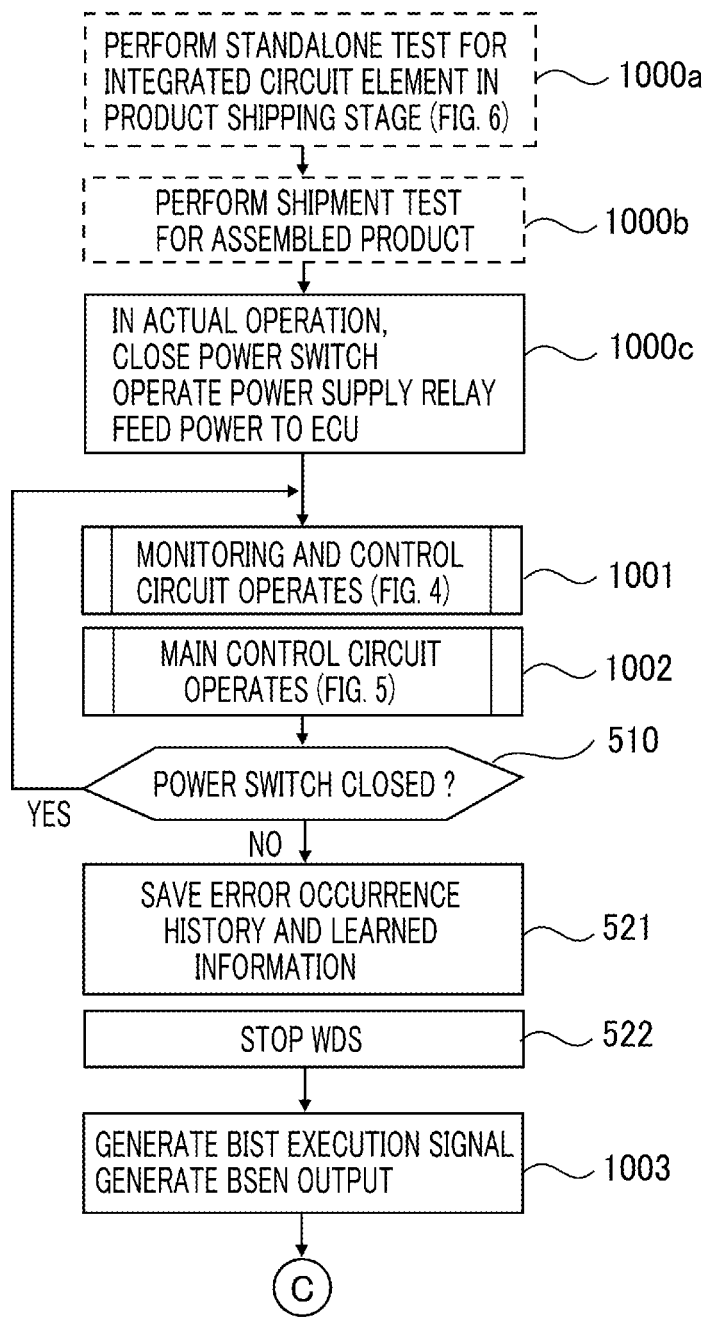
FIG. 10A is a flowchart for explaining the first half of overall operation of the electronic control unit of FIG. 7.
Figure 10B:
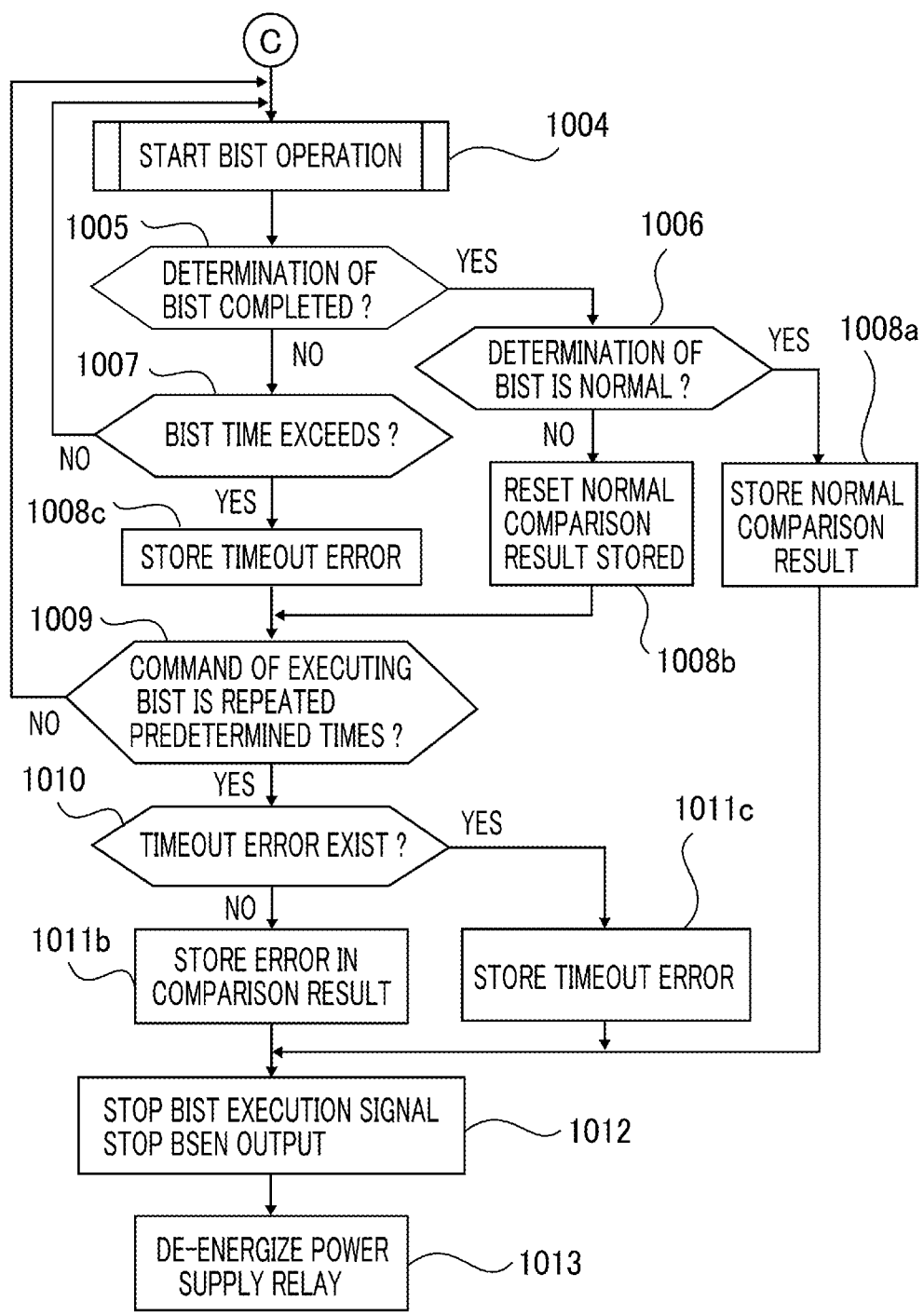
FIG. 10B is a flowchart for explaining the latter half of overall operation of the electronic control unit of FIG. 7.

Next, the overall operation of the electronic control unit 100B configured as shown in FIG. 7 will be described with reference to FIGS. 10A and 10B showing a flowchart for explaining the operation. First, the outline of the overall operation will be described with reference to FIG. 7. When the power switch 103 is closed, the power-supply relay exciting coil 102b is energized to close the output contact 102a, whereby the main power supply voltage Vb is applied to electronic control unit 100B and then constant-voltage power supply circuit 110 generates the predetermined stabilized voltages of the first to the fourth output voltages Vad, Vif, Vcp, and Vsb. Note that the fifth output voltage Vup, which is stepped down from the backup power-supply voltage Vbb directly supplied from the external power supply 101 and thereby kept always at the predetermined stabilized voltage even while the power-supply-relay output contact 102a is opened, is fed to the entire area of the RAM memory 123 or part of its area that needs a battery backup.

The power-on reset circuit 140 in the monitoring and control circuit section 130B keeps the power-on reset signal POR2 at "L" logic level until the predetermined boot wait period Tst elapses after the second output voltage Vif is generated, to disable output generation of the microprocessor 121 in the main control circuit section 120B. Within this period, the self-test is performed for the first combination of the scan chain circuits. When the power-on reset signal POR2 turns to "H" logic level in due course of time, started are the input/output control operation by the main control circuit section 120B and the monitoring and control operation by the monitoring and control circuit section 130B. That is, the microprocessor 121 generates the watchdog signal WDS and the watchdog timer 138 generates the output enabling signal OUTE when the pulse width of the watchdog signal WDS is smaller than the predetermined value, whereby the internal output interface circuits 126, 136 are enabled to generate control outputs and at the same time the energizing transistor 112a is driven to energize and self-hold the power-supply relay exciting coil 102b. The main control circuit section 120B being in operation drives and controls, in accordance with the contents of the control program in the program memory 122B, the electrical loads 106a, 106b in response to the operational states of the analog sensors 104a, 104b and the switch sensors 105a, 105b. Communication of input/output signals with the analog sensors 104b, the switch sensors 105b and the electrical loads 106b is performed through the serial-parallel instead converters 127, 137. Note that it is possible to eliminate the communication of input/output signals with the analog sensors 104b, the switch sensors 105b and the electrical loads 106b connected to the monitoring and control circuit section 130B side and instead to perform the communication by connecting all their inputs/outputs directly to the main control circuit section 120B.

During operation, the monitoring and control circuit section 130B monitors the watchdog signal WDS of the watchdog timer 138 and periodically sends questionnaire information to the main control circuit section 120B to check whether or not the main control circuit section 120B normally operates by comparing answer information replied from the main control circuit section 120B with correct information. When the power switch 103 is opened during the check, the microprocessor 121 transfers learned information and error occurrence information that have been written in the RAM memory 123 to a data storage area of the program memory 122B to save them, and then stops generation of the watchdog signal WDS. Consequently, the self-holding energization of the power supply relay sustained by the output enabling signal OUTE is released, but the power supply relay still continues to operate by the BIST execution indicating signal generated in the main control circuit section 120B. Then, the BIST execution indicating signal is released at the time when the self-test for the main control circuit section 120B, whereby the power-supply-relay output contact 102a becomes opened.

Next, the overall operation of the electronic control unit 100B shown in FIG. 7 will be described in detail with reference to FIGS. 10A and 10B for explaining a flowchart of the operation and to FIGS. 4 through 9. Referring to FIGS. 10A and 10B, a step 1000a shows component test steps for the main control circuit section 120B, the first integrated circuit element in the product shipping stage, in which the external test is performed by the component test unit 300B shown in FIG. 9. The operational flow of the monitoring and control circuit section 130A shown in FIG. 6 can be applied to that of the component test unit 300B without modification. In a subsequent step 1000b, the main control circuit section 120B and the monitoring and control circuit section 130B, the first and the second integrated circuit elements, are assembled to the electronic control unit 100B and the shipment inspection is performed for the assembled product. In a subsequent step 1000c, the power switch 103 is closed to feed the main power-supply voltage Vb through the power-supply-relay output contact 102a in the actual operation stage of the electronic control unit 100B.

A subsequent step 1001 is a control operation block of the monitoring and control circuit section 130B. When the monitoring and control circuit section 130B has the self-test circuit 200, the control operations are the same as those shown in FIGS. 4A and 4a A subsequent step 1002 is a control operation block of the main control circuit section 120B, and the control operations are the same as those of the main control circuit section 120A shown in FIGS. 5A and 5B. It should be noted that in the self-test on the main control circuit section 120B, since the retry command signal ERST is generated by the BIST control block 810, microprocessor 121 does not need to generate the retry command signal shown in the step 508. The subsequent step 510 is the determination step, in which it is determined whether or not the power switch 103 is still closed. If closed, i.e., "YES" determination is made, the process returns to the step 1001. If opened, i.e., "NO" determination is made, the process proceeds to a step 521. In the step 521, error occurrence information and learned information, which have been written in the RAM memory 128 during operation, are transferred to and saved in the data storage area of the program memory 122B, and in the subsequent step 522, generation of the watchdog signal WDS is stopped. In a subsequent step 1003, the BIST execution indicating signal and the internal-scan enabling signal BSEN are generated, and then the process proceeds to a block step 1004 through a junction mark C.

In the block step 1004, the BIST control block 810 shown in FIG. 8 starts its operation: the scan-pulse output circuit 813 sends the first diagnostic pulse-train signal BOUT to the first combination of the scan chain circuits 820, 830, 840, and the scan out signal SOUT sent out from the last-stage scan chain circuit 840 is input as the first measurement pulse-train signal BIN to the expected-value comparison circuit 815 via the compression circuit 814. A subsequent step 1005 is a determination step, in which it is determined whether or not the expected-value comparison circuit 815 completes the comparison and determination. If completed, i.e., "YES" determination is made, the process proceeds to a step 1006. If not completed, i.e., "NO" determination is made, the process proceeds to a step 1007. The step 1006 is a determination step, in which it is determined whether or not the comparison and determination result of the expected-value comparison circuit 815 is normal. If determined to be normal, i.e., "YES" determination is made, the process proceeds to a step 1008a. If determined to be not normal, i.e., "NO" determination is made, the process proceeds to a step 1008b. The step 1007 is a determination step, in which it is determined whether or not the time required for the self-test performed in the block step 1004 exceeds the predetermined threshold time for determining timeout error. If determined to be not overtime, i.e., "NO" determination is made, the process returns to the block step 1004. If determined to be overtime, i.e., "YES" determination is made, the process proceeds to a step 1008c. Note that the threshold time for determining timeout error is set shorter than the boot wait period Tst, the power-on reset time set by the power-on reset circuit 140.

In the step 1008a, normality of the comparison and determination result of the expected-value comparison circuit 815 is stored in the comparison result storing memory 816. In the step 1008b, the fact that the result of the comparison and determination of the expected-value comparison circuit 815 is in error is stored by resetting a normal record stored in the comparison result storing memory 816. In the step 1008c, timeout error information is stored by the timeout detection circuit 818 if no comparison and determination result of the expected-value comparison circuit 815 is obtained until the predetermined threshold time for determining timeout error is elapsed. A step 1009 subsequent to the steps 1008b, 1008c is a determination step, in which it is determined whether or not executions of the self-test in the step 1004 exceed, for example, 3 times. If they are 3 times or less, i.e., "NO" determination is made, the process returns to the step 1004. If they exceed 3 times, i.e., "YES" determination is made, the process proceeds to a step 1010. The step 1010 is a determination step that is executed when no normal determination is still obtained as a result of repeating the retry the predetermined times. If the timeout error still occurs, i.e., "YES" determination is made, the process proceeds to a step 1011c. If the timeout error is eliminated, i.e., "NO" determination is made, the process proceeds to a step 1011b. In the step 1011b, determination of comparison result error is deterministically stored, and in the step 1011c, determination of timeout error is deterministically stored. In a step 1012 subsequent to the steps 1008a, 1011b, 1011c, the BIST execution indicating signal stored in the step 1003 is reset and the internal-scan enabling signal BSEN is fixed to "L" logic level. In a step 1013, by the fact that the BIST execution indicating signal is released in the step 1012, the power-supply relay exciting coil 102b shown in FIG. 7 is de-energized to open the output contact 102a, thus stopping feed of the main power-supply voltage Vb to the electronic control unit 100A.

In the above description, the power-supply relay exciting coil 102b is energized and self-held by the output enabling signal OUTE generated by the watchdog timer 138 or the BIST execution indicating signal generated by the self-test circuit 800; however, when the watchdog signal WDS generated by the microprocessor 121 is stopped and when the power switch 103 is opened, the watchdog signal circuit 128 can delay release of the output enabling signal OUTE to keep feeding the power supply by generating a substitution pulse signal during the self-test. While the above description has been made on the case of jointly using the monitoring and control circuit section 130B for the main control circuit section 120B, it is possible to eliminate the monitoring and control circuit section 130B, and instead to mount only the watchdog timer 138 and the power-on reset circuit 140 on the circuit board or to incorporate them in the main control circuit section 120B.

As is apparent from the above description, an electronic control unit having an integrated circuit element, according to the embodiment 2 of the present invention is the electronic control unit 100A that includes the input interface circuits 114a, 115a, 114b, 115b connected to the input sensors 104a, 105a, 104b, 105b; the output interface circuits 116a, 116b connected to the electrical loads 106a, 106b; and at least one integrated circuit element 120B connected with the input interface circuits and the output interface circuits. Further, the integrated circuit element 120B includes the self-test circuit 800 configured with the build-in self-test control block (BIST control block) 810; the scan chain circuits 817, 820, 830, 840, 850, each are made up of a plurality of flip-flop circuits internally or additionally provided to be connected with a plurality of to-be-checked combination of circuit components at the respective fore and aft sides thereof in the integrated circuit element and serially combined with each other; the mask circuitry 860 arranged to connect between the input circuit portions and the output circuit portions of the plurality of circuit components, to disable their input/output operation, and includes the selection command input terminal for receiving the selection command signal EXT for selecting a scan mode. The selection command input terminal receives the selection command signal EXT selecting, as a serial combination of the scan chain circuits, the first combination of the scan chain circuits excepting at least the scan chain circuit 817 for the BIST control block 810 and the scan chain circuit 850 for other circuits outside the self-test, or the second combination of the scan-chain circuits including all scan chain circuits 817, 820, 830, 840, 850.

The BIST control block 810 includes the scan-pulse output circuit 813 feeding the first diagnostic pulse-train signal BOUT to the front stage of the first combination of the scan chain circuits; the expected-value comparison circuit 815 receiving the first measurement pulse-train signal BIN output from the last stage of the first combination of the scan chain circuits, to determine whether or not the received pulse-train signal agrees with a corresponding correct pulse-train information; and the comparison result storing memory 816 storing normality or non-normality of the determination result. And the BIST control block 210 generates the internal-scan enabling signal BSEN enabling the first diagnostic pulse-train signal BOUT. Further, the self-test circuit 800 includes the pulse input terminal for receiving the second diagnostic pulse-train signal ESCN to be input to the front stage of the second combination of the scan chain circuits; the pulse output terminal for sending out the second measurement pulse-train signal EOUT response to the second diagnostic pulse-train signal ESCN; and the control input terminal for receiving the external scan enabling signal ESEN enabling the second diagnostic pulse-train signal ESCN. The BIST control block 810 is active during the predetermined prolonged power-feed period Tsp after the control operation of the integrated circuit element 120B is stopped by opening the power switch 103 feeding power to the integrated circuit element 120B, and executes the self-test using the first combination of the scan chain circuits 820, 830, 840. During execution of the self-test, acquisition of some signals input from the input interface circuits and generation of some signals output to the output interface circuits are disabled by the mask circuitry 860. Note that the external test for the second combination of the scan chain circuits 817, 820, 830, 840, 850 using the self-test circuit 800 and feed of the second diagnostic pulse-train signal ESCN are executed in the shipment inspection process for the integrated circuit element 120B alone.

The scan-pulse output circuit 813 generates the first diagnostic pulse-train signal BOUT using a pseudorandom number generator employing, for example, a deterministic algorithm having reproducibility. The expected-value comparison circuit 815 receives the first measurement pulse-train signal BIN through the compression circuit 814 employing an algorithm typified by "cyclic redundancy check (CRC)", and compares the compressed pulse-train signal BIN with the expected value converted as a comparison reference value from the correct pulse-train information compressed beforehand using the same compression algorithm. As described above, in the BIST control block, the expected-value comparison circuit compares the first measurement pulse-train signal response to the first diagnostic pulse-train signal generated by the scan-pulse output circuit using the pseudorandom number generator with compressed value of the correct pulse-train information. Accordingly, this eliminates the need for a storage means for the first diagnostic pulse-train signal and allows the correct information to be fixedly stored as bit pattern information with less number of bits, as with the invention of the embodiment 1, thus providing an advantageous feature of configuring the BIST control block with small size and low cost.

The BIST control block 810 includes the timeout detection circuit 818. When no comparison and determination result of the expected-value comparison circuit 815 is obtained until the predetermined threshold time for determining timeout error elapses from when the scan-pulse output circuit 813 starts generating the first diagnostic pulse-train signal BOUT, the timeout detection circuit 818 stores the timeout error information and the BIST control block 810 finishes the self-test operation within the predetermined repetition of the retry operations. As described above, the BIST control block 810 includes a timeout detection circuit and stops the self-test operation when the check operation has not been completed within the predetermined period, as with the embodiment 1, thus providing an advantageous feature of alternatively detecting an erroneous state by using the timeout error information even when an error happens in the BIST control block itself that is outside the self-test.

The integrated circuit element is separated as the first and the second integrated circuit elements 120B and 130B. The first integrated circuit element 120B constitutes the main control circuit section including the main computational control circuit subsection 129B having the microprocessor 121 as its main component for driving and controlling, in accordance with the contents of the control program in the program memory 122B, the electrical loads 106a, 106b in response to operational states of the input sensors 104a, 105a, 104b, 105b; the memory part made up of the program memory 122B and the RAM memory 123 for computational processing; the watchdog signal circuit 128 outputting the watchdog signal WDS; and the serial-parallel converters 127 serially communicating with the second integrated circuit element 130B. The second integrated circuit element 130B cooperates with the microprocessor 121, and constitutes the monitoring and control circuit section including the main monitoring and control circuit subsection 139B detecting the presence or absence of an error in the control of the microprocessor 121, and the plurality of circuit components: the watchdog timer 138 monitoring the pulse width of the watchdog signal WDS generated by the microprocessor 121; the serial-parallel converter 137 serially communicating with the microprocessor 121; and the power-on reset circuit 140 generating the power-on reset signal POR2 for the microprocessor 121. The first integrated circuit element 120B, which is at least one of the separated integrated circuit elements, further includes the self-test circuit 800 configured with the BIST control block 810; the scan chain circuits 820, 830, 840, 850, and 817, which is included in the BIST control block; and the mask circuitry 860, and includes the selection command input terminal for receiving the selection command signal EXT selecting one of the scan modes.

The BIST control block 810 includes the scan-pulse output circuit 813 feeding the first diagnostic pulse-train signal BOUT to the front stage of the first combination of the scan chain circuits 820, 830, 840 excepting the scan chain circuit 817 for the BIST control block 810 and the scan chain circuit 850 for the memory part made up of the program memory 122B and the RAM memory 123 for computational processing; the expected-value comparison circuit 815 receiving the first measurement pulse-train signal BIN output from the last stage of the first combination of the scan chain circuits 820, 830, 840, to determine whether or not the received pulse-train signal agrees with the corresponding correct pulse-train information; and the comparison result storing memory 816 storing normality or no-normality of the determination result. The BIST control block 810 performs the internal check on the first integrated circuit element 120B using the self-test circuit 800 within the predetermined prolonged power-feed period Tap after opening of the power switch 103, and then stores normality or non-normality of the determination result in the comparison result storing memory 816. The microprocessor 121 reads out the error determination result of the self-test circuit 800, and then sends error notice and aborts its control operation, or shifts to the first output-operation restriction mode to start the control operation.

As has been described above, the electronic control unit includes the first integrated circuit element constituting the main control circuit section and the second integrated circuit element constituting the monitoring and control circuit section, and performs the hardware check on the main control circuit section using the self-test circuit during the prolonged power-feed period Tsp after stop of the operation, to store the presence or absence of an error. At restart of operation, the electronic control unit stops the operation or starts the operation by shifting into the predetermined output-operation restriction mode. Thus, the internal check on the main control circuit section is performed during the halt of the operation, providing an advantageous feature of quickly starting the operation after the boot wait period Tst for executing the initialization process triggered by the power-on reset signal has elapsed from turn on of the power switch at the start of operation. Furthermore, the memory part included in the first integrated circuit element is outside the self-test, providing an advantageous feature of not corrupting during the self-test the learned data and the error-occurrence history data stored during operation, and of reducing the time required for the self-test.

The BIST control block 810 includes the timeout detection circuit 818 and the retry command circuit 819. The timeout detection circuit 818 stores a timeout error information when no comparison and determination result of the expected-value comparison circuit 815 is obtained until the predetermined threshold time for determining timeout error elapses from when the scan-pulse output circuit 813 starts generating the first diagnostic pulse-train signal BOUT. The retry command circuit 819 repeats generation of the retry command signal ERST within the predetermined times to execute the self-test again by the generation of the first diagnostic pulse-train signal BOUT, when the timeout detection circuit 818 detects a timeout error or when the expected-value comparison circuit 815 determines the comparison result to be in error. When the comparison result storing memory 816 does not yet change to normal comparison and determination although generation of the retry command signal ERST is repeated the predetermined times or when a timeout error occurs, the BIST control block 810 stores the error occurrence state, and then stops the self-test operation and de-energizes the power supply relay having been in the contact state. The comparison result storing memory 816 and a timeout-error storage memory each are flip-flop circuits made up of logic elements, and the flip-flop circuits store error occurrence information when the backup power-supply voltage Vbb momentarily interrupts.

As described above, when the BIST control block detects an error in a comparison result or a timeout error, the retry command signal is generated. When the error continues still for the predetermined repetition of the retry commands, the fact that the error occurs is stored in a battery backed-up flip-flop circuit and then the prolongedly fed power is shutdown. Thus, the retry operation is commanded by the BIST control block instead of the microprocessor being not in operation, providing an advantageous feature of eliminating the need of rebooting the microprocessor. In addition, the BIST control block can store an error-occurrence state in the simple flip-flop circuit. When the backup power supply is momentarily interrupted, the flip-flop circuit keeps storage of the error occurrence, thus providing an advantageous feature of performing the process in a fail-safe manner. Note that when restarting the operation in an error detection state, a moment interruption of the power switch allows the self-test circuit to perform the check again. When the normal state is determined here to be valid, the operation can be resumed to the normal operation mode.

As is apparent from the above description, a component test unit for an integrated circuit element, according to the embodiment 2 of the present invention is the component test unit 300B that includes the checker microprocessor 320B and the integrated circuit element 120B detachably connected with the checker microprocessor and applied, as a to-be-tested integrated circuit element, to the electronic control unit 100B including the input interface circuits 114a, 115a connected to the input sensors 104a, 105a; the output interface circuit 116a connected to the electrical loads 106a; and at least one integrated circuit element 120B connected with the input interface circuits and the output interface circuit. Further, the integrated circuit element 120B includes the self-test circuit 800 configured with the build-in self-test control block (BIST control block) 810; the scan chain circuits 817, 820, 830, 840, 850, each are made up of the plurality of flip-flop circuits internally or additionally provided to be connected with a plurality of to-be-checked combination of circuit components at the respective fore and aft sides thereof in the integrated circuit element and serially combined with each other; the mask circuitry 860 arranged to connect between the input circuit portions and the output circuit portions of the plurality of circuit components, to disable their input/output operation, and includes the selection command input terminal for receiving the selection command signal EXT for selecting a scan mode.

The selection command input terminal receives the selection command signal EXT selecting, as a serial combination of the scan chain circuits, the first combination of the scan chain circuits excepting at least the scan chain circuit 817 for the BIST control block 810 and the scan chain circuit 850 for other circuits outside the self-test, or the second combination of the scan chain circuits including all scan chain circuits 817, 820, 830, 840, 850. The BIST control block 810 includes the scan-pulse output circuit 813 feeding the first diagnostic pulse-train signal BOUT to the front stage of the first combination of the scan chain circuits; the expected-value comparison circuit 815 receiving the first measurement pulse-train signal BIN output from the last stage of the first combination of the scan chain circuits, to determine whether or not the received pulse-train signal agrees with the corresponding correct pulse-train information; the comparison result storing memory 816 storing normality or non-normality of the determination result. And the BIST control block 210 generates the internal-scan enabling signal BSEN enabling the first diagnostic pulse-train signal BOUT. Further, the self-test circuit 800 includes the pulse input terminal for receiving the second diagnostic pulse-train signal ESCN to be input to the front stage of the second combination of the scan chain circuits; the pulse output terminal for sending out the second measurement pulse-train signal EOUT response to the second diagnostic pulse-train signal ESCN; and the control input terminal for receiving the external scan enabling signal ESEN enabling the second diagnostic pulse-train signal ESCN.

The selection command input terminal is set, fixedly in advance or by the selection command signal EXT generated by the checker microprocessor 320B, to select the mode in which all the scan chain circuits 817, 820, 830, 840, 850 are put into the second combination of the scan chain circuits. In this mode, the checker microprocessor 320B generates the second diagnostic pulse-train signal ESCN to feed it to the integrated circuit element 120B and then receives the second measurement pulse-train signal EOUT obtained from the integrated circuit element 120B to determine, in accordance with the expected-value comparison means 607, whether or not the received pulse-train signal agrees with the corresponding second correct pulse-train information. The self-test for the first combination of the scan chain circuits 820, 830, 840 and feed of the first diagnostic pulse-train signal BOUT are performed in the state in which the integrated circuit element 120B is built in the electronic control unit 100B.

The checker microprocessor 320B cooperates with the program memory 322B. The second diagnostic pulse-train signal ESCN generated by the checker microprocessor 320B, which is composed of a train of binary data and stored in the numerical data setting area of the program memory 822B, is bitwise sent out sequentially from the least significant bit or the most significant bit in synchronism with the external clock signal ECLK. The second correct pulse-train information is composed of a train of binary data having the same number of bits as the second diagnostic pulse-train signal ESCN and the second measurement pulse-train signal EOUT, and stored in the numerical data setting area of the program memory 322B. Further, the checker microprocessor 320B compares, in accordance with the expected-value comparison means 607, i.e., the control program stored in the program memory 322B, the second measurement pulse-train signal EOUT with the second correct pulse-train information, to detect the presence or absence of disagreement in the comparison and to locate the position where the disagreement occurs. As described above, the second diagnostic pulse-train signal generated by the checker microprocessor and the corresponding correct pulse-train information for the second measurement pulse-train signal are binary data having the same number of bits stored in the program memory cooperating with the checker microprocessor. Thus, the second diagnostic pulse-train signal can be created on the basis of a preferred test pattern generated not using a random generator but using an automatic test-pattern generation (ATPG) technique, as well as without using a compression circuit. This provides an advantageous feature of pinpointing the location of occurrence of an error, as with the embodiment 1.

The checker microprocessor 320B changes the selection command signal EXT to be input to the BIST control block 810 through the selection command input terminal to configure the scan chain circuits into the first combination, and performs the self-test using the first diagnostic pulse-train signal BOUT generated by the BIST control block 810 to determine the self-test circuit 800 to be normal or in error by monitoring normality or non-normality of the determination result of the expected-value comparison circuit 815. As described above, the checker microprocessor performs the external test using the second diagnostic pulse-train signal and subsequently performs the self-test using the first diagnostic pulse-train signal generated by the BIST control block. Thus, in the external test, the hardware of the BIST control block can be checked using the scan chain circuits relevant to the control block, with the BIST control block not being in operation; and in the self-test, the BIST control block can be checked whether or not it normally operates. This provides an advantageous feature of performing the functional check of the BIST control block, as with the embodiment 1.

Embodiment 3

Figure 11:
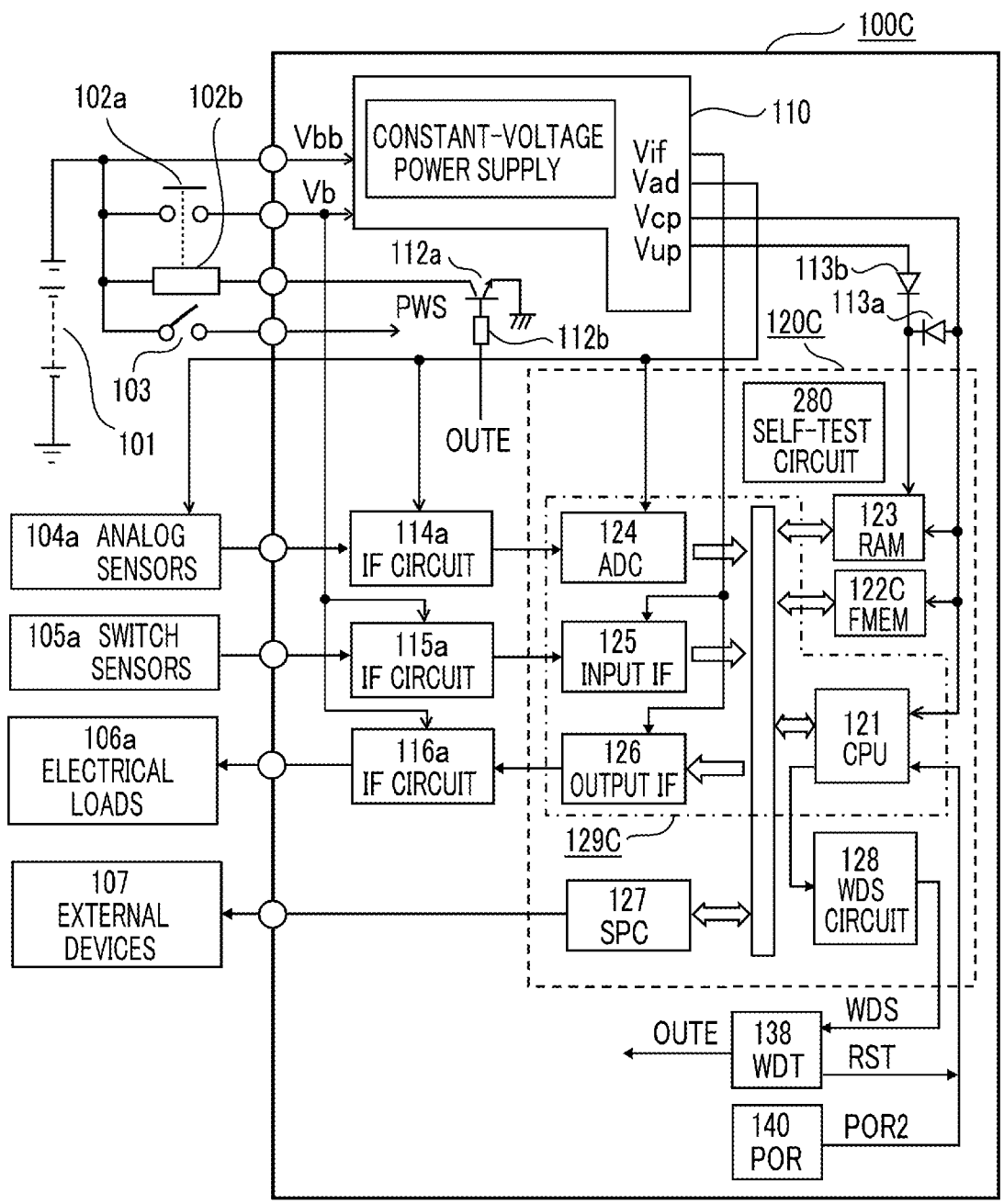
FIG. 11 is an overall configuration diagram of an electronic control unit having an integrated circuit element, according to an embodiment 3 of the present invention.

The configuration of an electronic control unit 100C according to an embodiment 3 of the present invention will be described in detail below focusing on differences from that in FIG. 1, with reference to FIG. 11 showing an overall configuration diagram of the electronic control unit. Major differences between FIG. 1 and FIG. 11 are that an integrated circuit element subject to a self-test is a main control circuit section 120C; a monitoring and control circuit section does not jointly used for the main control circuit section 120C; and scan chain circuits outside the self-test are therefore changed. Note that the self-test is performed immediately before start of the operation as with embodiment 1 and a retry operation for the self-test is therefore commanded from a microprocessor immediately after boot-up. Referring to FIG. 11, the electronic control unit 100C is mainly constituted with the above-described constant-voltage power supply circuit 110; a main control circuit section 120C that is the single first integrated circuit element. The external power supply 101, the power supply relay, the input sensors 104a, 105a, the electrical loads 106a, and cooperative external devices 107 are externally connected to the electronic control unit 100C; and the input interface circuits 114a, 115a and the output interface circuit 116a, and further the watchdog timer 138 and power-on reset circuit 140 are internally connected with the electronic control unit 100C.

The single first integrated circuit element 120C includes the microprocessor 121; a nonvolatile program memory 122C; the RAM memory 123 for computational processing; the multi-channel AD converter 124; the internal input interface circuit 125; the internal output interface circuit 126; the serial-parallel converter 127 used for communication with the external devices 107; the watchdog signal circuit 128; and a self-test circuit 280 that is later described with reference to FIGS. 12 and 13. Note that the microprocessor 121, the multi-channel AD converter 124, the internal input interface circuit 125, and the internal output interface circuit 126 constitute a main computational control circuit subsection 129C. In addition, part of the region in the nonvolatile program memory 122C, which is a flash memory (FMEM), is used as a nonvolatile data memory. The watchdog timer 138 receives the watchdog signal WDS generated by the microprocessor 121 and generates the reset pulse signal RST when the pulse width of the watchdog signal WDS becomes the predetermined value or more, to initialize and reboot the microprocessor 121. The power-on reset circuit 140 generates the power-on reset signal POR2 at the time of power-on, to initialize and boot up the microprocessor 121 within the predetermined boot wait period Tst.

While current for the power-supply relay exciting coil 102b is fed through an energizing transistor 112a in response to a power supply switch signal PWS indicating detection of closure of the power switch 103, when the watchdog timer 138 generates the output enabling signal OUTE, the exciting coil 102b is continuously energized, even when the power switch 103 becomes opened, by the energizing transistor 112a through the drive resistor 112b, to keep closure of the output contact 102a until the microprocessor 121 is halted and the watchdog signal WDS is stopped.

Figure 12:
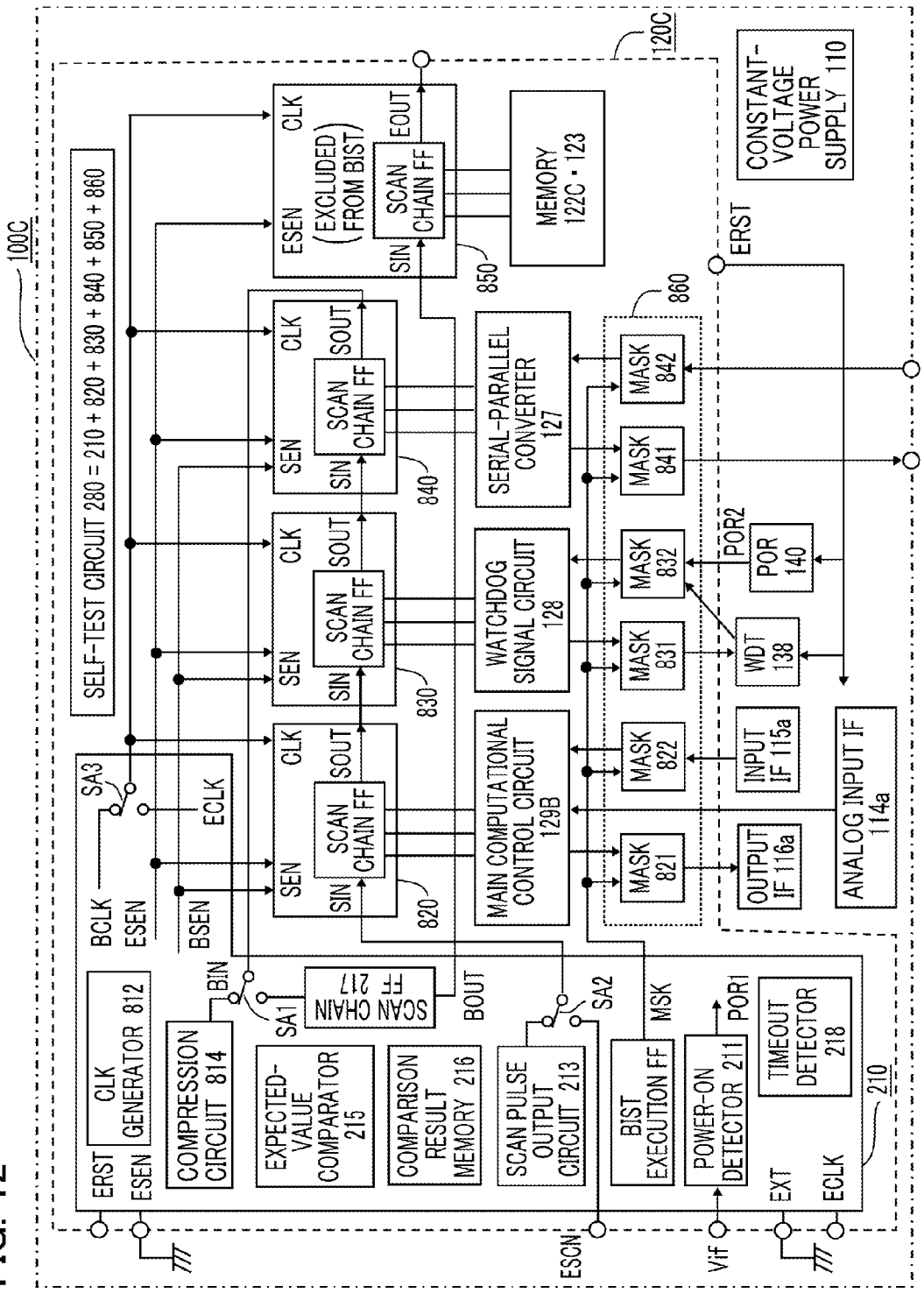
FIG. 12 is a detailed block diagram of a self-test circuit of the electronic control unit of FIG. 11.

Next, a self-test circuit 280 for the electronic control unit shown in FIG. 11 will be described in detail focusing on differences from that in FIGS. 2 and 8, with reference to FIG. 12 showing a detailed block diagram of the self-test circuit. A major difference between FIGS. 2, 8 and FIG. 12 is that the self-test circuit 280 is provided in the main control circuit section 120C as shown in FIG. 12 instead of the self-test circuit 200 provided in the monitoring and control circuit section 130A as shown in FIG. 2. The BIST control block 210 in the self-test circuit 800 corresponds to that in FIG. 2 and scan chain circuits having reference numerals of the eight hundreds are correspond to those in FIG. 5. The same corresponding reference numerals refer to the same or equivalent components. Referring to FIG. 12, the electronic control unit 100C includes the foregoing constant-voltage power supply circuit 110; the main control circuit section 120C, i.e., the single first integrated circuit element; the input interface circuits 114a, 115a; the output interface circuits 116a; the watchdog timer 138; and the power-on reset circuit 140. These are mounted on a not-shown single circuit board contained in a gastight housing and connected with each other. The electronic control unit 100C is also connected, as shown in FIG. 11, to the power supply circuit, the input sensors, and the electrical loads through not-shown connectors provided to the circuit board. As shown also in FIG. 11, the main control circuit section 120C includes a memory part made up of the program memory 122C and the RAM memory 123 for computational processing, the serial-parallel converter 127, the watchdog signal circuit 128, the main computational control circuit subsection 129C, and the self-test circuit 280. The self-test circuit 280 is configured with a built-in self-test control block (BIST control block) 210 including the scan chain circuit 217, the scan chain circuits 820, 830, 840, 850, and the mask circuitry 860. Their details are described below with reference to FIGS. 11 and 12.

First, the items of the mask circuitry 860 is described. The mask circuit 821 is connected between the internal output interface circuit 126 in the main computational control circuit subsection 129C and the output interface circuit 116a on the circuit board, and puts the electric loads 106a into the disabled states when the input/output disabling signal WIC is input. Also, the mask circuit 822 is connected between the internal output interface circuit 125 in the main computational control circuit subsection 129B and the input interface circuit 115a on the circuit board, and disables input from the switch sensors 105a by fixing the signal level of the mask circuit to, for example, "L" logic level when the input/output disabling signal MSK is input. Note that the functions of the internal output interface circuit 128 and the internal input interface circuit 125 of FIG. 11 may be respectively added to the mask circuit 821 and the mask circuit 822. Likewise, the mask circuit 831 disables output of the watchdog signal WDS; the mask circuit 832 disables input of the reset pulse signal RST generated by the watchdog timer 138 and input of the power-on reset signal POR2 generated by the power-on reset circuit 140; the mask circuit 841 disables output of a downstream signal generated by the serial-parallel converter 127 to be sent to the external devices 107 shown in FIG. 11; and the mask circuit 842 disables input of an upstream signal to be input to the serial-parallel converter 127 from the external devices 107.

The scan chain circuit 820 is configured with shift registers made up of a plurality of flip-flop circuits that are provided at the respective fore and aft sides of a plurality of to-be-checked combination of circuit components in the main computational control circuit subsection 1290 and serially combined with each other. The scan chain circuit 830, the scan chain circuit 840, the scan chain circuit 850, and the scan chain circuit 817 are similarly configured and are for the watchdog signal circuit 128, the serial-parallel converter 127, the memory part made up of the program memory 122C and the RAM memory 123 for computational processing, and for the later-described BIST control block 210, respectively. However, the scan chain circuits 820, 830, 840 do not need to be provided separately for each of functional blocks: the main computational control circuit subsection 129C, the watchdog signal circuit 128, and the serial-parallel converter 127, but may be combined as a first combination of the scan chain circuits. Likewise, the scan chain circuits 217, 850 may be combined as scan chain circuits outside the self-test.

As described in detail with reference to FIG. 2, the BIST control block 210 internally includes the power-on detection circuit 211, the clock signal generation circuit 212, the scan-pulse output circuit 213, the compression circuit 214, the expected-value comparison circuit 215, the comparison result storing memory 216, the scan chain circuit 217, the timeout detection circuit 218, and the BIST execution indicating flip-flop circuit. The BIST control block 210 is further provided with the selection command input terminal for receiving a selection command signal EXT and the selection circuits SA1, SA2, SA3. When the selection command signal EXT input to the selection command input terminal is, for example, "L" logic level, the BIST control block 210 goes into a self-test mode, in which the selection circuits SA1, SA2, SA3 form a scan signal loop shown in FIG. 12 and the BIST control block 210 performs a self-test for the first combination of the scan chain circuits 820, 830, 840. Note that while the BIST execution indicating signal of the BIST execution indicating flip-flop circuit is active, the input/output disabling signal MSK is kept at "H" logic level to put all mask circuitry 860 into the input/output disabled state. This prevents the electrical loads 106a from being driven or the self-test from being determined to be in error due to operational state change of the switch sensors 105a during the self-test.

When the selection command signal EXT input to the selection command input terminal turns to, for example, "H" logic level, the BIST control block 210 goes into an external-test mode later described with reference to FIG. 13, in which a second diagnostic pulse-train signal ESCN is input to the pulse input terminal and the external scan enabling signal ESEN is input to the control input terminal. Moreover, the external clock signal ECLK is selected instead of the internal clock signal BCLK by the selection circuit SA3. Note that in the self-test mode, the selection command input terminal for receiving the selection command signal EXT and the control input terminal for receiving the external scan enabling signal ESEN are fixed at "L" logic level. The microprocessor 121 reads out a determination result of the expected-value comparison circuit 215 and the presence or absence of a timeout error immediately after the power-on reset signal POR2 is released. When no normal determination result is obtained, the retry command signal ERST is generated and the self-test is repeatedly executed by the BIST control block 210 within the predetermined limit times.

Figure 13:
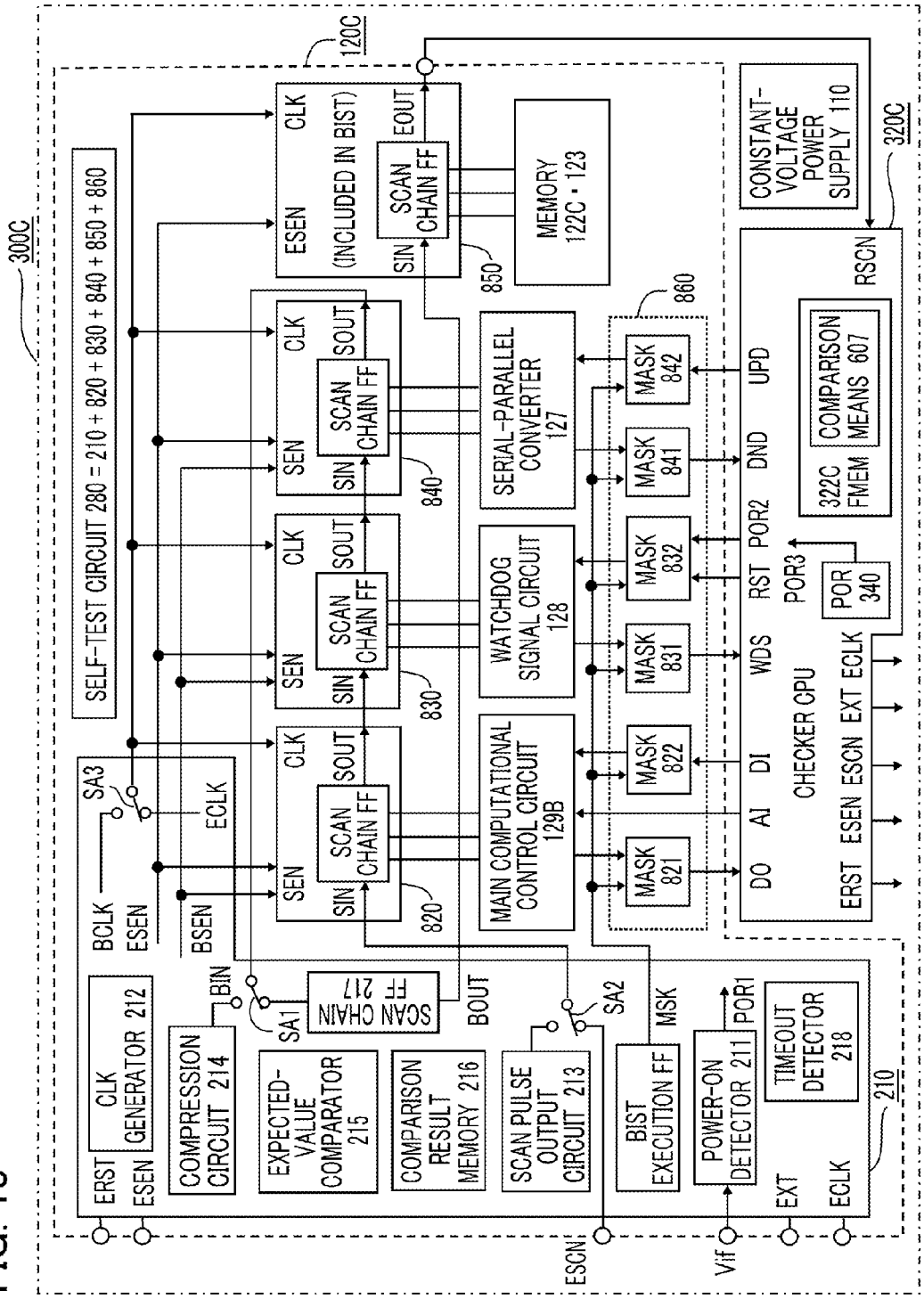
FIG. 13 is an overall configuration diagram of a component test unit for the electronic control unit of FIG. 11.

Next, the configuration of a component test unit 300C for the electronic control unit shown in FIG. 11 will be described in detail focusing on differences from FIG. 3, with reference to FIG. 13 showing an overall configuration diagram of the component test unit. Referring to FIG. 13, the component test unit 300C includes the foregoing constant-voltage power supply circuit 110; the main control circuit section 120C, which is the single integrated circuit element to be checked; and a checker microprocessor 320C. These are mounted on a not-shown circuit board. The main control circuit section 120C is detachable through a not shown connector. The component test unit 300C is externally connected with a not-shown external power supply through the power supply switch, but is not connected to the input sensors and the electric loads shown in FIG. 11. The checker microprocessor 320C serves as substitution for these input sensors and electric loads. The checker microprocessor 320C is initialized by the built-in power-on reset circuit 340, and then sends the retry command signal ERST, the external scan enabling signal ESEN, the second diagnostic pulse-train signal ESCN, the selection command signal EXT, and the external clock signal ECLK to the respective terminals provided to the BIST control block 210 of the to-be-tested integrated circuit element.

When performing the external test, the selection command signal EXT of "H" logic level is sent to the selection command input terminal, whereby the selection circuits SA1, SA2, SA3 in the BIST control block 210 are switched to the connection positions shown in FIG. 13. Thus, the second diagnostic pulse-train signal ESCN sent to the pulse input terminal from the checker microprocessor 320C is input as the second measurement pulse-train signal EOUT to the measurement pulse input terminal RSCN of the checker microprocessor 320C by way of the scan chain circuits 820, 830, 840, 217, 850 from the pulse output terminal. Moreover, the external clock signal ECLK is selected instead of the internal clock signal BCLK by the selection circuit SA3. Note that when the selection command signal EXT is at "H" logic level, the clock signal generation circuit 212, the scan-pulse output circuit 213, the compression circuit 214, the expected-value comparison circuit 215, the comparison result storing memory 216, and the timeout detection circuit 218 are initialized and are in the disabled states; thus allowing a condition ready to perform the scan test using the scan chain circuit 217. Likewise, the memory part made up of the program memory 122C and the RAM memory 123 for computational processing is also initialized and is in the disabled state; thus allowing a condition ready to perform the scan test using the scan chain circuit 850 for the memory part.

The second diagnostic pulse-train signal ESCN sent to the pulse input terminal from the checker microprocessor 320C is input to the scan chain circuit 820 in synchronism with the external clock signal ECLK by the fact that the external scan enabling signal ESEN is turned to "H" logic level. A scan out signal SOUT generated by the scan chain circuit 820 is a scan-in signal SIN for the subsequent scan chain circuit 830, a scan-out signal SOUT generated by the scan chain circuit 830 is a scan-in signal SIN for the subsequent scan chain circuit 840, a scan-out signal BOUT generated by the scan chain circuit 840 is a scan-in signal SIN for the scan chain circuit 217 in the BIST control block 210, a scan-out signal SOUT generated by the scan chain circuit 217 is a scan-in signal SIN for the subsequent scan chain circuit 850, and a scan-out signal SOUT generated by the scan chain circuit 850 is input as the second measurement pulse-train signal EOUT to measurement pulse input terminal RSCN of the checker microprocessor 320C.

The checker microprocessor 320C is provided with a pulse counter that is configured with a control program in a cooperative program memory 322C, and turns temporarily the external-scan enabling signal BSEN to "L" logic level when the number of pulses in the second diagnostic pulse-train signal ESCN having been sent becomes equal to the total number of flip-flop circuits in the second combination of the scan chain circuits 820, 830, 840, 217, 850. In this way, turning the external-scan enabling signal ESEN to "H" logic level of the enabling state permits the scan-in mode, in which the second diagnostic pulse-train signal ESCN is scanned-in in synchronism with the external clock signal ECLK and then diagnostic information is input to each flip-flop circuit constituting the shift register. Then, turning the external-scan enabling signal ESEN to "L" logic level of the disabling state permits the capture mode, in which outputs of the combination circuits for the diagnostic information are captured into the flip-flop circuits on input of the internal clock signal BCLK. Turning again the external-scan enabling signal ESEN to "H" logic level of the enabling state permits the scan-out mode, in which the information in the shift registers is sent out as the second measurement pulse-train signal EOUT in synchronism with the external clock signal ECLK.

Current value of the pulse counter, which has been incremented during the scan-in mode, is then decremented in the scan-out mode. When the current value becomes zero, the comparison and determination is made in accordance with the expected-value comparison means 607. The expected-value comparison means 607 is a control program included in the program memory 322C. The checker microprocessor 320C cooperates with the program memory 322C and compares, in accordance with the expected-value comparison means 607, the received second measurement pulse-train signal EOUT with correct information corresponding to the second diagnostic pulse-train signal ESCN having been sent, to determine the comparison to be normal when both agree with each other or to be abnormal when they disagree with each other. The second diagnostic pulse-train signal ESCN generated by the checker microprocessor 320C, which is composed of a train of binary data stored in a numerical data setting area of the cooperative program memory 322C, is bitwise sent out sequentially from the least significant bit or the most significant bit in synchronism with the external clock signal ECLK. In addition, the second correct pulse-train information is composed of binary data having the same number of bits as the second diagnostic pulse-train signal ESCN and the second measurement pulse-train signal EOUT, and stored in the numerical data setting area of the program memory 322C. Note that when no comparison and determination result in accordance with the expected-value comparison means 607 is obtained until a predetermined determination time elapses, the checker microprocessor 320C determines it as a timeout error, and repeats a plurality of retry operations by generating the retry command signal ERST, and then detects the presence or absence of an error.

The component test unit 300C can also perform a check on functions of the BIST control block 210 by putting the to-be-tested integrated circuit element into the self-test mode by turning the selection command signal EXT to "L" logic level. In addition, by adding a function check program into the program memory 322C of the component test unit 300C and into the program memory 122C of the main control circuit section 120V, various function checks can be performed for the main control circuit section 120C with the selection command signal EXT being in "L" logic level after a self-test for the main control circuit section 120C is completed. For example, sending a load drive command from the component test unit 300C through the serial-parallel converter 137 to the main control circuit section 120C to acquire a load drive command generated by the internal output interface circuit 126 into the checker microprocessor 320C allows determination as to whether or not an expected output signal is obtained. At this time, if enabling or disabling of the mask circuitry 860 is put to be controllable, output disabling operation of the mask circuitry 860 can be checked. Likewise, sending a sensor emulation signal from the checker microprocessor 320C through the multi-channel AD converter 124 to the internal input interface circuit 125 to acquire a signal generated by the interface circuit into the checker microprocessor 320C through the serial-parallel converter 127 allows determination as to whether or not an expected input signal is obtained. At this time, if enabling or disabling of the mask circuitry 860 is put to be controllable, input disabling operation can be checked by the mask circuitry 860.

Figure 14A:
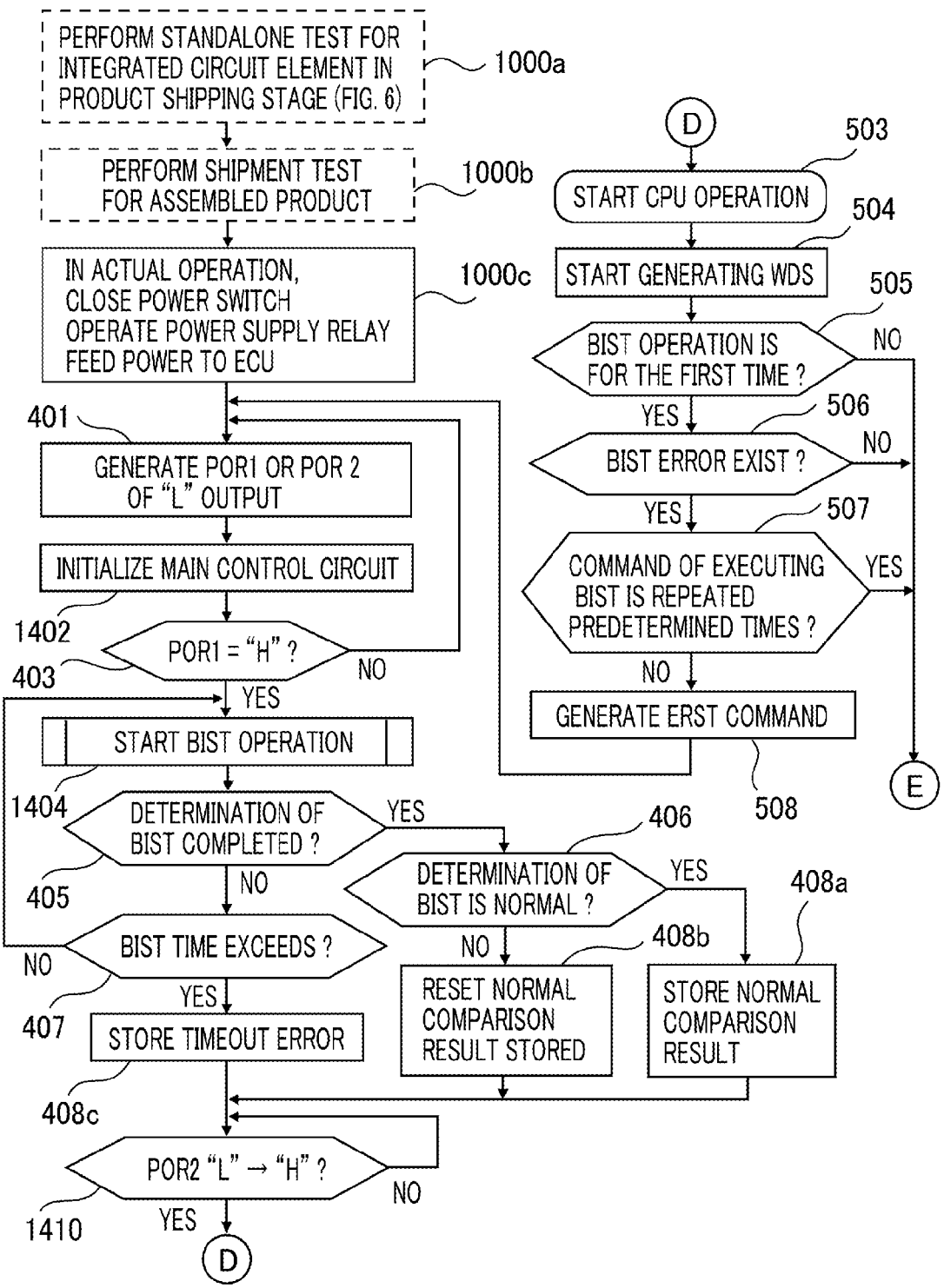
FIG. 14A is a flowchart for explaining the first half of the overall operation of the electronic control unit of FIG. 11.
Figure 14B:
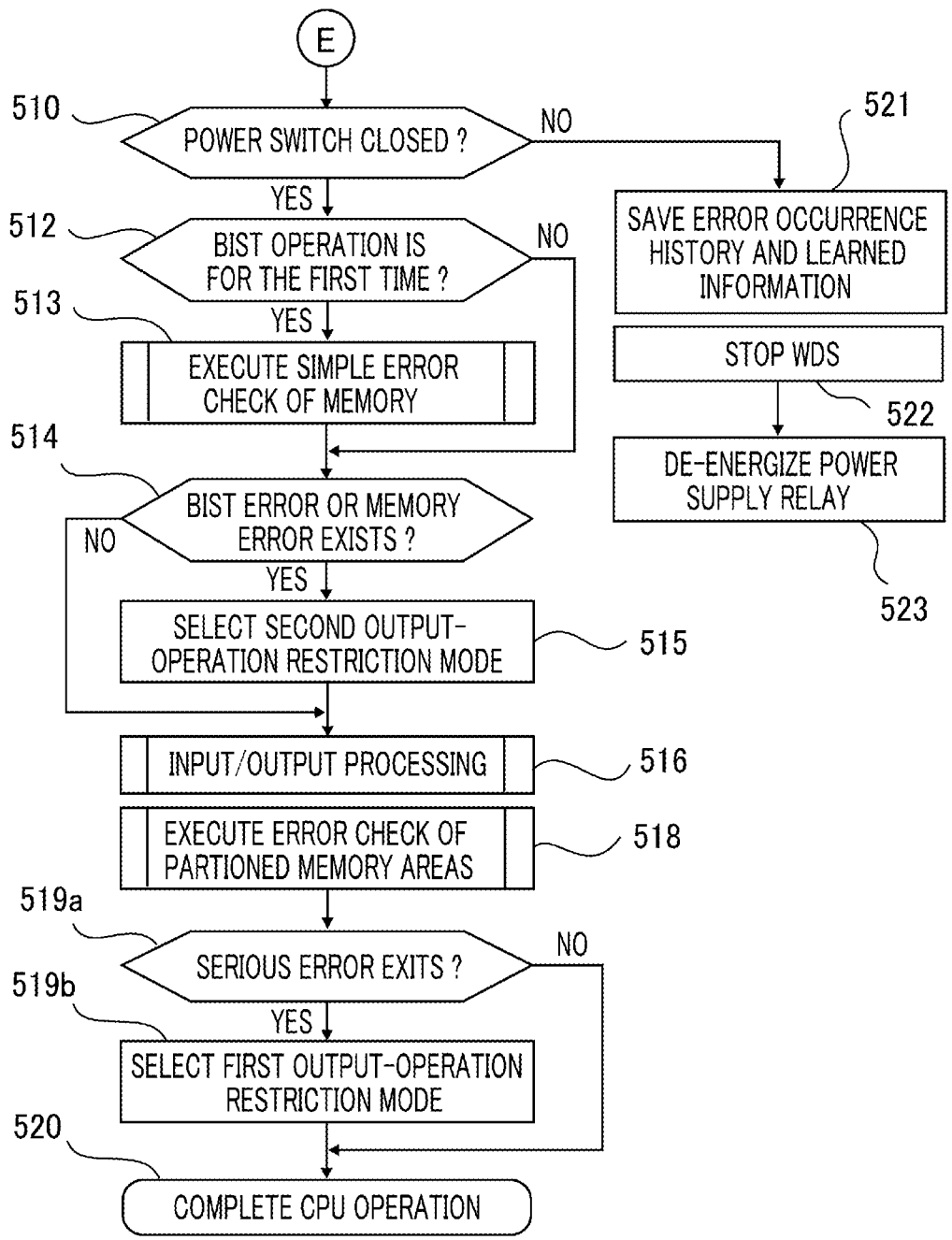
FIG. 14B is a flowchart for explaining the last half of the overall operation of the electronic control unit of FIG. 11.

Next, the overall operation of the electronic control unit 100C configured as shown in FIG. 11 will be described with reference to FIGS. 14A and 14B showing a flowchart for explaining the operation. First, the outline of the overall operation will be described with reference to FIG. 11. When the power switch 103 is closed, the power-supply relay exciting coil 102b is energized to close the output contact 102a, whereby the main power supply voltage Vb is applied to electronic control unit 100C and then the constant-voltage power supply circuit 110 generates the predetermined stabilized voltages of the first to the third output voltages Vad, Vif, Vcp. Note that the fifth output voltage Vup, which is stepped down from the backup power-supply voltage Vbb directly supplied from the external power supply 101 and thereby kept always at the predetermined stabilized voltage even while the power-supply-relay output contact 102a is opened, is fed to the entire area of the RAM memory 123 or part of its area that needs a battery backup.

The power-on reset circuit 140 provided outside the main control circuit section 120C keeps the power-on reset signal POR2 at "L" logic level until the predetermined boot wait period Tst elapses after the second output voltage Vif is generated, to disable output generation of the microprocessor 121 in the main control circuit section 120C. Within this period, the self-test is performed for the first combination of the scan chain circuits. When the power-on reset signal POR2 turns to "H" logic level in due course of time, started are the input/output control operation by the main control circuit section 120C and the monitoring and control operation by the watchdog timer 138. That is, the microprocessor 121 generates the watchdog signal WDS and the watchdog timer 138 generates the output enabling signal OUTE when the pulse width of the watchdog signal WDS is smaller than the predetermined value, whereby the internal output interface circuits 126 is enabled to generate control outputs and at the same time the energizing transistor 112a is driven to energize and self-hold the power-supply relay exciting coil 102b. The main control circuit section 120C being in operation drives and controls, in accordance with the contents of the control program in the program memory 122C, the electrical loads 106a in response to operational states of the analog sensors 104a and the switch sensors 105a. When the power switch 103 is opened, the microprocessor 121 transfers learned information and error occurrence information that have been written in the RAM memory 123 to a data storage area of the program memory 122C to save them, and then stops generation of the watchdog signal WDS. Consequently, the self-holding energization of the power supply relay sustained by the output enabling signal OUTE is released, whereby the power-supply-relay output contact 102a becomes opened.

Next, the overall operation of the electronic control unit 100C shown in FIG. 11 will be described in detail with reference to FIGS. 14A and 14B for explaining the operational flowchart and to FIGS. 11 through 13. Referring to FIG. 14A, the step 1000a shows the component test steps for the main control circuit section 120C, the single first integrated circuit element in the product shipping stage, in which the external test is performed by the component test unit 300C shown in FIG. 13. The operational flow of the component test unit 300A shown in FIG. 6 is applied to that of the component test unit 300C without modification. In the subsequent step 1000b, the main control circuit section 120C that is the single integrated circuit element, the constant-voltage power supply circuit 110, the input interface circuits 114a, 115a, the output interface circuit 116a, the watchdog timer 138, and the power-on reset circuit 140 are assembled to the electronic control unit 100C and the shipment inspection is performed for the assembled product. In the subsequent step 1000C, the power switch 103 is closed to feed the main power-supply voltage Vb through the power-supply-relay output contact 102a in actual operation stage of the electronic control unit 100C.

The step 401 through a step 1410 correspond to the steps 401 through 411 shown in FIG. 4A, in which the self-test is executed for the main control circuit section 120C immediately before start of operation. Note that in FIG. 4A, the monitoring and control circuit section 130A is initialized in the step 402 and the self-test therefor is performed in the step block 404; in FIG. 14A, on the other hand, the main control circuit section 120C is initialized in a corresponding step 1402 and the self-test therefor is performed in a corresponding step block 1404. In addition, the steps 410 and 411 shown in FIG. 4A are merged into the step 1410 shown in FIG. 14A. The subsequent steps 503 through 508 shown in FIG. 14A correspond to the steps 503 through 508 shown in FIG. 5A, in which the self-test is retried when an error occurs in a result of the self-test executed in the step block 1404. The steps 510 through 523 shown in FIG. 14B, subsequent from a junction mark E of FIG. 14A, correspond to the steps 510 through 523 shown in FIG. 5B. In these steps, the input/output control is executed in the dedicated step block 516; the memory check is executed in the step block 513 immediately after the operation is started; and the memory check is executed in the step block 518 during the operation. It should be noted that Q&A made by the monitoring and control circuit section 130A in the step block 517 of FIG. 5B is omitted from these steps.

In the above description, the watchdog timer 138 and the power-on reset circuit 140 are provided outside the main control circuit section 120C; however, these can be incorporated into a single integrated circuit element 120C. Furthermore, while the self-test for the main control circuit section 120C is performed in the boot wait period Tst immediately before start of the operation, this test can be performed in the prolonged power-feed period Tsp immediately after halt of the operation. When a step of screening out an defective product due to a high temperature aging is provided in the product shipment inspection for the electronic control units 100A, 100B, 100C of the embodiments 1, 2, 3, use of the self-test function of the built-in integrated circuit element allows for monitoring the presence or absence of error occurrence by interrupting the main power-supply voltage Vb at regular intervals. Furthermore, while the nonvolatile program memories 122A, 122B, 122C in the electronic control units 100A, 100B, 100C, which cooperate with the microprocessor 121, have been described in the embodiments 1 through 3 that they are made up of flash memories each having the control constant setting area, connecting an electrically readable and writable nonvolatile memory allows for it to be used as part of the area of the program memory.

As is apparent from the above description, an electronic control unit according to the embodiment 3 of the present invention is the electronic control unit 100C that includes the input interface circuits 114a, 115a connected to the input sensors 104a, 105a; the output interface circuit 116a connected to the electrical loads 106a; and at least one integrated circuit element 120C connected with the input interface circuits and the output interface circuit. Further, the integrated circuit element 120C includes the self-test circuit 280 configured with the build-in self-test control block (BIST control block) 210; the scan chain circuits 217, 820, 830, 840, 850, each are made up of the plurality of flip-flop circuits internally or additionally provided to be connected with a plurality of to-be-checked combination of circuit components at the respective fore and aft sides thereof in the integrated circuit element and serially combined with each other; the mask circuitry 860 arranged to connect between the input circuit portions and the output circuit portions of the plurality of circuit components, to disable their input/output operations, and includes the selection command input terminal for receiving the selection command signal EXT for selecting a scan mode. The selection command input terminal receives the selection command signal EXT selecting, as a serial combination of the scan chain the first combination of the scan chain circuits excepting at least the scan chain circuit 217 for the BIST control block 210 and the scan chain circuit 850 for other circuits outside the self-test, or the second combination of the scan chain circuits including all scan chain circuits 217, 820, 830, 840, 850.

The BIST control block 210 includes the scan-pulse output circuit 213 feeding the first diagnostic pulse-train signal BOUT to the front stage of the first combination of the scan chain circuits; the expected-value comparison circuit 215 receiving the first measurement pulse-train signal BIN output from the last stage of the first combination of the scan chain circuits, to determine whether or not the received pulse-train signal agrees with a corresponding correct pulse-train information; and the comparison result storing memory 216 storing normality or non-normality of the determination result. And the BIST control block 210 generates the internal-scan enabling signal BSEN enabling the first diagnostic pulse-train signal BOUT. Further, the self-test circuit 280 includes the pulse input terminal for receiving the second diagnostic pulse-train signal ESCN to be input to the front stage of the second combination of the scan chain circuits; the pulse output terminal for sending out the second measurement pulse-train signal EOUT response to the second diagnostic pulse-train signal ESCN; and the control input terminal for receiving the external scan enabling signal ESEN enabling the second diagnostic pulse-train signal ESCN. The BIST control block 210 is active during the predetermined boot wait period Tst between close of the power switch 103 for feeding power to the integrated circuit element 120C and start of the control operation of the integrated circuit element. During that period, the BIST control block 210 executes the self-test using the first combination of the scan chain circuits 820, 830, 840. During execution of the self-test, acquisition of some signals input from the input interface circuit 115a and generation of some signals output to the output interface circuit 116a are disabled by the mask circuitry 860. Note that the external test for the second combination of the scan chain circuits 217, 820, 830, 840, 850 using the self-test circuit 280 and feed of the second diagnostic pulse-train signal ESCN are executed in the shipment inspection process for the integrated circuit element 120C alone.

The scan-pulse output circuit 213 generates the first diagnostic pulse-train signal BOUT using a pseudorandom number generator employing, for example, a deterministic algorithm having reproducibility. The expected-value comparison circuit 215 receives the first measurement pulse-train signal BIN through the compression circuit 214 employing an algorithm typified by "cyclic redundancy check (CRC)", and compares the compressed pulse-train signal BIN with the expected value converted as a comparison reference value from the correct pulse-train information compressed beforehand using the same compression algorithm. As described above, in the BIST control block, the expected-value comparison circuit compares the first measurement pulse-train signal response to the first diagnostic pulse-train signal generated by the scan-pulse output circuit using the pseudorandom number generator with compressed value of the correct pulse-train information. Accordingly, this eliminates the need for a storage means for the first diagnostic pulse-train signal and allows the correct information to be fixedly stored as bit pattern information with less number of bits, as with the embodiments 1 and 2, thus providing an advantageous feature of configuring the BIST control block with small size and low cost.

The BIST control block 210 includes the timeout detection circuit 218. When no comparison and determination result of the expected-value comparison circuit 215 is obtained until the predetermined threshold time for determining timeout error elapses from when the scan-pulse output circuit 213 starts generating the first diagnostic pulse-train signal BOUT, the timeout detection circuit 218 stores the timeout error information and the BIST control block 210 finishes the self-test operation within the predetermined repetition of the retry operations. As described above, the BIST control block 210 includes the timeout detection circuit, and stops the self-test operation when the check operation has not been completed within the predetermined period, as with the embodiments 1 and 2, thus providing an advantageous feature of alternatively detecting an erroneous state by using the timeout error information even when an error happens in the BIST control block itself that is outside the self-test.

As is apparent from the above description, a component test unit for an integrated circuit element, according to the embodiment 3 of the present invention is the component test unit 300C that includes the checker microprocessor 320C and the integrated circuit element 120C detachably connected with the checker microprocessor and applied, as a to-be-tested integrated circuit element, to the electronic control unit 100C including the input interface circuits 114a, 115a connected to the input sensors 104a, 105a, the output interface circuit 116a connected to the electrical loads 106a, and at least one integrated circuit element 120C connected with the input interface circuits and the output interface circuit. Further, the integrated circuit element 120C includes the self-test circuit 280 configured with the build-in self-test control block (BIST control block) 210; the scan chain circuits 217, 820, 830, 840, 850, each are made up of the plurality of flip-flop circuits internally or additionally provided to be connected with a plurality of to-be-checked combination of circuit components at the respective fore and aft sides thereof in the integrated circuit element and serially combined with each other; the mask circuitry 860 arranged to connect between the input circuit portions and the output circuit portions of the plurality of circuit components, to disable their input/output operations, and includes the selection command input terminal for receiving the selection command signal EXT for selecting a scan mode.

The selection command input terminal receives the selection command signal EXT selecting, as a serial combination of the scan chain circuits, the first combination of the scan chain circuits excepting at least the scan chain circuit 217 for the BIST control block 210 and the scan chain circuit 850 for other circuits outside the self-test, or the second combination of the scan chain circuits including all scan chain circuits 217, 820, 830, 840, 850. The BIST control block 210 includes the scan-pulse output circuit 213 feeding the first diagnostic pulse-train signal BOUT to the front stage of the first combination of the scan chain circuits; the expected-value comparison circuit 215 receiving the first measurement pulse-train signal BIN output from the last stage of the first combination of the scan chain circuits, to determine whether or not the received pulse-train signal agrees with the corresponding correct pulse-train information; the comparison result storing memory 216 storing normality or non-normality of the determination result. And the BIST control block 210 generates the internal-scan enabling signal BSEN enabling the first diagnostic pulse-train signal BOUT. Further, the self-test circuit 200 includes the pulse input terminal for receiving the second diagnostic pulse-train signal ESCN to be input to the front stage of the second combination of the scan chain circuits; the pulse output terminal for sending out the second measurement pulse-train signal EOUT response to the second diagnostic pulse-train signal ESCN; and the control input terminal for receiving the external scan enabling signal ESEN enabling the second diagnostic pulse-train signal ESCN.

The selection command input terminal is set, fixedly in advance or by the selection command signal EXT generated by the checker microprocessor 320C, to select the mode in which all the scan chain circuits 217, 820, 830, 840, 850 are put into the second combination of the scan chain circuits. In this mode, the checker microprocessor 320C generates the second diagnostic pulse-train signal ESCN to feed it to the integrated circuit element 120C and then receives the second measurement pulse-train signal EOUT obtained from the integrated circuit element 120C, to determine, in accordance with the expected-value comparison means 607, whether or not the received pulse-train signal agrees with the corresponding second correct pulse-train information. The self-test for the first combination of the scan chain circuits 820, 830, 840 and feed of the first diagnostic pulse-train signal BOUT are performed in the state in which the integrated circuit element 120C is built in the electronic control unit 100C.

The checker microprocessor 320C cooperates with the program memory 322C. The second diagnostic pulse-train signal ESCN generated by the checker microprocessor 320C, which is composed of a train of binary data and stored in a numerical data setting area of the program memory 322C, is bitwise sent out sequentially from the least significant bit or the most significant bit in synchronism with the external clock signal ECLK. The second correct pulse-train information is composed of a train of binary data having the same number of bits as the second diagnostic pulse-train signal ESCN and the second measurement pulse-train signal EOUT, and stored in the numerical data setting area of the program memory 322C. Further, the checker microprocessor 320C compares, in accordance with the expected-value comparison means 607, i.e., the control program stored in the program memory 322C, the second measurement pulse-train signal EOUT with the second correct pulse-train information, to detect the presence or absence of disagreement in the comparison and to locate the position where the disagreement occurs. As described above, the second diagnostic pulse-train signal generated by the checker microprocessor and the corresponding correct pulse-train information for the second measurement pulse-train signal are binary data having the same number of bits stored in the program memory cooperating with the checker microprocessor. Thus, the second diagnostic pulse-train signal can be created on the basis of a preferred test pattern generated not using a random generator but using an automatic test-pattern generation (ATPG) technique, as well as without using a compression circuit. This provides an advantageous feature of pinpointing the location of occurrence of an error, as with the embodiments 1 and 2.

The checker microprocessor 320C changes the selection command signal EXT to be input to the BIST control block 210 through the selection command input terminal to configure the scan chain circuits into the first combination, and performs the self-test using the first diagnostic pulse-train signal BOUT generated by the BIST control block 210 to determine the self-test circuit 280 to be normal or in error by monitoring normality or non-normality of the determination result of the expected-value comparison circuit 215. As described above, the checker microprocessor performs the external test using the second diagnostic pulse-train signal and subsequently performs the self-test using the first diagnostic pulse-train signal generated by the BIST control block. Thus in the external test, the hardware of the BIST control block can be checked using the scan chain circuits relevant thereto with the BIST control block not being in operation; and in the self-test, the BIST control block can be checked whether or not it normally operates. This provides an advantageous feature of performing the functional check of the BIST control block, as with the embodiments 1 and 2.

Each embodiment of the present invention may be freely combined or appropriately modified or omitted within the spirit and scope of the present invention.

What is claimed is:

1. An electronic control unit having an integrated circuit element, comprising:
   an input interface circuit connected to input sensors;
   an output interface circuit connected to electrical loads; and
   an integrated circuit element connected with the input interface circuit and the output interface circuit,
   the integrated circuit element including
      a self-test circuit for performing a self-test on the integrated circuit element itself; and
      a selection command input terminal for selecting a scan mode,
   the self-test circuit configured with
      a built-in self-test control block for generating test pattern for the self-test;
      scan chain circuits each made up of a plurality of flip-flop circuits internally or additionally provided to be connected with a plurality of circuit components in the integrated circuit element and serially combined with each other; and
      mask circuitry arranged to connect between input circuit portions and output circuit portions of the plurality of circuit components, for disabling their input and output operations, wherein the selection command input terminal receives a selection command signal selecting any one of a first combination of the scan chain circuits that excludes a scan chain circuit for the built-in self-test control block and a scan chain circuit outside the self-test, and a second combination of the scan chain circuits that includes all scan chain circuits,
   the built-in self-test control block further including
      a scan-pulse output circuit for feeding a first diagnostic pulse-train signal to the front stage of the first combination of scan chain circuits;
      an expected-value comparison circuit for receiving a first measurement pulse-train signal response to the first diagnostic pulse-train signal and output from the last stage of the first combination of scan chain circuits, and for determining whether or not the received first measurement pulse-train signal agrees with correct pulse-train information corresponding to the first diagnostic pulse-train signal; and
      a comparison result storing memory for storing normality or non-normality of the determination result, wherein the built-in self-test control block generates an internal-scan enabling signal for enabling the first diagnostic pulse-train signal,
   the self-test circuit further including:
      a pulse input terminal for receiving a second diagnostic pulse-train signal to be input to the front stage of the second combination of scan chain circuits;
      a pulse output terminal for sending out a second measurement pulse-train signal response to the second diagnostic pulse-train signal; and
      a control input terminal for receiving an external-scan enabling signal enabling the second diagnostic pulse-train signal, wherein the built-in self-test control block is enabled during a predetermined boot wait period between closure of a power switch feeding power to the integrated circuit element and start of control operation of the integrated circuit element or during a predetermined prolonged power-feed period after closure of the power switch and halt of control operation of the integrated circuit element, and executes the self-test using the first combination of scan chain circuits, and wherein during the execution of the self-test, acquisition of some signals input from the input interface circuit and generation of some signals output to the output interface circuit are disabled by the mask circuitry, and execution of an external test for the second combination of scan chain circuits using the self-test circuit and sending out of the second diagnostic pulse-train signal are performed in a shipment inspection process for the integrated circuit element alone.

2. The electronic control unit having an integrated circuit element, set forth in claim 1, wherein the first diagnostic pulse-train signal is generated by the scan-pulse output circuit using a pseudorandom number generator employing a deterministic algorithm having reproducibility; and the first measurement pulse-train signal is input to the expected-value comparison circuit through a compression circuit, to be compared with an expected value converted as a comparison reference value from the correct pulse-train information compressed beforehand using the same compress algorithm used in the compression circuit.

3. The electronic control unit having an integrated circuit element, set forth in claim 1, wherein the built-in self-test control block includes a timeout detection circuit, and wherein the timeout detection circuit stores timeout error information when no comparison and determination result of the expected-value comparison circuit is obtained until a predetermined threshold time for determining timeout error elapses from when the scan-pulse output circuit starts generating the first diagnostic pulse-train signal; and the built-in self-test control block finishes the self-test operation within a predetermined repetition of retry operations.

4. The electronic control unit having an integrated circuit element, set forth in claim 1, wherein the integrated circuit element is separated as a first integrated circuit element and a second integrated circuit element, wherein the first integrated circuit element constitutes a main control circuit section including
- a microprocessor for driving and controlling, in accordance with a content of a program memory; and
- the electrical loads in response to operational states of the input sensors, the second integrated circuit element cooperates with the microprocessor, and constitutes a monitoring and control circuit section including
- a main monitoring and control circuit subsection for detecting the presence or absence of an error in the control of the microprocessor; and
- a plurality of circuit components: a watchdog timer for monitoring a pulse width of a watchdog signal generated by the microprocessor; a serial-parallel converter for serially communicating with the microprocessor; and a power-on reset circuit for generating a power-on reset signal for the microprocessor, the second integrated circuit element further includes
- the self-test circuit configured with the built-in self-test control block; the scan chain circuits; and the mask circuitry, and
- the selection command input terminal, and wherein the built-in self-test control block includes
- the scan-pulse output circuit for feeding the first diagnostic pulse-train signal to the front stage of the first combination of scan chain circuits excepting a scan chain circuit for the built-in self-test control block and a scan chain circuit for the power-on reset circuit;
- the expected-value comparison circuit for receiving the first measurement pulse-train signal output from the last stage of the first combination of the scan chain circuits, and for determining whether or not the received pulse-train signal agrees with the corresponding correct pulse-train information; and
- the comparison result storing memory for storing normality or non-normality of the determination result, and wherein the built-in self-test control block completes an internal check on the second integrated circuit element performed by the self-test circuit within the period during which the power-on reset circuit continues generating the power-on reset signal for the microprocessor, and the second integrated circuit element, that is, the monitoring and control circuit section monitors the operation of the first integrated circuit element, that is, the main control circuit section when the micro processor starts its control operation on release of the power-on reset signal.

5. The electronic control unit having an integrated circuit element, set forth in claim 4, wherein the built-in self-test control block includes a timeout detection circuit, wherein the timeout detection circuit stores timeout error information when no comparison and determination result of the expected-value comparison circuit is obtained until a predetermined threshold time for determining timeout error, being set shorter than the boot wait period for the power-on reset signal to be generated by the power-on reset circuit, elapses from when the scan-pulse output circuit starts generating the first diagnostic pulse-train signal, and the built-in self-test control block finishes the self-test when a timeout error occurs, and the microprocessor starts its control operation by the fact that the power-on reset signal is released, reads out the presence or absence of a timeout error and the presence or absence of an error in a comparison and determination result, and repeats generation of a retry command signal within predetermined limit times when a normal reply is not obtained, i.e., the timeout error information or the error in the comparison and determination result is stored, and wherein the built-in self-test control block, on receiving the retry command signal, initializes and reboots the power-on reset circuit and generates the first diagnostic pulse-train signal to execute again the self-test, and the microprocessor sends error notice, and aborts its control operation or shifts to a second output-operation restriction mode to start the control operation when the comparison result storing memory does not yet change to normal comparison and determination or when a timeout error occurs, although generation of the retry command signal is repeated the predetermined times.

6. The electronic control unit having an integrated circuit element, set forth in claim 1, wherein the integrated circuit element is separated as a first integrated circuit element and a second integrated circuit element, wherein the first integrated circuit element constitutes
- a main control circuit section including a main computational control circuit subsection having the microprocessor as its main component for driving and controlling, in accordance with the content of the program memory, the electrical loads in response to operational states of the input sensors;
- a memory part made up of the program memory and a RAM memory for computational processing;

and a plurality of circuit components: a watchdog signal circuit for outputting a watchdog signal and receiving a power-on reset signal; and a serial-parallel converters for serially communicating with the second integrated circuit element, and the second integrated circuit element cooperates with the microprocessor, and constitutes a monitoring and control circuit section including a main monitoring and control circuit subsection for detecting the presence or absence of an error in the control of the microprocessor and a plurality of circuit components: a watchdog timer for monitoring a pulse width of a watchdog signal generated by the microprocessor; a serial-parallel converter for serially communicating with the microprocessor; and a power-on reset circuit for generating a power-on reset signal for the microprocessor, wherein the first integrated circuit element further includes the self-test circuit configured with the built-in self-test control block, the scan chain circuits and the mask circuitry; and the selection command input terminal, wherein the built-in self-test control block includes the scan-pulse output circuit for feeding the first diagnostic pulse-train signal to the front stage of the first combination of scan chain circuits excepting a scan chain circuit for the built-in self-test control block and a scan chain circuit for the memory part;

the expected-value comparison circuit for receiving the first measurement pulse-train signal output from the last stage of the first combination of the scan chain circuits, to determine whether or not the received pulse-train signal agrees with the corresponding correct pulse-train information; and the comparison result storing memory for storing normality or no-normality of the determination result, wherein the built-in self-test control block performs an internal check on the first integrated circuit element using the self-test circuit within the predetermined prolonged power-feed period after opening of the power switch, to store normality or non-normality of the determination result in the comparison result storing memory; and the microprocessor reads out an error in the determination result of the self-test circuit, and then sends error notice, and aborts its control operation or shifts to a first output-operation restriction mode to start the control operation.

7. The electronic control unit having an integrated circuit element, set forth in claim 6, wherein the built-in self-test control block includes a timeout detection circuit and a retry command circuit, wherein the timeout detection circuit stores occurrence of a timeout error when no comparison and determination result of the expected-value comparison circuit is obtained until a predetermined threshold time for determining timeout error elapses from when the scan-pulse output circuit starts generating the first diagnostic pulse-train signal, and the retry command circuit repeats generation of a retry command within a predetermined times when the timeout detection circuit detects the timeout error or the expected-value comparison circuit determines a comparison result to be in error, so that the built-in self-test control block generates the first diagnostic pulse-train signal to execute again the self-test, wherein the built-in self-test control block stores the error occurrence state and then stops the self-test operation and de-energizes a power supply relay having been in the contact state, when the comparison result storing memory does not yet change to normal comparison and determination or when a timeout error occurs, although generation of the retry command signal ERST is repeated the predetermined times, and wherein the comparison result storing memory and a memory for storing occurrence of the timeout error are flip-flop circuits made up of logic elements, and the flip-flop circuits stores error occurrence information when the backup power-supply voltage momentarily interrupts.

8. A component test unit for an integrated circuit element, comprising:

a checker microprocessor; and an integrated circuit element detachably connectable with the a checker microprocessor and applied, as a to-be-tested integrated circuit element, to an electronic control unit that includes an input interface circuit connected to input sensors, an output interface circuit connected to electrical loads, and the integrated circuit element, the integrated circuit element including a self-test circuit for performing a self-test on the integrated circuit element itself; and a selection command input terminal for selecting a scan mode, the self-test circuit configured with a built-in self-test control block for generating test pattern for the self-test;

scan chain circuits each made up of a plurality of flip-flop circuits internally or additionally provided to be connected with a plurality of circuit components in the integrated circuit element and serially combined with each other; and mask circuitry arranged to connect between input circuit portions and output circuit portions of the plurality of circuit components, for disabling their input and output operation, wherein the selection command input terminal receives a selection command signal selecting any one of a first combination of the scan chain circuits that excludes a scan chain circuit for the built-in self-test control block and a scan chain circuit outside the self-test, and a second combination of the scan chain circuits that includes all scan chain circuits, the built-in self-test control block including a scan-pulse output circuit for feeding a first diagnostic pulse-train signal to the front stage of the first combination of scan chain circuits;

an expected-value comparison circuit for receiving a first measurement pulse-train signal response to the first diagnostic pulse-train signal and output from the last stage of the first combination of scan chain circuits, and for determining whether or not the received first measurement pulse-train signal agrees with a correct pulse-train information corresponding to the first diagnostic pulse-train signal; and a comparison result storing memory for storing normality or non-normality of the determination result, wherein the built-in self-test control block generates an internal-scan enabling signal for enabling the first diagnostic pulse-train signal, the self-test circuit further including a pulse input terminal for receiving a second diagnostic pulse-train signal to be input to the front stage of the second combination of scan chain circuits;

a pulse output terminal for sending out a second measurement pulse-train signal response to the second diagnostic pulse-train signal; and a control input terminal for receiving an external-scan enabling signal enabling the second diagnostic pulse-train signal, wherein the selection command input terminal is set, fixedly in advance or by the selection command signal generated by the checker microprocessor, to select a mode in which all the scan chain circuits are put into the second combination of scan chain circuits; the checker microprocessor generates the second diagnostic pulse-train signal to feed it to the integrated circuit element and then receives the second measurement pulse-train signal obtained from the integrated circuit element, to determine, in accordance with an expected-value comparison means, whether or not the received pulse-train signal agrees with corresponding second correct pulse-train information; and the self-test for the first combination of scan chain circuits and feed of the first diagnostic pulse-train signal are performed in a state in which the integrated circuit element is built in the electronic control unit.

9. The component test unit for an integrated circuit element, set forth in claim 8, wherein the checker microprocessor cooperates with a program memory; the second diagnostic pulse-train signal generated by the checker microprocessor, composed of a train of binary data and stored in a numerical data setting area of the program memory, is bitwise sent out sequentially from the least significant bit or the most significant bit in synchronism with an external clock signal; the second correct pulse-train information is composed of a train of binary data having the same number of bits as the second diagnostic pulse-train signal and the second measurement pulse-train signal and stored in the numerical data setting area of the program memory; and the checker microprocessor compares, in accordance with the expected-value comparison means that is a control program stored in the program memory, the second measurement pulse-train signal with the second correct pulse-train information, to detect the presence or absence of disagreement in the comparison and to locate a position where the disagreement occurs.

10. The component test unit for an integrated circuit element, set forth in claim 8, wherein the checker microprocessor changes the selection command signal to be input to the selection command input terminal of the built-in self-test control block to configure the scan chain circuits into the first combination, and performs the self-test using the first diagnostic pulse-train signal generated by the built-in self-test control block to determine the self-test circuit to be normal or anomalous by monitoring normality or non-normality of the determination result of the expected-value comparison circuit.

* * * * *